(12) United States Patent
Yamazaki et al.

(10) Patent No.: US 9,281,409 B2
(45) Date of Patent: Mar. 8, 2016

(54) THIN FILM TRANSISTOR FOR INTEGRATED CIRCUIT

(71) Applicant: Semiconductor Energy Laboratory Co., Ltd., Kanagawa-ken (JP)

(72) Inventors: Shunpei Yamazaki, Tokyo (JP); Daisuke Matsubayashi, Kanagawa (JP); Yoshiyuki Kobayashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/330,444

(22) Filed: Jul. 14, 2014

(65) Prior Publication Data

US 2015/0021596 A1    Jan. 22, 2015

(30) Foreign Application Priority Data

Jul. 16, 2013    (JP) .................................. 2013-147332

(51) Int. Cl.
  *H01L 29/786*    (2006.01)
  *H01L 29/423*    (2006.01)
  *H01L 27/12*     (2006.01)

(52) U.S. Cl.
  CPC ...... *H01L 29/78693* (2013.01); *H01L 27/1225* (2013.01); *H01L 29/42384* (2013.01); *H01L 29/7869* (2013.01); *H01L 29/78696* (2013.01)

(58) Field of Classification Search
  CPC ..................... H01L 29/78693; H01L 29/7869; H01L 29/42384; H01L 29/78696
  See application file for complete search history.

(56) References Cited

U.S. PATENT DOCUMENTS

| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — Yu Chen
*Assistant Examiner* — Nilufa Rahim
(74) *Attorney, Agent, or Firm* — Husch Blackwell LLP

(57) ABSTRACT

A semiconductor device is provided with a first oxide semiconductor film over an insulating surface; a second oxide semiconductor film over the first oxide semiconductor film; a third oxide semiconductor film in contact with a top surface of the insulating surface, a side surface of the first oxide semiconductor film, and side and top surfaces of the second oxide semiconductor film; a gate insulating film over the third oxide semiconductor film; and a gate electrode in contact with the gate insulating film and faces the top and side surfaces a of the second oxide semiconductor film. A thickness of the first oxide semiconductor film is larger than a sum of a thickness of the third oxide semiconductor film and a thickness of the gate insulating film, and the difference is larger than or equal to 20 nm.

21 Claims, 30 Drawing Sheets

(56) References Cited

U.S. PATENT DOCUMENTS

| | | | |
|---|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,384,080 B2 | 2/2013 | Taniguchi et al. |
| 8,420,456 B2 | 4/2013 | Okamoto |
| 8,426,905 B2 | 4/2013 | Kamath et al. |
| 8,530,589 B2 | 9/2013 | Scher et al. |
| 8,547,771 B2 | 10/2013 | Koyama |
| 8,692,252 B2 | 4/2014 | Takata et al. |
| 8,748,224 B2 | 6/2014 | Noda et al. |
| 8,802,515 B2 | 8/2014 | Endo et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1* | 12/2008 | Ryu et al. ......................... 257/43 |
| 2008/0308411 A1 | 12/2008 | Okamoto |
| 2009/0068773 A1 | 3/2009 | Lai et al. |
| 2009/0073325 A1 | 3/2009 | Kuwabara et al. |
| 2009/0085095 A1 | 4/2009 | Kamath et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0286351 A1 | 11/2009 | Hirao et al. |
| 2010/0065844 A1 | 3/2010 | Tokunaga |
| 2010/0084651 A1* | 4/2010 | Yamazaki et al. ............... 257/43 |
| 2010/0092800 A1 | 4/2010 | Itagaki et al. |
| 2010/0109002 A1 | 5/2010 | Itagaki et al. |
| 2011/0127523 A1 | 6/2011 | Yamazaki |
| 2011/0140100 A1 | 6/2011 | Takata et al. |
| 2011/0240991 A1 | 10/2011 | Yamazaki |
| 2012/0040495 A1 | 2/2012 | Noda et al. |
| 2012/0058598 A1 | 3/2012 | Yamazaki |
| 2012/0119212 A1 | 5/2012 | Endo et al. |
| 2012/0146713 A1 | 6/2012 | Kim et al. |
| 2012/0161239 A1* | 6/2012 | Koyama et al. ............... 257/368 |
| 2013/0189823 A1 | 7/2013 | Kamath et al. |
| 2013/0214393 A1 | 8/2013 | Okamoto |
| 2013/0344301 A1 | 12/2013 | Scher et al. |
| 2014/0034946 A1 | 2/2014 | Yamazaki et al. |
| 2014/0042395 A1* | 2/2014 | Shim et al. ......................... 257/40 |
| 2014/0042437 A1 | 2/2014 | Yamazaki |
| 2014/0042438 A1 | 2/2014 | Yamazaki |
| 2014/0077205 A1 | 3/2014 | Yamazaki et al. |
| 2014/0103337 A1 | 4/2014 | Yamazaki et al. |
| 2014/0103346 A1 | 4/2014 | Yamazaki |
| 2014/0131702 A1 | 5/2014 | Matsubayashi et al. |
| 2014/0339544 A1 | 11/2014 | Hanaoka et al. |
| 2014/0361293 A1 | 12/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2006-339556 A | 12/2006 |
| JP | 2011-124360 A | 6/2011 |
| JP | 2011-138934 A | 7/2011 |
| JP | 2012-257187 A | 12/2012 |
| WO | WO-2004/114391 | 12/2004 |

(56) References Cited

FOREIGN PATENT DOCUMENTS

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUSon Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "SPINEL,YBFE2O4, and YB2FE3O7 Types of Structures for Compounds in the IN2O3 and SC2O3-A2O3-BO Systems [A; Fe, Ga, or Al/ B: Mg, Mn, Fe, Ni, Cu, or Zn] At Temperatures over 1000° C", Journal of Solid State Chemistry, 1985, vol. 60, pp. 382-384.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m= 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

(56) References Cited

OTHER PUBLICATIONS

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", JPN. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", APPL. Phys. Lett. (Applied Physics Letters) Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physcial Review. B) 2008, vol. 77, pp. 245202-1-245202-6.

Oh.M et al., "Improving the Gate Stability of ZnO Thin-Film Transistors With Aluminum Oxide Dielectric Layers ", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

108 Id-Vg characteristics before treatment

109 Id-Vg characteristics after treatment

THIN FILM TRANSISTOR FOR INTEGRATED CIRCUIT

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device and a method for manufacturing a semiconductor device.

In this specification, a semiconductor device generally means a device which can function by utilizing semiconductor characteristics. A display device, an electro-optical device, a semiconductor circuit, and an electric device include a semiconductor device in some cases.

2. Description of the Related Art

Attention has been focused on a technique for forming a transistor using a semiconductor thin film formed over a substrate having an insulating surface. The transistor is used for a wide range of electronic devices such as an integrated circuit (IC) or an image display device (display device). A silicon-based semiconductor material is widely known as a material for a semiconductor thin film which can be used for a transistor. As another material, an oxide semiconductor has been attracting attention.

For example, a transistor including an amorphous oxide semiconductor film containing indium (In), gallium (Ga), and zinc (Zn) is disclosed in Patent Document 1.

Techniques for improving carrier mobility by stacking oxide semiconductor films are disclosed in Patent Documents 2 and 3.

A transistor including an oxide semiconductor film is known to have extremely small leakage current in an off state. For example, a CPU with low-power consumption utilizing the small leakage current of the transistor including an oxide semiconductor film is disclosed (see Patent Document 4).

REFERENCE

Patent Document

[Patent Document 1] Japanese Published Patent Application No. 2006-165528
[Patent Document 2] Japanese Published Patent Application No. 2011-124360
[Patent Document 3] Japanese Published Patent Application No. 2011-138934
[Patent Document 4] Japanese Published Patent Application No. 2012-257187

SUMMARY OF THE INVENTION

Miniaturization of transistors has been progressing with an increase in the degree of integration of circuits. In some cases, miniaturization of transistors causes deterioration of the electrical characteristics of the transistors, such as on-state current, off-state current, threshold voltage, and a subthreshold swing value (an S value). In general, a decrease in channel length leads to an increase in off-state current, an increase in variations of threshold voltage, and an increase in S value, whereas a decrease in channel width leads to a decrease in on-state current.

Thus, an object of one embodiment of the present invention is to provide a semiconductor device having a structure which can prevent the deterioration of electrical characteristics, which becomes more significant with miniaturization of transistors. In addition, another object is to provide a highly integrated semiconductor device. Another object is to provide a semiconductor device in which decrease of on-state current characteristics is reduced. Another object is to provide a semiconductor device with low power consumption. Another object is to provide a semiconductor device with high reliability. Another object is to provide a semiconductor device which can retain data even when power supply is stopped. Another object is to provide a semiconductor device with favorable characteristics. Another object is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

A transistor including an oxide semiconductor film is an accumulation-type transistor in which electrons are majority carriers. Therefore, drain-induced barrier lowering (DIBL) as a short-channel effect is less likely to occur than in an inversion-type transistor having a pn junction. In other words, the transistor including an oxide semiconductor film is resistant to a short-channel effect.

When a channel width of a transistor is shortened, on-state current is decreased. For the purpose of increasing the on-state current, there is a method in which the thickness of a semiconductor film is increased so that a channel is formed in an upper portion and side portions of the semiconductor film. However, an increase in a surface area where a channel is formed increases scattering of carriers at the interface between a channel formation region and a gate insulating film; therefore, it is not easy to increase the on-state current sufficiently.

To achieve any of the above objects, the following structures of a semiconductor device are provided in one embodiment of the present invention.

One embodiment of the present invention is a semiconductor device including a first oxide semiconductor film over an insulating surface; a second oxide semiconductor film over the first oxide semiconductor film; a third oxide semiconductor film in contact with a top surface of the insulating surface, a side surface of the first oxide semiconductor film, a side surface of the second oxide semiconductor film, and a top surface of the second oxide semiconductor film; a gate insulating film over the third oxide semiconductor film; and a gate electrode which is in contact with the gate insulating film and faces the top surface and the side surface of the second oxide semiconductor film. The thickness of the first oxide semiconductor film is larger than the sum of the thickness of the third oxide semiconductor film and the thickness of the gate insulating film. The difference between the thickness of the first oxide semiconductor film and the sum of the thickness of the third oxide semiconductor film and the thickness of the gate insulating film is larger than or equal to 20 nm.

In the above structure, the difference between the thickness of the first oxide semiconductor film and the sum of the thickness of the third oxide semiconductor film and the thickness of the gate insulating film is preferably larger than or equal to 20 nm and smaller than or equal to 50 nm.

Another embodiment of the present invention is a semiconductor device including a first oxide semiconductor film provided over a projected portion of an insulating surface including a depressed portion and the projected portion; a second oxide semiconductor film over the first oxide semiconductor film; a third oxide semiconductor film in contact with a top surface of the insulating surface, a side surface of the first oxide semiconductor film, a side surface of the second oxide semiconductor film, and a top surface of the second oxide semiconductor film; a gate insulating film over the third oxide semiconductor film; and a gate electrode which is in contact with the gate insulating film and faces the top surface and the side surface of the second oxide semiconductor film. The sum of the height of the projected portion of the insulating surface and the thickness of the first oxide semiconductor film is larger than the sum of the thickness of the third oxide semiconductor film and the thickness of the gate insulating film. The difference between the sum of the height of the projected portion of the insulating surface and the thickness of the first oxide semiconductor film and the sum of the thickness of the third oxide semiconductor film and the thickness of the gate insulating film is larger than or equal to 20 nm.

In the above structure, the difference between the sum of the height of the projected portion of the insulating surface and the thickness of the first oxide semiconductor film and the sum of the thickness of the third oxide semiconductor film and the thickness of the gate insulating film is preferably larger than or equal to 20 nm and smaller than or equal to 50 nm.

In any of the above structures, the channel width is preferably smaller than or equal to 40 nm.

In one embodiment of the present invention, a semiconductor device can be provided in which deterioration of electrical characteristics which becomes more noticeable as the transistor is miniaturized can be suppressed. A highly integrated semiconductor device can be provided. A semiconductor device in which deterioration of on-state current characteristics is suppressed can be provided. A semiconductor device with low power consumption can be provided. A highly reliable semiconductor device can be provided. A semiconductor device which can retain data even when power supply is stopped can be provided.

DETAILED DESCRIPTION OF THE INVENTION

Figure 1A:
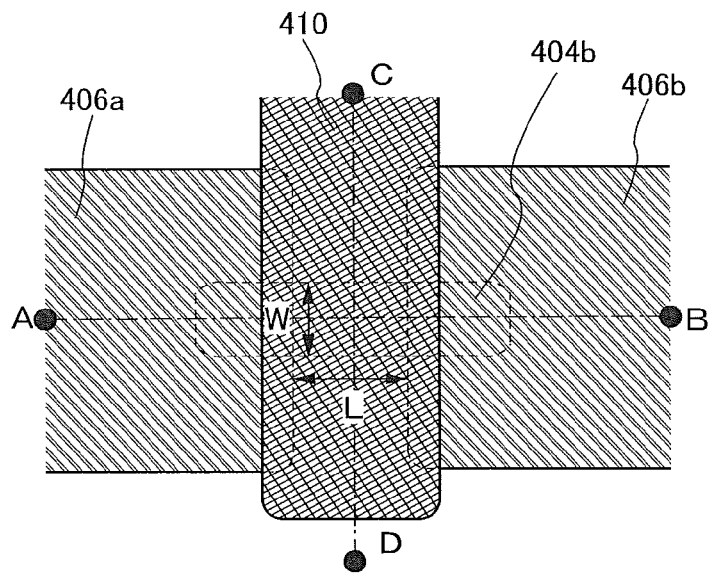
FIGS. 1A to 1C are a top view and cross-sectional views illustrating a transistor.

Embodiments will be described in detail with reference to the drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases.

Note that functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification.

Embodiment 1

In this embodiment, a semiconductor device which is one embodiment of the present invention is described with reference to drawings.

Figure 1B:
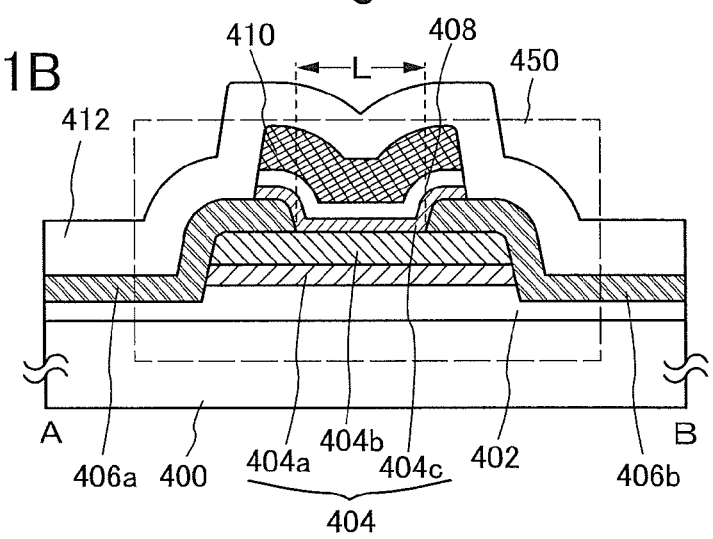
Figure 1C:
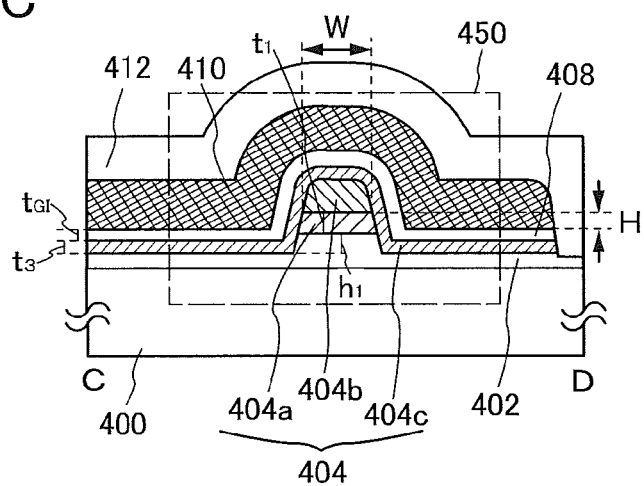

FIGS. 1A to 1C are a top view and cross-sectional views illustrating a transistor of one embodiment of the present invention. FIG. 1A is the top view. FIG. 1B illustrates a cross section taken along dashed-dotted line A-B in FIG. 1A. FIG. 1C illustrates a cross section taken along dashed-dotted line C-D in FIG. 1A. Note that for simplification of the drawing, some components are not illustrated in the top view in FIG. 1A. In some cases, the direction of the dashed-dotted line A-B is referred to as a channel length direction, and the direction of the dashed-dotted line C-D is referred to as a channel width direction.

A transistor 450 illustrated in FIGS. 1A to 1C includes a base insulating film 402 including a depressed portion and a projected portion over a substrate 400; a first oxide semiconductor film 404a and a second oxide semiconductor film 404b over the projected portion of the base insulating film 402; a source electrode 406a and a drain electrode 406b over the first oxide semiconductor film 404a and the second oxide semiconductor film 404b; a third oxide semiconductor film 404c in contact with a top surface of the base insulating film 402, a side surface of the first oxide semiconductor film 404a, a side surface and a top surface of the second oxide semiconductor film 404b, the source electrode 406a, and the drain electrode 406b; a gate insulating film 408 over the third oxide semiconductor film 404c; a gate electrode 410 which is in contact with the gate insulating film 408 and faces the top surface and the side surface of the second oxide semiconductor film 404b; and an oxide insulating film 412 over the source electrode 406a, the drain electrode 406b, and the gate electrode 410. The first oxide semiconductor film 404a, the second oxide semiconductor film 404b, and the third oxide semiconductor film 404c are collectively referred to as a multilayer film 404.

Note that a channel length refers to the distance between a source (a source region or a source electrode) and a drain (a drain region or a drain electrode) in a region where a semiconductor film and a gate electrode overlap with each other in a top view. Accordingly, in FIG. 1A, the channel length (L) is the distance between the source electrode 406a and the drain electrode 406b in a region where the second oxide semiconductor film 404b and the gate electrode 410 overlap with each other. A channel width refers to the width of a source or a drain in a region where a semiconductor film and a gate electrode overlap with each other. Accordingly, in FIG. 1A, the channel width (W) is the width of the source electrode 406a or the drain electrode 406b in the region where the second oxide semiconductor film 404b and the gate electrode 410 overlap with each other.

A perpendicular distance H is the difference between the sum of a height $h_1$ of the projected portion of the base insulating film 402 and a thickness $t_1$ of the first oxide semiconductor film 404a (i.e., $h_1+t_1$) and the sum of a thickness $t_3$ of the third oxide semiconductor film 404c and a thickness $t_{GI}$ of the gate insulating film 408 (i.e., $t_3+t_{GI}$). The perpendicular distance H is greater than or equal to 5% and less than 300% of the channel width W, preferably greater than or equal to 10% and less than 300% of the channel width W, more preferably greater than or equal to 20% and less than 250% of the channel width W, still more preferably greater than or equal to 50% and less than 200% of the channel width W, further preferably greater than or equal to 100% and less than 150% of the channel width W. In view of variation among transistors, specifically, the perpendicular distance H is preferably greater than or equal to 20 nm, more preferably greater than or equal to 30 nm, still more preferably greater than or equal to 40 nm. Since characteristic values converge as the perpendicular distance H increases, characteristic variations due to error in the perpendicular distances H can be reduced.

A short channel effect occurs due to miniaturization, which leads to deterioration of electrical characteristics such as threshold voltage; however, with the above structure, the gate electrode 410 electrically covers the second oxide semiconductor film 404b (channel portion), that is, the gate electrode 410 covers a top surface and side surfaces of the second oxide semiconductor film 404b (channel portion) with the gate insulating film 408 provided therebetween and electric field is applied to the second oxide semiconductor film 404b (channel portion) from the top surface and the side surfaces, whereby carriers can be easily controlled and deterioration of electrical characteristics due to the short channel effect can be suppressed.

The gate electrode 410 electrically covers the second oxide semiconductor film 404b when seen in the channel width direction in such a structure, whereby on-state current is increased. Such a structure of a transistor is referred to as a surrounded channel (s-channel) structure. Note that in the s-channel structure, current flows in the whole (bulk) of the second oxide semiconductor film 404b. Because current flows inside the multilayer film 404 (the whole of the second oxide semiconductor film 404b), the current is hardly affected by interface scattering, leading to large on-state current. Note that when the second oxide semiconductor film 404b is thick, large on-state current can be obtained. Since the gate electrode 410 extending lower than the interface between the first oxide semiconductor film 404a and the second oxide semiconductor film 404b and reaching a position on the base insulating film 402 side does not affect the channel width W, the channel width W can be made small, achieving high density (high integration).

In manufacturing a transistor with a small channel length and a small channel width, when an electrode, a semiconductor film, or the like is processed while a resist mask is made to recede, the electrode, the semiconductor film, or the like has a round end portion (curved surface) in some cases. With this structure, the coverage with the gate insulating film 408, the gate electrode 410, and the oxide insulating film 412, which are to be formed over the second oxide semiconductor film 404b, the source electrode 406a, and the source electrode 406b, can be improved. In addition, electric field concentration which might occur at end portions of the source electrode 406a and the drain electrode 406b can be reduced, which can suppress deterioration of the transistor.

Miniaturization of a transistor leads to high integration and high density. In the miniaturization, for example, the channel length of the transistor is preferably set to be less than or equal to 40 nm, more preferably less than or equal to 30 nm, still more preferably less than or equal to 20 nm, and the channel width of the transistor is preferably set to be less than or equal to 40 nm, more preferably less than or equal to 30 nm, still more preferably less than or equal to 20 nm. The transistor of one embodiment of the present invention has an s-channel structure. Therefore, even when the channel width is shortened to the above range, large on-state current can be obtained.

The substrate 400 is not limited to a simple supporting substrate, and may be a substrate where a device such as a transistor is formed. In that case, at least one of the gate electrode 410, the source electrode 406a, and the drain electrode 406b of the transistor 450 may be electrically connected to the above device.

The base insulating film 402 can have a function of supplying oxygen to the multilayer film 404 as well as a function of preventing diffusion of impurities from the substrate 400. For this reason, the base insulating film 402 is preferably an insulating film containing oxygen and more preferably, the base insulating film 402 is an insulating film containing oxygen in which the oxygen content is higher than that in the stoichiometric composition. In the case where the substrate 400 is provided with another device as described above, the base insulating film 402 also has a function as an interlayer insulating film. In that case, since the base insulating film 402 has an uneven surface, the base insulating film 402 is preferably subjected to planarization treatment such as chemical mechanical polishing (CMP) treatment so as to have a flat surface before forming the transistor 450.

In a region of the transistor 450 where a channel is formed, the multilayer film 404 has a structure in which the first oxide semiconductor film 404a, the second oxide semiconductor film 404b, and the third oxide semiconductor film 404c are stacked in this order from the substrate 400 side. The second oxide semiconductor film 404b is surrounded by the first oxide semiconductor film 404a and the third oxide semiconductor film 404c. As in FIG. 1C, the gate electrode 410 electrically covers the second oxide semiconductor film 404b when seen in the channel width direction.

Here, for the second oxide semiconductor film 404b, for example, an oxide semiconductor whose electron affinity (an energy difference between a vacuum level and the conduction band minimum) is higher than those of the first oxide semiconductor film 404a and the third oxide semiconductor film 404c is used. The electron affinity can be obtained by subtracting an energy difference between the conduction band minimum and the valence band maximum (the difference is called an energy gap) from an energy difference between the vacuum level and the valence band maximum (the difference is called an ionization potential).

The first oxide semiconductor film 404a and the third oxide semiconductor film 404c each contain one or more kinds of metal elements forming the second oxide semiconductor film 404b. For example, the first oxide semiconductor film 404a and the third oxide semiconductor film 404c are preferably formed using an oxide semiconductor whose conduction band minimum is closer to a vacuum level than that of the second oxide semiconductor film 404b. Further, the energy difference of the conduction band minimum between the second oxide semiconductor film 404b and the first oxide semiconductor film 404a and the energy difference of the conduction band minimum between the second oxide semiconductor film 404b and the third oxide semiconductor film 404c are each preferably greater than or equal to 0.05 eV, 0.07 eV, 0.1 eV, or 0.15 eV and less than or equal to 2 eV, 1 eV, 0.5 eV, or 0.4 eV.

In such a structure, when an electric field is applied to the gate electrode 410, a channel is formed in the second oxide semiconductor film 404b whose conduction band minimum is the lowest in the multilayer film 404. In other words, when the third oxide semiconductor film 404c is formed between the second oxide semiconductor film 404b and the gate insulating film 408, the channel of the transistor is formed in a region which is not in contact with the gate insulating film 408.

Further, since the first oxide semiconductor film 404a contains one or more kinds of metal elements forming the second oxide semiconductor film 404b, an interface state is less likely to be formed at the interface of the second oxide semiconductor film 404b with the first oxide semiconductor film 404a than at the interface with the base insulating film 402 on the assumption that the second oxide semiconductor film 404b is in contact with the base insulating film 402. The interface state sometimes forms a channel, leading to a change in the threshold voltage of the transistor. Thus, with the first oxide semiconductor film 404a, variation in the electrical characteristics of the transistor, such as a threshold voltage, can be reduced. Further, the reliability of the transistor can be improved.

Furthermore, since the third oxide semiconductor film 404c contains one or more kinds of metal elements forming the second oxide semiconductor film 404b, scattering of carriers is less likely to occur at the interface of the second oxide semiconductor film 404b with the third oxide semiconductor film 404c than at the interface with the gate insulating film 408 on the assumption that the second oxide semiconductor film 404b is in contact with the gate insulating film 408. Thus, with the third oxide semiconductor film 404c, the field-effect mobility of the transistor can be increased.

For the first oxide semiconductor film 404a and the third oxide semiconductor film 404c, for example, a material containing Al, Ti, Ga, Ge, Y, Zr, Sn, La, Ce, or Hf with a higher atomic ratio than that used for the second oxide semiconductor film 404b can be used. Specifically, an atomic ratio of any of the above metal elements in the first oxide semiconductor film 404a and the third oxide semiconductor film 404c is 1.5 times or more, preferably 2 times or more, further preferably 3 times or more as much as that in the second oxide semiconductor film 404b. Any of the above metal elements is strongly bonded to oxygen and thus has a function of suppressing generation of an oxygen vacancy in the oxide semiconductor films. That is, an oxygen vacancy is less likely to be generated in the first oxide semiconductor film 404a and the third oxide semiconductor film 404c than in the second oxide semiconductor film 404b.

Note that when each of the first oxide semiconductor film 404a, the second oxide semiconductor film 404b, and the third oxide semiconductor film 404c is an In-M-Zn oxide containing at least indium, zinc, and M (M is a metal such as Al, Ti, Ga, Ge, Y, Zr, Sn, La, Ce, or Hf), and the first oxide semiconductor film 404a has an atomic ratio of In to M and Zn which is $x_1:y_1:z_1$, the second oxide semiconductor film 404b has an atomic ratio of In to M and Zn which is $x_2:y_2:z_2$, and the third oxide semiconductor film 404c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the second oxide semiconductor film 404b, the transistor can have stable electrical characteristics. However, when $y_2$ is 3 times or more as large as $x_2$, the field-effect mobility of the transistor is reduced; accordingly, $y_2$ is preferably less than 3 times $x_2$.

In the case where Zn and O are not taken into consideration, the proportion of In and the proportion of M in the first oxide semiconductor film 404a and the third oxide semiconductor film 404c are preferably less than 50 atomic % and greater than or equal to 50 atomic %, respectively, and further preferably less than 25 atomic % and greater than or equal to 75 atomic %, respectively. In the case where Zn and O are not taken into consideration, the proportion of In and the proportion of M in the second oxide semiconductor film 404b are preferably greater than or equal to 25 atomic % and less than 75 atomic %, respectively, and further preferably greater than or equal to 34 atomic % and less than 66 atomic %, respectively.

The thicknesses of the first oxide semiconductor film 404a and the third oxide semiconductor film 404c are each greater than or equal to 3 nm and less than or equal to 100 nm, preferably greater than or equal to 3 nm and less than or equal to 50 nm. The thickness of the second oxide semiconductor film 404b is greater than or equal to 3 nm and less than or equal to 200 nm, preferably greater than or equal to 3 nm and less than or equal to 100 nm, further preferably greater than or equal to 3 nm and less than or equal to 50 nm. The first oxide semiconductor film 404a and the third oxide semiconductor film 404c are preferably thinner than the second oxide semiconductor film 404b.

For the first oxide semiconductor film 404a, the second oxide semiconductor film 404b, and the third oxide semiconductor film 404c, an oxide semiconductor containing indium, zinc, and gallium can be used, for example. Note that the second oxide semiconductor film 404b preferably contains indium because carrier mobility can be increased.

Note that stable electrical characteristics can be effectively imparted to a transistor including an oxide semiconductor film by reducing the concentration of impurities in the oxide semiconductor film to make the oxide semiconductor film intrinsic or substantially intrinsic. The term "substantially intrinsic" refers to the state where an oxide semiconductor film has a carrier density lower than $1 \times 10^{17}/cm^3$, preferably lower than $1 \times 10^{15}/cm^3$, further preferably lower than $1 \times 10^{13}/cm^3$.

In the oxide semiconductor film, hydrogen, nitrogen, carbon, silicon, and a metal element other than main components of the oxide semiconductor film are impurities. For example, hydrogen and nitrogen form donor levels to increase the carrier density. In addition, silicon in the oxide semiconductor film forms an impurity level. The impurity level might become a trap, which deteriorates the electrical characteristics of the transistor. Accordingly, in the first oxide semiconductor film 404a, the second oxide semiconductor film 404b, and the third oxide semiconductor film 404c and at interfaces between these films, the impurity concentration is preferably reduced.

In order to make the oxide semiconductor film intrinsic or substantially intrinsic, in secondary ion mass spectrometry (SIMS), for example, the concentration of silicon at a certain depth of the oxide semiconductor film or in a region of the oxide semiconductor film is preferably lower than $1 \times 10^{19}$ atoms/cm$^3$, more preferably lower than $5 \times 10^{18}$ atoms/cm$^3$, still more preferably lower than $1 \times 10^{18}$ atoms/cm$^3$. Further, for example, the concentration of hydrogen at a certain depth of the oxide semiconductor film or in a region of the oxide semiconductor film is preferably lower than or equal to $2 \times 10^{20}$ atoms/cm$^3$, more preferably lower than or equal to $5 \times 10^{19}$ atoms/cm$^3$, still more preferably lower than or equal to $1 \times 10^{19}$ atoms/cm$^3$, yet still more preferably lower than or equal to $5 \times 10^{18}$ atoms/cm$^3$. Further, for example, the concentration of nitrogen at a certain depth of the oxide semiconductor film or in a region of the oxide semiconductor film is preferably lower than $5 \times 10^{19}$ atoms/cm$^3$, more preferably lower than or equal to $5 \times 10^{18}$ atoms/cm$^3$, still more preferably lower than or equal to $1 \times 10^{18}$ atoms/cm$^3$, yet still more preferably lower than or equal to $5 \times 10^{17}$ atoms/cm$^3$.

In the case where the oxide semiconductor film includes crystals, high concentration of silicon or carbon might reduce the crystallinity of the oxide semiconductor film. In order not to lower the crystallinity of the oxide semiconductor film, for example, the concentration of silicon at a certain depth of the oxide semiconductor film or in a region of the oxide semiconductor film may be lower than $1 \times 10^{19}$ atoms/cm$^3$, preferably lower than $5 \times 10^{18}$ atoms/cm$^3$, more preferably lower than $1 \times 10^{18}$ atoms/cm$^3$. Further, the concentration of carbon at a certain depth of the oxide semiconductor film or in a region of the oxide semiconductor film may be lower than $1 \times 10^{19}$ atoms/cm$^3$, preferably lower than $5 \times 10^{18}$ atoms/cm$^3$, more preferably lower than $1 \times 10^{18}$ atoms/cm$^3$, for example.

A transistor in which the above-described highly purified oxide semiconductor film is used for a channel formation region has an extremely small off-state current. In the case where the voltage between a source and a drain is set to about 0.1 V, 5 V, or 10 V, for example, the off-state current standardized on the channel width of the transistor can be as small as several yoctoamperes per micrometer to several zeptoamperes per micrometer.

Note that as the gate insulating film of the transistor, an insulating film containing silicon is used in many cases; thus, it is preferable that, as in the transistor of one embodiment of the present invention, a region of the multilayer film, which serves as a channel, not be in contact with the gate insulating film for the above-described reason. In the case where a channel is formed at the interface between the gate insulating film and the multilayer film, scattering of carriers occurs at the interface, whereby the field-effect mobility of the transistor is reduced in some cases. Also from the view of the above, it is preferable that the region of the multilayer film, which serves as a channel, be separated from the gate insulating film.

Accordingly, with the multilayer film 404 having a stacked structure including the first oxide semiconductor film 404a, the second oxide semiconductor film 404b, and the third oxide semiconductor film 404c in this order, a channel can be formed in the second oxide semiconductor film 404b; thus, the transistor can have a high field-effect mobility and stable electrical characteristics.

Next, the band structure of the multilayer film 404 is described. For analyzing the band structure, a stack corresponding to the multilayer film 404 is formed. In the stack, an In—Ga—Zn oxide with an energy gap of 3.5 eV is used for layers corresponding to the first oxide semiconductor film 404a and the third oxide semiconductor film 404c, and an In—Ga—Zn oxide with an energy gap of 3.15 eV is used for a layer corresponding to the second oxide semiconductor film 404b.

The thickness of each of the first oxide semiconductor film 404a, the second oxide semiconductor film 404b, and the third oxide semiconductor film 404c was 10 nm. The energy gap was measured with the use of a spectroscopic ellipsometer (UT-300 manufactured by HORIBA JOBIN YVON S.A.S.). Further, the energy difference between the vacuum level and the valence band maximum was measured using an ultraviolet photoelectron spectroscopy (UPS) device (VersaProbe, ULVAC-PHI, Inc.).

Figure 2A:
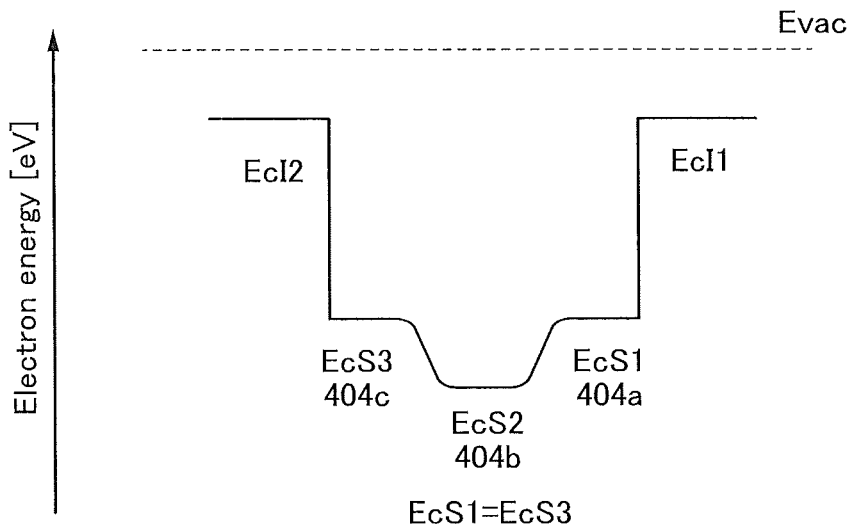
FIGS. 2A and 2B show band structures of multilayer films.

FIG. 2A is part of a schematic band structure showing an energy difference (electron affinity) between the vacuum level and the conduction band minimum of each layer, which is calculated by subtracting the energy gap from the energy difference between the vacuum level and the valence band maximum. FIG. 2A is a band diagram showing the case where silicon oxide films are provided in contact with the first oxide semiconductor film 404a and the third oxide semiconductor film 404c. Here, Evac represents energy of the vacuum level, EcI1 and EcI2 each represent the conduction band minimum of the silicon oxide film, EcS1 represents the conduction band minimum of the first oxide semiconductor film 404a, EcS2 represents the conduction band minimum of the second oxide semiconductor film 404b, and EcS3 represents the conduction band minimum of the third oxide semiconductor film 404c.

As shown in FIG. 2A, the energies of the conduction band minimums of the first oxide semiconductor film 404a, the second oxide semiconductor film 404b, and the third oxide semiconductor film 404c successively vary. This can be understood also from the fact that a common element is included in the first oxide semiconductor film 404a, the second oxide semiconductor film 404b, and the third oxide semiconductor film 404c and oxygen is easily diffused among the first oxide semiconductor film 404a, the second oxide semiconductor film 404b, and the third oxide semiconductor film 404c. Thus, the first oxide semiconductor film 404a, the second oxide semiconductor film 404b, and the third oxide semiconductor film 404c have a continuous physical property although they have different compositions and form a stack.

The multilayer film 404 in which layers containing the same main components are stacked is formed to have not only a simple stacked-layer structure of the layers but also a continuous energy band (here, in particular, a U-shaped well structure in which the conduction band minimums are continuously changed between layers). In other words, the stacked-layer structure is formed such that there exists no impurity which forms a defect level such as a trap center or a recombination center at each interface. If impurities exist between the stacked layers in the multilayer film, the continuity of the energy band is lost and carriers disappear by a trap or recombination.

Note that FIG. 2A shows the case where EcS1 and EcS3 are similar to each other; however, EcS1 and EcS3 may be different from each other. For example, part of the band structure in the case where EcS1 is higher than EcS3 is shown in FIG. 2B.

For example, when EcS1 is equal to EcS3, an In—Ga—Zn oxide whose atomic ratio of In to Ga and Zn is 1:3:2, 1:3:3, 1:3:4, 1:6:4, or 1:9:6 can be used for each of the first oxide semiconductor film 404a and the third oxide semiconductor film 404c and an In—Ga—Zn oxide whose atomic ratio of In to Ga and Zn is 1:1:1 or 3:1:2 can be used for the second oxide semiconductor film 404b. Further, when EcS1 is higher than EcS3, an In—Ga—Zn oxide whose atomic ratio of In to Ga and Zn is 1:6:4 or 1:9:6 can be used for the first oxide semiconductor film 404a, an In—Ga—Zn oxide whose atomic ratio of In to Ga and Zn is 1:1:1 or 3:1:2 can be used for the second oxide semiconductor film 404b, and an In—Ga—Zn oxide whose atomic ratio of In to Ga and Zn is 1:3:2, 1:3:3, or 1:3:4 can be used for the third oxide semiconductor film 404c, for example.

Figure 2B:
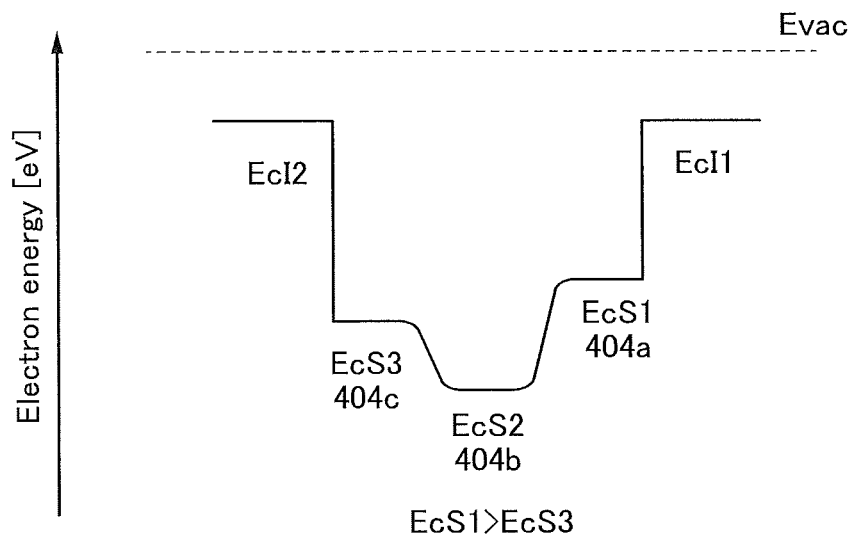

According to FIGS. 2A and 2B, the second oxide semiconductor film 404b of the multilayer film 404 serves as a well, so that a channel is formed in the second oxide semiconductor film 404b in the transistor including the multilayer film 404. Since the energies of the conduction band minimums are continuously changed, the structure of the multilayer film 404 can also be referred to as a U-shaped well. Further, a channel formed to have such a structure can also be referred to as a buried channel.

Note that trap levels due to impurities or defects might be formed in the vicinity of the interface between an insulating film such as a silicon oxide film and each of the first oxide semiconductor film 404a and the third oxide semiconductor film 404c. The second oxide semiconductor film 404b can be distanced away from the trap levels owing to existence of the first oxide semiconductor film 404a and the third oxide semiconductor film 404c. However, when the energy difference between EcS2 and EcS1 or EcS3 is small, an electron in the second oxide semiconductor film 404b might reach the trap level across the energy difference. When the electron is trapped in the trap level, a negative fixed charge is generated at the interface with the insulating film, whereby the threshold voltage of the transistor is shifted in the positive direction.

Thus, to reduce fluctuations in the threshold voltage of the transistor, energy differences of at least certain values between EcS2 and EcS1 and between EcS2 and EcS3 are necessary. Each of the energy differences is preferably greater than or equal to 0.1 eV, further preferably greater than or equal to 0.15 eV.

The first oxide semiconductor film 404a, the second oxide semiconductor film 404b, and the third oxide semiconductor film 404c preferably include crystal parts. In particular, when crystals in which c-axes are aligned are used, the transistor can have stable electrical characteristics.

In the case where an In—Ga—Zn oxide is used for the multilayer film 404, it is preferable that the third oxide semiconductor film 404c contain less In than the second oxide semiconductor film 404b so that diffusion of In to the gate insulating film is prevented.

For the source electrode 406a and the drain electrode 406b, a conductive material which can be bonded to oxygen is preferably used. For example, Al, Cr, Cu, Ta, Ti, Mo, or W can be used. Among the materials, in particular, it is preferable to use Ti which is easily bonded to oxygen or to use W with a high melting point, which allows subsequent process temperatures to be relatively high. Note that the conductive material which can be bonded to oxygen includes, in its category, a material to which oxygen can be diffused.

When the conductive material which can be bonded to oxygen is in contact with a multilayer film, a phenomenon occurs in which oxygen in the multilayer film is diffused to the conductive material which can be bonded to oxygen. The phenomenon noticeably occurs when the temperature is high. Since the fabricating process of the transistor involves some heat treatment steps, the above phenomenon causes generation of oxygen vacancies in the vicinity of a region which is in the multilayer film and in contact with the source electrode or the drain electrode. The oxygen vacancies bond to hydrogen slightly contained in the film, whereby the region is changed to an n-type region. Thus, the n-type region can serve as a source region or a drain region of the transistor.

Figure 3:
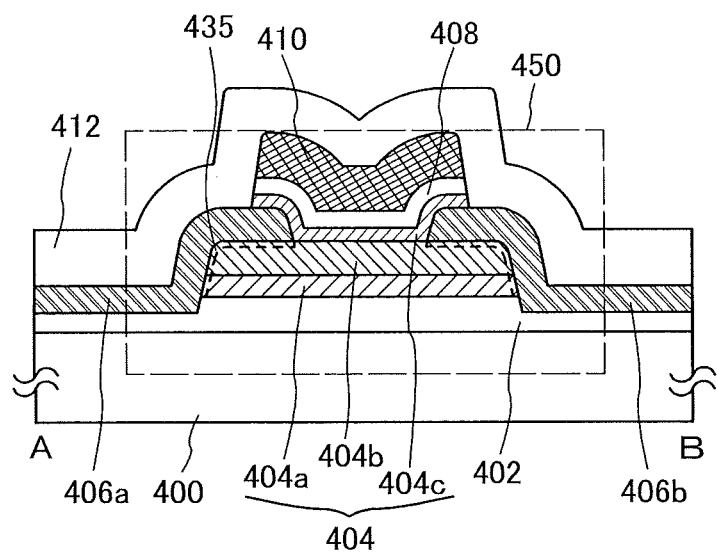
FIG. 3 is a cross-sectional view of the transistor in a channel length direction.

The n-type region is illustrated in an enlarged cross-sectional view (a cross section taken along the channel length direction) of the transistor in FIG. 3. A boundary 435 indicated by a dotted line in the first oxide semiconductor film 404a and the second oxide semiconductor film 404b is a boundary between an intrinsic semiconductor region and an n-type semiconductor region. In the first oxide semiconductor film 404a and the second oxide semiconductor film 404b, a region near and in contact with the source electrode 406a or the drain electrode 406b becomes an n-type region. Note that the boundary 435 is schematically illustrated here, but actually, the boundary is not clearly seen in some cases. Although FIG. 3 shows that the boundary 435 extends in the lateral direction in the second oxide semiconductor film 404b, a region in the second oxide semiconductor film 404b that is sandwiched between the source electrode 406a or the drain electrode 406b and the first oxide semiconductor film 404a becomes an n-type region entirely in the thickness direction, in some cases. Furthermore, although not shown, an n-type region is formed in the third oxide semiconductor film 404c in some cases.

In the case of forming a transistor with an extremely short channel length, an n-type region which is formed by the generation of oxygen vacancies might extend in the channel length direction of the transistor, causing a short circuit. In that case, the electrical characteristics of the transistor are changed by a threshold voltage shift; for example, on and off of the transistor cannot be controlled with a gate voltage at a practical level (that is, the transistor is always on). Accordingly, when a transistor with an extremely short channel length is formed, it is not always preferable that a conductive material which is easily bonded to oxygen be used for a source electrode and a drain electrode.

In such a case, a conductive material which is less likely to be bonded to oxygen than the above material is preferably used for the source electrode 406a and the drain electrode 406b. As the conductive material which is less likely to be bonded to oxygen, for example, a material containing tantalum nitride, titanium nitride, or ruthenium, or the like can be used. As a structure in which the conductive material is in contact with the second oxide semiconductor film 404b, a stack including the conductive material which is less likely to be bonded to oxygen and the aforementioned conductive material which is easily bonded to oxygen may be used.

The gate insulating film 408 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 408 may be a stack including any of the above materials.

When the specific material is used for the gate insulating film, electrons are trapped in the gate insulating film under the specific conditions and the threshold voltage can be increased. For example, like a stacked-layer film of silicon oxide and hafnium oxide, a material having a lot of electron trap states, such as hafnium oxide, aluminum oxide, or tantalum oxide, is used for part of the gate insulating film 408 and the state where the potential of the gate electrode is higher than that of the source electrode or the drain electrode is kept for one second or more, typically one minute or more at a higher temperature (a temperature higher than the operating temperature or the storage temperature of the semiconductor device, or a temperature of 125° C. or higher and 450° C. or lower, typically a temperature of 150° C. or higher and 300° C. or lower). Thus, electrons are moved from the oxide semiconductor film to the gate electrode, and some of the electrons are trapped by the electron trap states.

In the semiconductor device in which a necessary amount of electrons is trapped by the electron trap states in this manner, the threshold voltage is shifted in the positive direction. By controlling the voltage of the gate electrode, the amount of electrons to be trapped can be controlled, and thus the threshold voltage can be controlled. Furthermore, the treatment for trapping the electrons may be performed in the manufacturing process of the semiconductor device.

For example, the treatment is preferably performed at any step before factory shipment, such as after the formation of a wire metal connected to the source electrode or the drain electrode of the semiconductor device, after the preceding process (wafer processing), after a wafer-dicing step, after packaging, or the like. In any case, it is preferable that the transistor not be exposed to a temperature higher than or equal to 125° C. for one hour or more after the treatment.

An example in which the gate insulating film is used also as an electron trap layer (a layer containing electron trap states) is described with reference to simplified cross-sectional views.

Figure 28A:
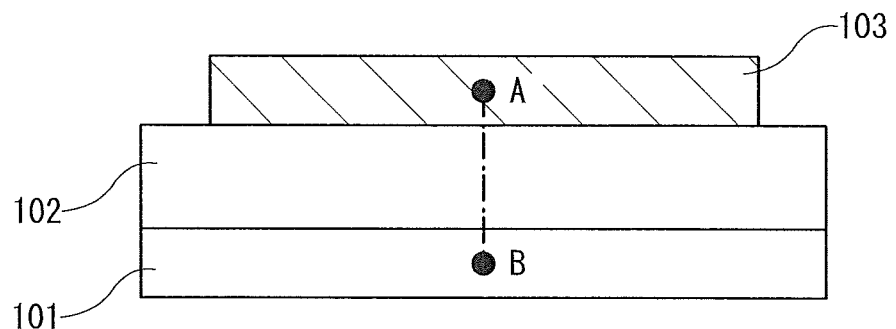
FIGS. 28A to 28C are each a cross-sectional view of a transistor.

FIG. 28A illustrates a semiconductor device including a semiconductor layer 101, an electron trap layer 102, and a gate electrode 103.

The semiconductor layer 101, the electron trap layer 102, and the gate electrode 103 correspond to the multilayer film 404, the gate insulating film 408, and the gate electrode 410 of FIGS. 1A to 1C, respectively.

The electron trap layer 102 includes a state that traps an electron (electron trap state). Depending on the formation method and formation conditions, such a state is not formed in some cases even when the electron trap layer 102 is formed of the same constituent elements.

Figure 28B:
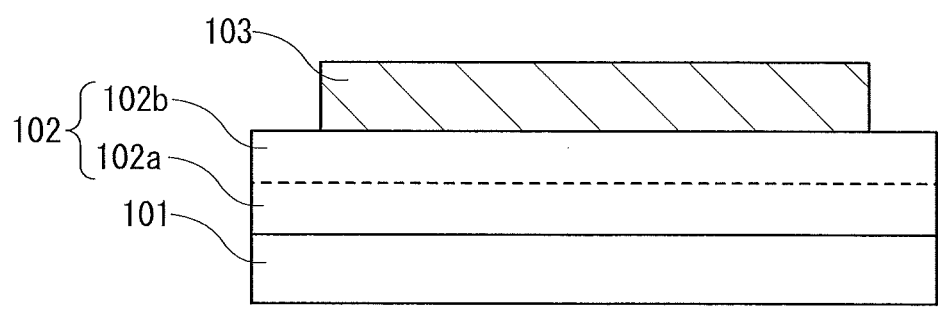
Figure 28C:
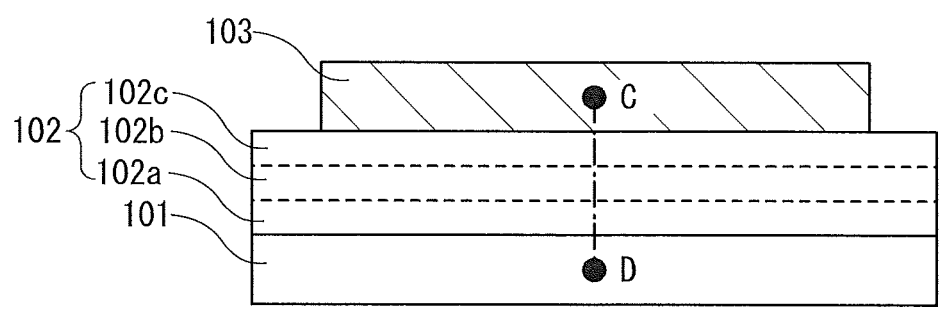

For example, the electron trap layer 102 may be a stacked body that includes a first insulating layer 102a formed by a first formation method (or under first formation conditions) and a second insulating layer 102b formed by a second formation method (or under second formation conditions) as illustrated in FIG. 28B. Alternatively, the electron trap layer 102 may be a stacked body that includes the first insulating layer 102a formed by the first formation method (or under the first formation conditions), the second insulating layer 102b formed by the second formation method (or under the second formation conditions), and a third insulating layer 102c formed by a third formation method (or under third formation conditions) as illustrated in FIG. 28C, or a stacked body including four or more insulating layers.

Here, the first to third insulating layers have the same constituent elements. Note that the first formation method (or the first formation conditions) may be the same as the third formation method (or the third formation conditions). In this case, it is preferable that the number of electron trap states in a layer that is not in contact with the semiconductor layer 101 (e.g., the second insulating layer) be large. For example, an insulating layer formed by a sputtering method has a higher density of electron trap states than an insulating layer formed by a CVD method or an ALD method even if having the same composition.

Accordingly, an insulating layer formed by a sputtering method may be used as the second insulating layer 102b, and an insulating layer formed by a CVD method or an ALD method may be used as the first insulating layer 102a. In the case of FIG. 28C, the third insulating layer 102c may be formed in the same way as the first insulating layer 102a. However, the insulating layers are not limited thereto in one embodiment of the present invention; an insulating layer formed by a CVD method or an ALD method may be used as the second insulating layer 102b, and an insulating layer formed by a sputtering method may be used as the first insulating layer 102a. In the case of FIG. 28C, the third insulating layer 102c may be formed in the same way as the first insulating layer 102a.

The insulating layer formed by a CVD method can function as a normal gate insulating film and thereby can reduce leakage current between a gate and a drain or a source. In contrast, the insulating layer formed by a sputtering method has a high density of electron trap states and thereby can make the threshold voltage of the transistor change larger. Accordingly, this structure enables small leakage current and appropriate threshold voltage adjustment. For this reason, it is preferable to form a stacked structure using different formation methods (or different formation conditions). Note that one embodiment of the present invention is not limited to these examples.

Furthermore, the formation method of the semiconductor layer 101 and the formation method of the first insulating layer 102a that is in contact with the semiconductor layer 101 may be the same for easy successive formation. For example, in the case of forming the semiconductor layer 101 by a sputtering method, the first insulating layer 102a may also be formed by a sputtering method and then the second insulating layer 102b may be formed by a CVD method or an ALD method. In the case of FIG. 28C, the third insulating layer 102c may also be formed by a sputtering method. Similarly, in the case of forming the semiconductor layer 101 by a CVD method, the first insulating layer 102a may also be found by a CVD method and then the second insulating layer 102b may be formed by a sputtering method. In the case of FIG. 28C, the third insulating layer 102c may also be formed by a CVD method. These structures enable small leakage current, appropriate threshold voltage adjustment, and easy manufacturing. Note that one aspect of one embodiment of the present invention is not limited to these.

Note that an insulating layer formed by a CVD method or an ALD method is preferably formed thicker than an insulating layer formed by a sputtering method. This can reduce an electrical breakdown, increase withstand voltage, and reduce leakage current. Note that one embodiment of the present invention is not limited to the examples described above.

Note that the CVD method may be any of a variety of methods: a thermal CVD method, a photo CVD method, a plasma CVD method, an MOCVD method, an LPCVD method, and the like. The insulating layers may be formed by different CVD methods.

Figure 29A:
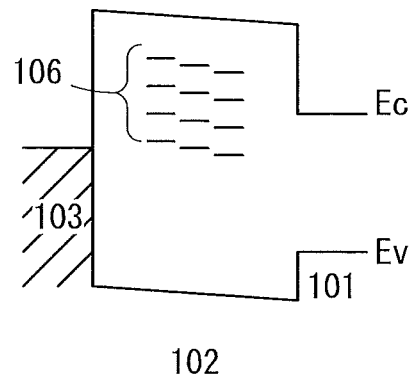
FIGS. 29A to 29D show band structures of multilayer films.

FIG. 29A illustrates a band diagram example of the semiconductor device illustrated in FIG. 28A, from point A to point B. In FIGS. 29A to 29D, Ec represents a conduction band minimum and Ev represents a valence band maximum. In FIG. 29A, the potential of the gate electrode 103 is the same as the potential of a source electrode or a drain electrode (not illustrated).

Figure 29B:
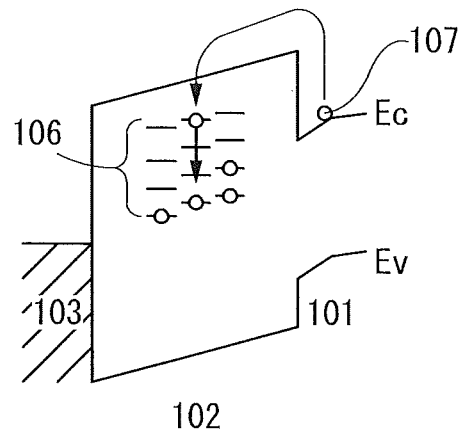

Electron trap states 106 exist inside the electron trap layer 102. FIG. 29B shows the state where the potential of the gate electrode 103 is higher than the potential of the source electrode or the drain electrode. The potential of the gate electrode 103 may be higher than the potential of the source electrode or the drain electrode by 1 V or more. The potential of the gate electrode 103 may be lower than the highest potential applied to the gate electrode 103 after this process, which is typically lower than 4 V.

Electrons 107 that exist in the semiconductor layer 101 move toward the gate electrode 103 having a higher potential. Some of the electrons 107 moving from the semiconductor layer 101 toward the gate electrode 103 are trapped in the electron trap states 106.

To hold electrons trapped by electron trap states inside the second insulating layer 102b or at the interface with another insulating layer, it is effective that the electron trap layer 102 is formed of three insulating layers, which include the same constituent elements, as illustrated in FIG. 28C by different formation methods (or different formation conditions) and that the number of electron trap states in the second insulating layer 102b is larger than that of the other layers.

Figure 29C:
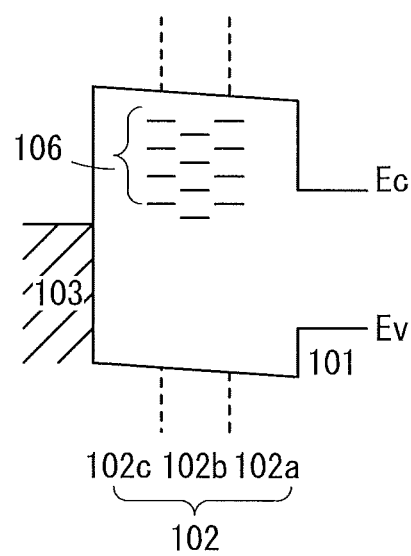

In this case, if the physical thickness of the third insulating layer 102c is large enough, electrons trapped by the electron trap states 106 can be held even when the second insulating layer 102b has a small thickness. FIG. 29C illustrates a band diagram example of the semiconductor device illustrated in FIG. 28C, from point C to point D. Note that if the formation method (or formation conditions) is different, materials including the same constituent elements have different number of oxygen vacancies or the like and thus may have different Fermi levels. However, in the example described below, it is assumed that such materials have the same Fermi level.

The second insulating layer 102b is formed by a formation method (or under formation conditions) that makes the number of electron trap states 106 larger. Accordingly, the number of electron trap states at the interface between the first insulating layer 102a and the second insulating layer 102b and at the interface between the second insulating layer 102b and the third insulating layer 102c is large.

Figure 29D:
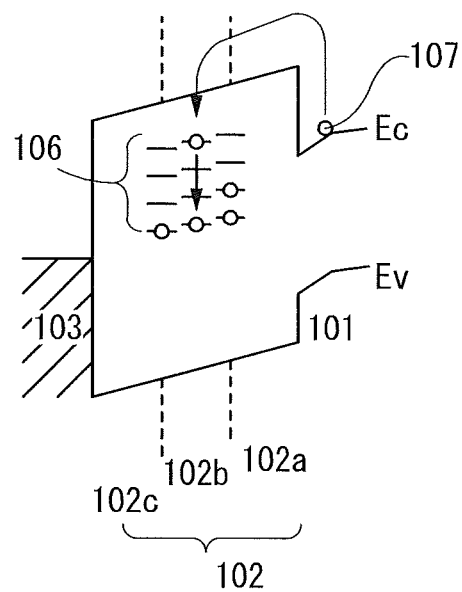

By setting the potential of the gate electrode 103 and the temperature at the above-described conditions, electrons from the semiconductor layer 101 are trapped by the electron trap states 106 as described with FIG. 29B, so that the electron trap layer 102 is negatively charged (see FIG. 29D).

Figure 30A:
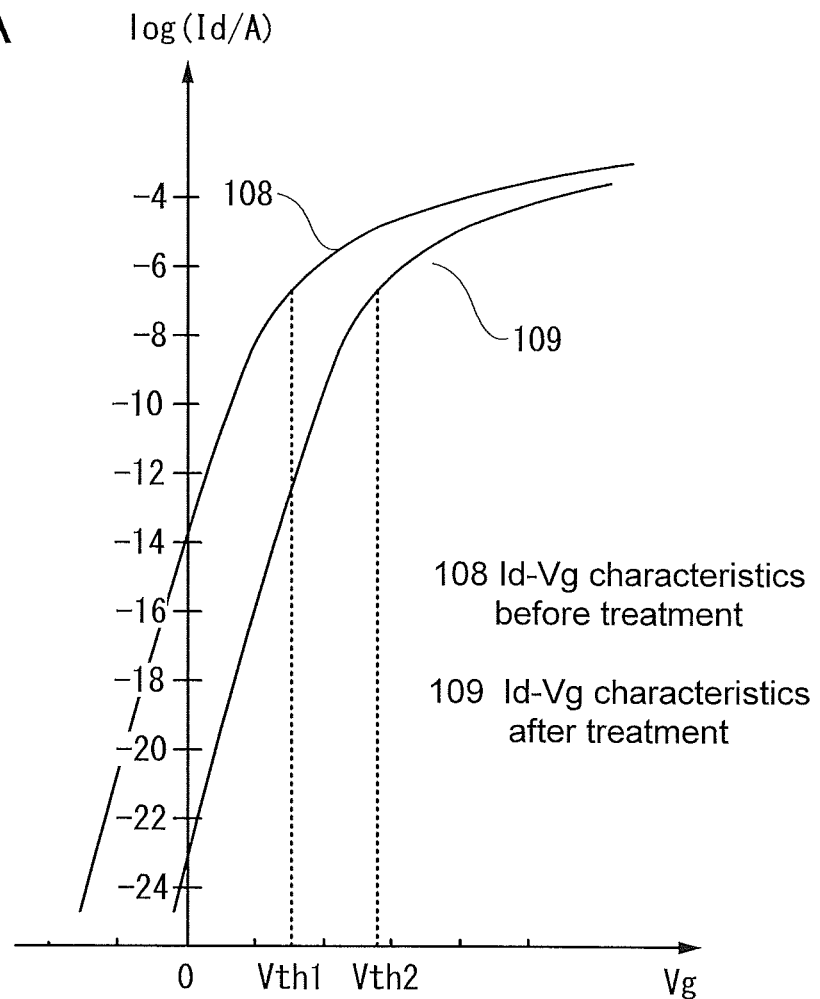
FIG. 30A shows electrical characteristics of a transistor and FIG. 30B is a circuit diagram of a semiconductor device.

The threshold voltage of a semiconductor device is increased as shown in FIG. 30A by the trap of electrons in the electron trap layer 102. In particular, when the semiconductor layer 101 is formed using a wide band gap material, a source-drain current (cut-off current, Icut) when the potential of the gate electrode 103 is equal to the potential of the source electrode or the drain electrode can be significantly decreased.

For example, the Icut density (a current value per micrometer of a channel width) of an In—Ga—Zn-based oxide whose band gap is 3.2 eV is 1 zA/μm ($1\times10^{-21}$ A/μm) or less, typically 1 yA/μm ($1\times10^{-24}$ A/μm) or less.

FIG. 30A schematically shows dependence of current per micrometer of a channel width (Id/A) between source and drain electrodes on the potential of the gate electrode 103 (Vg) at room temperature, before and after electron trap in the electron trap layer 102. Note that each potential of the source electrode and the gate electrode 103 is 0 V and the potential of the drain electrode is +1 V. Although current smaller than 1 fA cannot be measured directly, it can be estimated from a value measured by another method, that is, the subthreshold value, and the like.

As indicated by a curve 108, the threshold voltage of the semiconductor device is Vth1 at first. After electron trapping, the threshold voltage increases (shifts in the positive direction) to become Vth2. As a result, the current density when Vg=0 becomes 1 aA/μm ($1\times10^{-18}$ A/μm) or less, for example, greater than or equal to 1 zA/μm and less than or equal to 1 yA/μm.

Figure 30B:
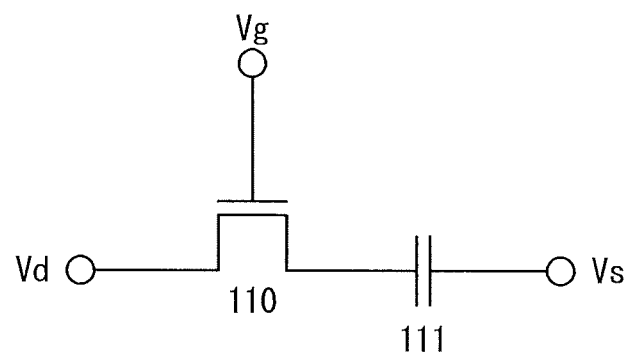

FIG. 30B illustrates a circuit in which charge stored in a capacitor 111 is controlled by a transistor 110. Leakage current between electrodes of the capacitor 111 is ignored here. The capacitance of the capacitor 111 is 1 fF, the potential of the capacitor 111 on the transistor 110 side is +1 V, and the potential of Vd is 0 V.

The curve 108 in FIG. 30A denotes the Id-Vg characteristics of the transistor 110. When the channel width is 0.1 μm, the Icut density is approximately 1 fA and the resistivity of the transistor 110 at this time is approximately $1\times10^{15}$ Ω. Accordingly, the time constant of a circuit composed of the transistor 110 and the capacitor 111 is approximately one second. This means that most of the charge stored in the capacitor 111 is lost in approximately one second.

A curve 109 in FIG. 30A denotes the Id-Vg characteristics of the transistor 110. When the channel width is 0.1 μm, the Icut density is approximately 1 yA and the resistivity of the transistor 110 at this time is approximately $1\times10^{24}$ Ω. Accordingly, the time constant of the circuit composed of the transistor 110 and the capacitor 111 is approximately $1\times10^{9}$ seconds (=approximately 31 years). This means that one third of the charge stored in the capacitor 111 is left after 10 years.

From this, charge can be held for 10 years in a simple circuit composed of a transistor and a capacitor without applying such a large voltage. This can be applied to various kinds of memory devices, such as a memory cell illustrated in FIG. 15 described later.

As the semiconductor layer 101, it is effective to use a layer whose hole effective mass is extremely large or substantially localized such as an intrinsic or substantially intrinsic oxide semiconductor film. In this case, hole injection from the semiconductor layer 101 to the electron trap layer 102 does not occur and consequently a phenomenon in which electrons trapped by the electron trap states 106 bond to holes and disappear does not occur. Accordingly, the charge retention characteristics can be improved.

For the gate electrode 410, a conductive film formed using Al, Ti, Cr, Co, Ni, Cu, Y, Zr, Mo, Ru, Ag, Ta, W, or the like can be used. The gate electrode may be a stack of any of the above materials. Alternatively, a conductive film containing nitrogen may be used for the gate electrode 410.

The oxide insulating film 412 may be formed over the gate insulating film 408 and the gate electrode 410. The oxide insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The oxide insulating film may be a stack of any of the above materials.

Here, the oxide insulating film 412 preferably contains excess oxygen. An oxide insulating film containing excess oxygen refers to an oxide insulating film from which oxygen can be released by heat treatment or the like. The oxide insulating film containing excess oxygen is preferably a film of which the amount of released oxygen when converted into oxygen atoms is $1.0 \times 10^{19}$ atoms/cm$^3$ or more in thermal desorption spectroscopy analysis. Note that the substrate temperature in the thermal desorption spectroscopy analysis is preferably higher than or equal to 100° C. and lower than or equal to 700° C., or higher than or equal to 100° C. and lower than or equal to 500° C. Oxygen released from the oxide insulating film can be diffused to the channel formation region in the multilayer film 404 through the gate insulating film 408, so that oxygen vacancies formed in the channel formation region can be filled with the oxygen. In this manner, stable electrical characteristics of the transistor can be achieved.

High integration of a semiconductor device requires miniaturization of a transistor. However, it is known that miniaturization of a transistor causes deterioration of the electrical characteristics of the transistor. When a channel width is shortened, on-state current is decreased.

However, in the transistor of one embodiment of the present invention, as described above, the third oxide semiconductor film 404c is formed so as to cover a region where the channel is formed in the second oxide semiconductor film 404b, and a channel formation layer and the gate insulating film are not in contact with each other. Accordingly, scattering of carriers at the interface between the channel formation layer and the gate insulating film can be reduced and the field-effect mobility of the transistor can be increased.

In the case where an oxide semiconductor film is an intrinsic or substantially intrinsic oxide semiconductor film, it is concerned that the field-effect mobility is decreased because of a reduction in the number of carriers in the oxide semiconductor film. However, in the transistor of one embodiment of the present invention, a gate electric field is applied to the oxide semiconductor film not only in the vertical direction but also from the side surfaces. That is, the gate electric field is applied to the whole of the oxide semiconductor film, whereby current flows in the bulk of the oxide semiconductor film. Consequently, it is possible to improve the field-effect mobility of a transistor and suppress variations in electrical characteristics of the transistor due to a highly purified intrinsic oxide semiconductor film.

In the transistor of one embodiment of the present invention, the second oxide semiconductor film 404b is formed over the first oxide semiconductor film 404a, so that an interface state is less likely to be formed. In addition, impurities do not enter the second oxide semiconductor film 404b from above and below because the second oxide semiconductor film 404b is an intermediate layer in a three-layer structure. With the structure in which the second oxide semiconductor film 404b is surrounded by the first oxide semiconductor film 404a and the third oxide semiconductor film 404c (or the second oxide semiconductor film 404b is electrically covered by the gate electrode 410), on-state current of the transistor is increased as described above, and in addition, threshold voltage can be stabilized and an S value can be reduced. Thus, Icut (drain current when gate voltage is 0 V) can be reduced and power consumption can be reduced. Further, the threshold voltage of the transistor becomes stable; thus, long-term reliability of the semiconductor device can be improved.

Figure 4A:
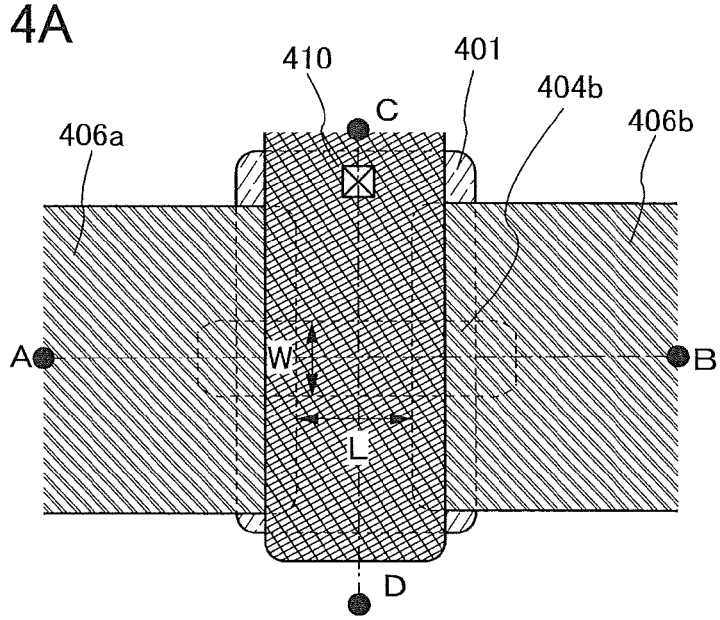
FIGS. 4A to 4C are a top view and cross-sectional views illustrating a transistor.
Figure 4B:
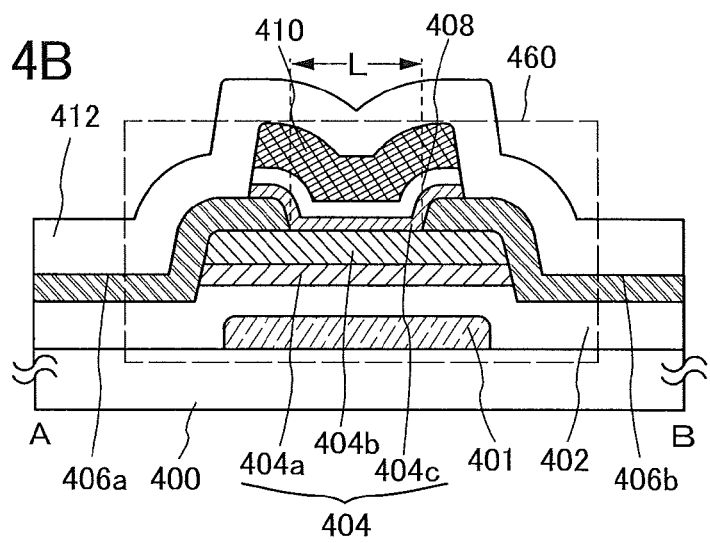
Figure 4C:
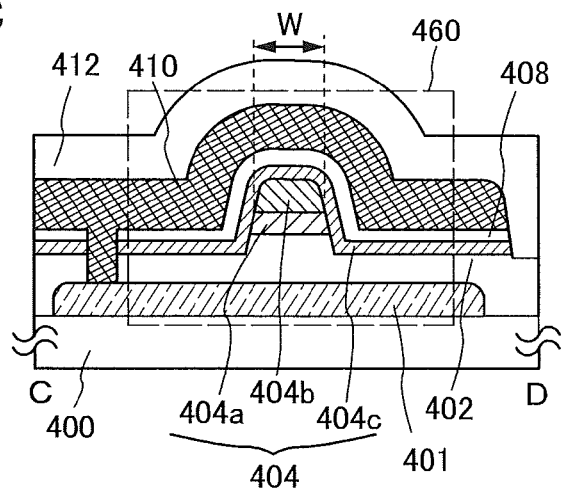

A transistor 460 illustrated in FIGS. 4A to 4C can alternatively be used. FIGS. 4A to 4C are a top view and cross-sectional views illustrating the transistor 460. FIG. 4A is the top view. FIG. 4B illustrates a cross section taken along the dashed-dotted line A-B in FIG. 4A. FIG. 4C illustrates a cross section taken along the dashed-dotted line C-D in FIG. 4A. Note that for simplification of the drawing, some components are not illustrated in the top view in FIG. 4A.

In the transistor 460 shown in FIGS. 4A to 4C, a conductive film 401 is provided between the base insulating film 402 and the substrate 400. When the conductive film 401 is used as a second gate electrode, the on-state current can be further increased or the threshold voltage can be controlled. In order to increase the on-state current, for example, as shown in FIGS. 4A to 4C, the gate electrode 410 and the conductive film 401 are electrically connected to each other to have the same potential, and the transistor is driven as a dual-gate transistor. Alternatively, to control the threshold voltage, the gate electrode 410 and the conductive film 401 are not electrically connected to each other, so that a fixed potential, which is different from a potential of the gate electrode 410, is supplied to the conductive film 401.

Figure 5A:
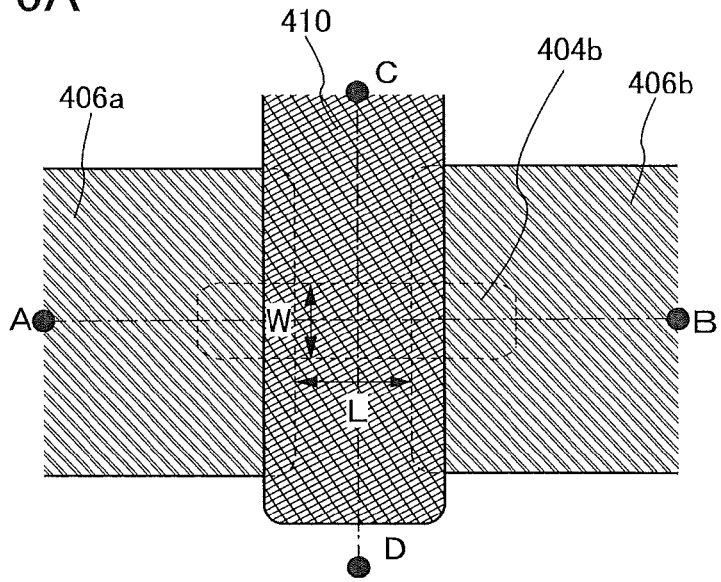
FIGS. 5A to 5C are a top view and cross-sectional views illustrating a transistor.
Figure 5B:
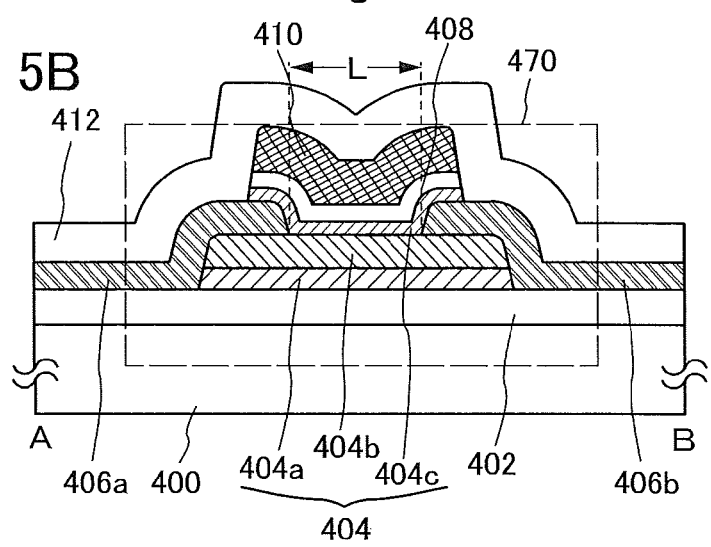
Figure 5C:
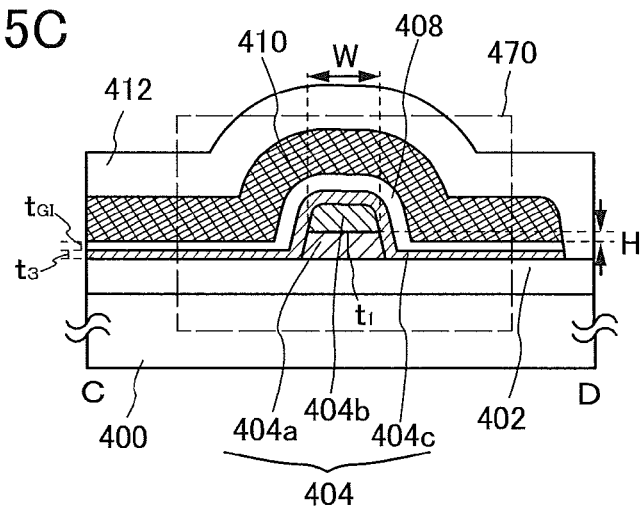

A transistor 470 illustrated in FIGS. 5A to 5C can also be used. FIGS. 5A to 5C are a top view and cross-sectional views illustrating the transistor 470. FIG. 5A is the top view. FIG. 5B illustrates a cross section taken along the dashed-dotted line A-B in FIG. 5A. FIG. 5C illustrates a cross section taken along the dashed-dotted line C-D in FIG. 5A. Note that for simplification of the drawing, some components are not illustrated in the top view of FIG. 5A.

In the transistor 470, the base insulating film 402 is not overetched when the source electrode 406a and the drain electrode 406b are formed; accordingly, the base insulating film 402 is not etched.

In order to prevent the base insulating film 402 from being etched when a conductive film to be the source electrode 406a and the drain electrode 406b is etched, the etching selectivity ratio of the conductive film to the base insulating film 402 is preferably increased.

A perpendicular distance H is the difference between the thickness $t_1$ of the first oxide semiconductor film 404a and the sum of the thickness $t_3$ of the third oxide semiconductor film 404c and the thickness $t_{GI}$ of the gate insulating film 408 (i.e., $t_3+t_{GI}$). The perpendicular distance H is greater than or equal to 5% and less than 300% of the channel width W, preferably greater than or equal to 10% and less than 300% of the channel width W, more preferably greater than or equal to 20% and less than 250% of the channel width W, still more preferably greater than or equal to 50% and less than 200% of the channel width W, further preferably greater than or equal to 100% and less than 150% of the channel width W. In view of variation among transistors, specifically, the perpendicular distance H is preferably greater than or equal to 20 nm, more preferably greater than or equal to 30 nm, still more preferably greater than or equal to 40 nm. Since characteristic values converge as the perpendicular distance H increases, characteristic variations due to error in the perpendicular distances H can be reduced.

A short channel effect occurs due to miniaturization, which leads to deterioration of electrical characteristics such as threshold voltage; however, with the above structure, the gate electrode 410 electrically covers the second oxide semiconductor film 404b (channel portion), whereby carriers can be easily controlled and deterioration of electrical characteristics due to the short channel effect can be suppressed.

In each of the structures described in this embodiment, the second oxide semiconductor film is provided between the first oxide semiconductor film and the third oxide semiconductor film. However, one embodiment of the present invention is not limited to the structures. A structure in which the first oxide semiconductor film and the third oxide semiconductor film are not included and only the second oxide semiconductor film is electrically covered by the gate electrode may be used.

Note that this embodiment can be combined with any of the other embodiments in this specification as appropriate.

Embodiment 2

In this embodiment, a method for manufacturing the transistor 450, which is described in Embodiment 1 with reference to FIGS. 1A to 1C, is described with reference to FIGS. 6A to 6C and FIGS. 7A to 7C.

Figure 6A:
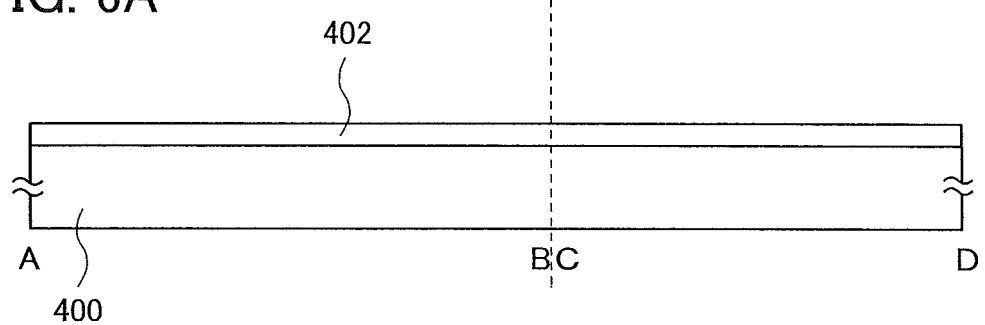
FIGS. 6A to 6C illustrate a method for manufacturing the transistor.

First, the base insulating film 402 is formed over the substrate 400 (see FIG. 6A).

As the substrate 400, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like can be used. Further alternatively, any of these substrates further provided with a semiconductor element can be used.

The base insulating film 402 can be formed by a plasma CVD method, a sputtering method, or the like using an oxide insulating material such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide; a nitride insulating material such as silicon nitride, silicon nitride oxide, aluminum nitride, or aluminum nitride oxide; or a mixed material of any of the oxide insulating materials and any of the nitride insulating materials. Alternatively, a stack including any of the above materials may be used, and at least an upper layer of the base insulating film 402 which is in contact with the multilayer film 404 is preferably formed using a material containing excess oxygen that might serve as a supply source of oxygen to the multilayer film 404.

Oxygen may be added to the base insulating film 402 by an ion implantation method, an ion doping method, a plasma immersion ion implantation method, or the like. Adding oxygen enables the base insulating film 402 to supply oxygen much easily to the multilayer film 404.

In the case where a surface of the substrate 400 is made of an insulator and there is no influence of impurity diffusion to the multilayer film 404 to be formed later, the base insulating film 402 is not necessarily provided.

Figure 6B:
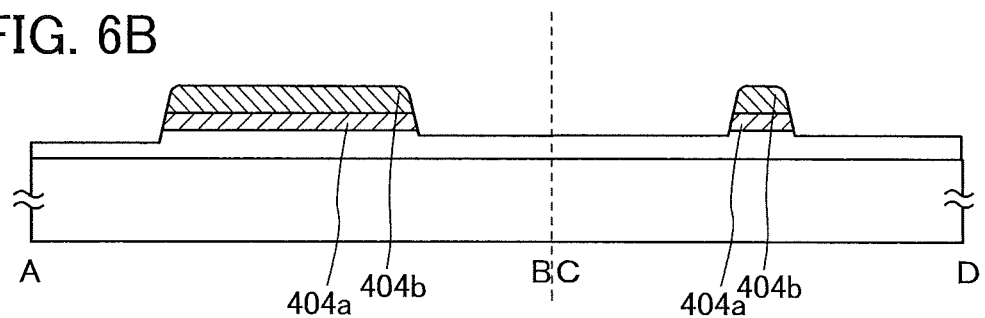

Next, the first oxide semiconductor film 404a and the second oxide semiconductor film 404b are formed over the base insulating film 402 by a sputtering method, a CVD method, an MBE method, an ALD method, or a PLD method (see FIG. 6B). At this time, as shown in FIG. 6B, the base insulating film 402 can be slightly overetched. By overetching of the base insulating film 402, the gate electrode 410 to be formed later can cover the third oxide semiconductor film 404c easily.

For processing the first oxide semiconductor film 404a and the second oxide semiconductor film 404b into island shapes, first, a film to be a hard mask (e.g., a tungsten film) and a resist mask are provided over the second oxide semiconductor film 404b, and the film to be a hard mask is etched to form a hard mask. Then, the resist mask is removed, and etching of the first oxide semiconductor film 404a and the second oxide semiconductor film 404b is performed using the hard mask, which is followed by removal of the hard mask. At the time of the etching, an end portion of the hard mask is gradually reduced as the etching progresses; as a result, the end portion of the hard mask is rounded to have a curved surface. Accordingly, the end portion of the second oxide semiconductor film 404b is rounded to have a curved surface. With this structure, the coverage with the third oxide semiconductor film 404c, the gate insulating film 408, the gate electrode 410, and the oxide insulating film 412, which are to be formed over the second oxide semiconductor film 404b, can be improved; thus, occurrence of a shape defect such as disconnection can be inhibited. In addition, electric field concentration which might occur at the end portions of the source electrode 406a and the drain electrode 406b can be reduced, which can suppress deterioration of the transistor.

In order to form a continuous energy band in a stack including the first oxide semiconductor film 404a and the second oxide semiconductor film 404b, or a stack including the first oxide semiconductor film 404a, the second oxide semiconductor film 404b, and the third oxide semiconductor film 404c to be formed in a later step, the layers need to be formed successively without exposure to the air with the use of a multi-chamber deposition apparatus (e.g., a sputtering apparatus) including a load lock chamber. It is preferable that each chamber of the sputtering apparatus be able to be evacuated to a high vacuum (approximately $5\times10^{-7}$ Pa to $1\times10^{-4}$ Pa) by an adsorption vacuum evacuation pump such as a cryopump and that the chamber be able to heat a substrate over which a film is to be deposited to 100° C. or higher, preferably 500° C. or higher, so that water and the like acting as impurities of an oxide semiconductor are removed as much as possible. Alternatively, a combination of a turbo molecular pump and a cold trap is preferably used to prevent back-flow of a gas containing a carbon component, moisture, or the like from an evacuation system into the chamber.

Not only high vacuum evacuation of the chamber but also high purity of a sputtering gas is necessary to obtain a highly purified intrinsic oxide semiconductor. An oxygen gas or an argon gas used as the sputtering gas is highly purified to have a dew point of −40° C. or lower, preferably −80° C. or lower, further preferably −100° C. or lower, so that entry of moisture and the like into the oxide semiconductor film can be prevented as much as possible.

The materials described in Embodiment 1 can be used for the first oxide semiconductor film 404a, the second oxide semiconductor film 404b, and the third oxide semiconductor film 404c that is to be formed in a later step. For example, an In—Ga—Zn oxide whose atomic ratio of In to Ga and Zn is 1:3:4 or 1:3:2 can be used for the first oxide semiconductor film 404a, an In—Ga—Zn oxide whose atomic ratio of In to Ga and Zn is 1:1:1 can be used for the second oxide semiconductor film 404b, and an In—Ga—Zn oxide whose atomic ratio of In to Ga and Zn is 1:3:4 or 1:3:2 can be used for the third oxide semiconductor film 404c.

An oxide semiconductor that can be used for each of the first oxide semiconductor film 404a, the second oxide semiconductor film 404b, and the third oxide semiconductor film 404c preferably contains at least indium (In) or zinc (Zn). Alternatively, the oxide semiconductor preferably contains both In and Zn. In order to reduce variations in the electrical characteristics of the transistor including the oxide semiconductor, the oxide semiconductor preferably contains a stabilizer in addition to In and/or Zn.

Examples of a stabilizer include gallium (Ga), tin (Sn), hafnium (Hf), aluminum (Al), and zirconium (Zr). Other examples of a stabilizer are lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

Note that here, for example, an "In—Ga—Zn oxide" means an oxide containing In, Ga, and Zn as its main components. The In—Ga—Zn oxide may contain a metal element other than In, Ga, and Zn. Further, in this specification, a film formed using an In—Ga—Zn oxide is also referred to as an IGZO film.

Alternatively, a material represented by $InMO_3(ZnO)_m$, (m>0, where m is not an integer) may be used. Note that M represents one or more metal elements selected from Ga, Fe, Mn, and Co. Further alternatively, a material represented by $In_2SnO_5(ZnO)_n$ (n>0, where n is an integer) may be used.

Note that as described in Embodiment 1 in detail, materials are selected so that the first oxide semiconductor film 404a and the third oxide semiconductor film 404c each have an electron affinity lower than that of the second oxide semiconductor film 404b.

The oxide semiconductor films are each preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

In the case of using an In—Ga—Zn oxide, a material whose atomic ratio of In to Ga and Zn is any of 1:1:1, 2:2:1, 3:1:2, 1:3:2, 1:3:4, 1:4:3, 1:5:4, 1:6:6, 2:1:3 1:6:4, 1:9:6, 1:1:4, and 1:1:2 is used for the first oxide semiconductor film 404a, the second oxide semiconductor film 404b, and/or the third oxide semiconductor film 404c so that the first oxide semiconductor film 404a and the third oxide semiconductor film 404c each have an electron affinity lower than that of the second oxide semiconductor film 404b.

Note that for example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$, and r may be 0.05, for example. The same applies to other oxides.

The indium content of the second oxide semiconductor film 404b is preferably higher than the indium content of the first oxide semiconductor film 404a and the indium content of the third oxide semiconductor film 404c. In an oxide semiconductor, the s orbital of heavy metal mainly contributes to carrier transfer, and when the proportion of In in the oxide semiconductor is increased, overlap of the s orbitals is likely to be increased. Thus, an oxide having a composition in which the proportion of In is higher than that of Ga has higher mobility than an oxide having a composition in which the proportion of In is equal to or lower than that of Ga. For this reason, with the use of an oxide having a high indium content for the second oxide semiconductor film 404b, a transistor having high mobility can be achieved.

A structure of an oxide semiconductor film is described below.

Note that in this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

An oxide semiconductor film is classified roughly into a non-single-crystal oxide semiconductor film and a single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a film formation surface) or a top surface of the CAAC-OS film, and is arranged in parallel to the film formation surface or the top surface of the CAAC-OS film.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

From the results of the cross-sectional TEM image and the plan-view TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the film formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the InGaZnO$_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a film formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a film formation surface or a normal vector of a top surface of the CAAC-OS film. Thus, for example, in the case where a shape of the CAAC-OS film is changed by etching or the like, the c-axis might not be necessarily parallel to a normal vector of a film formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the film formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (or molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the amount of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor film in some cases. In most cases, a crystal part in the microcrystalline oxide semiconductor film is greater than or equal to 1 nm and less than or equal to 100 nm, or greater than or equal to 1 nm and less than or equal to 10 nm. An oxide semiconductor film including nanocrystal (nc), which is a microcrystal with a size greater than or equal to 1 nm and less than or equal to 10 nm, or a size greater than or equal to 1 nm and less than or equal to 3 nm, is specifically referred to as a nanocrystalline oxide semiconductor (nc-OS) film. In an image obtained with TEM, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter (e.g., larger than or equal to 1 nm and smaller than or equal to 30 nm) close to or smaller than the diameter of a crystal part.

Further, in a nanobeam electron diffraction pattern of the nc-OS film, regions with high luminance in a circular (ring) pattern are observed in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film; hence, the nc-OS film has a higher density of defect states than the CAAC-OS film.

Note that an oxide semiconductor film may be a stacked film including two or more kinds of an amorphous oxide semiconductor film, a microcrystalline oxide semiconductor film, and a CAAC-OS film, for example.

For example, a CAAC-OS film can be deposited by sputtering with a polycrystalline oxide semiconductor sputtering target. When ions collide with the sputtering target, a crystal region included in the sputtering target may be separated from the target along the a-b plane, and a sputtered particle having a plane parallel to the a-b plane (flat-plate-like sputtered particle or a pellet-like sputtered particle) might be separated from the sputtering target. In this case, the flat-plate-like sputtered particle or the pellet-like sputtered particle is electrically charged and thus reaches a substrate while maintaining its crystal state without being aggregated in plasma, whereby a CAAC-OS film can be formed.

First heat treatment may be performed after the second oxide semiconductor film 404b is formed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the second oxide semiconductor film 404b can be improved, and in addition, impurities such as hydrogen and water can be removed from the base insulating film 402 and the first oxide semiconductor film 404a. Note that the first heat treatment may be performed before etching for formation of the second oxide semiconductor film 404b.

A first conductive film to be the source electrode 406a and the drain electrode 406b is formed over the first oxide semiconductor film 404a and the second oxide semiconductor film 404b. For the first conductive film, Al, Cr, Cu, Ta, Ti, Mo, W, or an alloy material containing any of these as its main component can be used. For example, a 100-nm-thick titanium film is formed by a sputtering method or the like. Alternatively, a tungsten film may be formed by a CVD method.

Figure 6C:
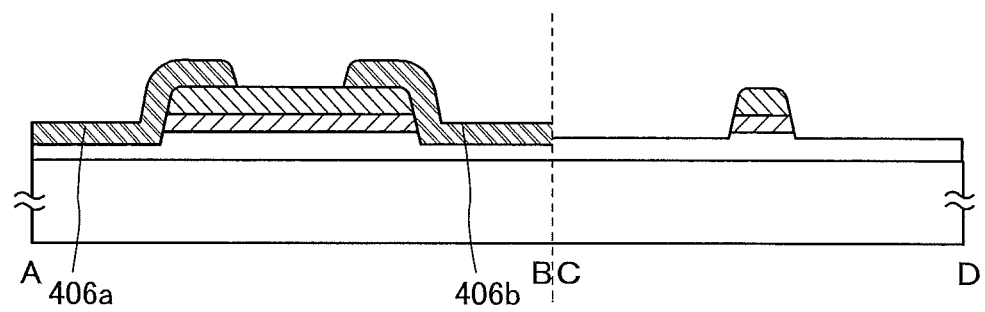

Then, the first conductive film is etched so as to be divided over the second oxide semiconductor film 404b to form the source electrode 406a and the drain electrode 406b (see FIG. 6C).

Next, a third oxide semiconductor film 403c is formed over the second oxide semiconductor film 404b, the source electrode 406a, and the drain electrode 406b.

Note that second heat treatment may be performed after the third oxide semiconductor film 403c is formed. The second heat treatment can be performed in a condition similar to that of the first heat treatment. The second heat treatment can remove impurities such as hydrogen and water from the third oxide semiconductor film 403c. In addition, impurities such as hydrogen and water can be further removed from the first oxide semiconductor film 404a and the second oxide semiconductor film 404b.

Figure 7A:
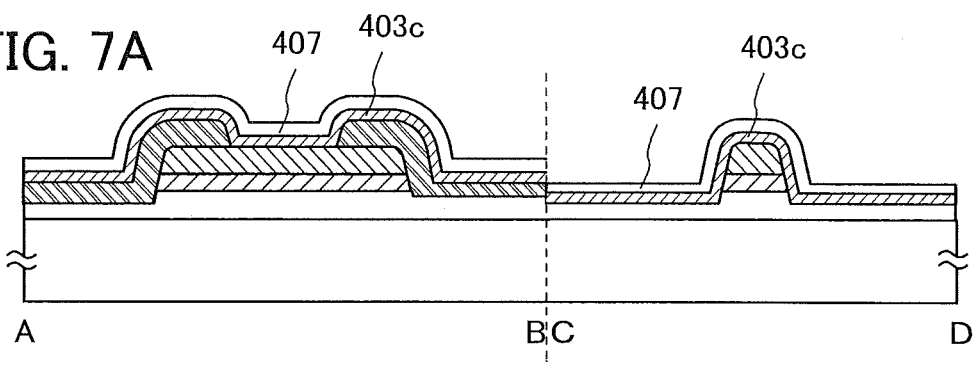
FIGS. 7A to 7C illustrate the method for manufacturing the transistor.

Next, an insulating film 407 to be the gate insulating film 408 is formed over the third oxide semiconductor film 403c (see FIG. 7A). The insulating film 407 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The insulating film 407 may be a stack including any of the above materials. The insulating film 407 can be formed by a sputtering method, a CVD method, an MBE method, an ALD method, a PLD method, or the like.

Figure 7B:
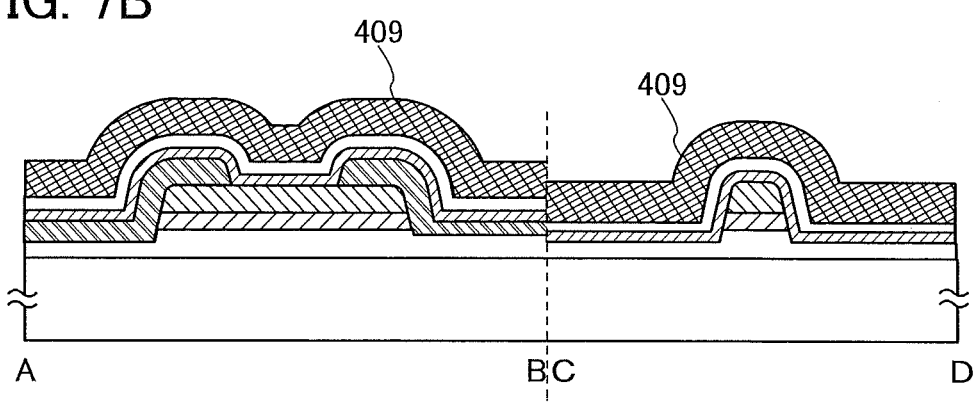

Then, a second conductive film 409 to be the gate electrode 410 is formed over the insulating film 407 (see FIG. 7B). For the second conductive film 409, Al, Ti, Cr, Co, Ni, Cu, Y, Zr, Mo, Ru, Ag, Ta, W, or an alloy material containing any of these as its main component can be used. The second conductive film 409 can be formed by a sputtering method, a CVD method, or the like. The second conductive film 409 may be formed using a conductive film containing nitrogen or a stack including the conductive film and a conductive film containing nitrogen.

Figure 7C:
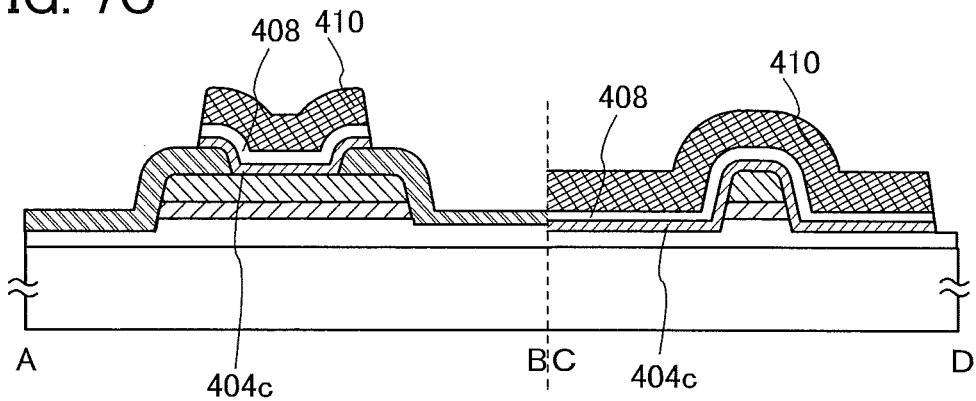

After that, the second conductive film 409 is selectively etched using a resist mask to form the gate electrode 410 (see FIG. 7C). Note that as shown in FIG. 1C, the sum of the height $h_1$ of the projected portion of the base insulating film 402 and the thickness $t_1$ of the first oxide semiconductor film 404a (i.e., $h_1+t_1$) is set larger than the sum of the thickness $t_3$ of the third oxide semiconductor film 404c and the thickness $t_{GI}$ of the gate insulating film 408 (i.e., $t_3+t_{GI}$). Thus, the gate electrode 410 is formed so as to electrically cover the second oxide semiconductor film 404b.

The perpendicular distance H is the difference between the sum of the height $h_1$ of the projected portion of the base insulating film 402 and the thickness 6 of the first oxide semiconductor film 404a (i.e., $h_1+t_1$) and the sum of the thickness 6 of the third oxide semiconductor film 404c and the thickness $t_{GI}$ of the gate insulating film 408 (i.e., $t_3+t_{GI}$). The perpendicular distance H is greater than or equal to 5% and less than 300% of the channel width W, preferably greater than or equal to 10% and less than 300% of the channel width W, more preferably greater than or equal to 20% and less than 250% of the channel width W, still more preferably greater than or equal to 50% and less than 200% of the channel width W, further preferably greater than or equal to 100% and less than 150% of the channel width W. In view of variation among transistors, specifically, the perpendicular distance H is preferably greater than or equal to 20 nm, more preferably greater than or equal to 30 nm, still more preferably greater than or equal to 40 nm. Since the characteristic values converge as the perpendicular distance H increases, characteristic variations due to error in the perpendicular distances H can be reduced.

A short channel effect occurs due to miniaturization, which leads to deterioration of electrical characteristics such as threshold voltage; however, with the above structure, the gate electrode 410 electrically covers the second oxide semiconductor film 404b (channel portion), whereby carriers can be easily controlled and deterioration of electrical characteristics due to the short channel effect can be suppressed.

Then, the insulating film 407 is selectively etched using the resist mask or the gate electrode 410 as a mask to form the gate insulating film 408.

Next, the third oxide semiconductor film 403c is etched using the resist mask or the gate electrode 410 as a mask to form the third oxide semiconductor film 404c.

A top end portion of the third oxide semiconductor film 404c is aligned with a bottom end portion of the gate insulating film 408. A top end portion of the gate insulating film 408 is aligned with a bottom end portion of the gate electrode 410. Although the gate insulating film 408 and the third oxide semiconductor film 404c are formed using the gate electrode 410 as a mask, the gate insulating film 408 and the third oxide semiconductor film 404c may be formed before the second conductive film 409 is formed, for example.

Next, the oxide insulating film 412 is formed over the source electrode 406a, the drain electrode 406b, and the gate electrode 410 (see FIGS. 1B and 1C). A material and a formation method of the oxide insulating film 412 can be similar to those of the base insulating film 402. The oxide insulating film 412 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or an oxide insulating film containing nitrogen. The oxide insulating film 412 can be formed by a sputtering method, a CVD method, an MBE method, an ALD method, or a PLD method, and is preferably formed to contain excess oxygen so as to be able to supply oxygen to the multilayer film 404.

Oxygen may be added to the oxide insulating film 412 by an ion implantation method, an ion doping method, a plasma immersion ion implantation method, or the like. Adding oxygen enables the oxide insulating film 412 to supply oxygen much easily to the multilayer film 404.

Next, third heat treatment may be performed. The third heat treatment can be performed under a condition similar to that of the first heat treatment. By the third heat treatment, excess oxygen is easily released from the base insulating film 402, the gate insulating film 408, and the oxide insulating film 412, so that oxygen vacancies in the multilayer film 404 can be reduced.

Through the above process, the transistor 450 illustrated in FIGS. 1A to 1C can be manufactured.

Note that this embodiment can be combined with any of the other embodiments in this specification as appropriate.

Embodiment 3

In this embodiment, a transistor having a structure different from that of the transistor described in Embodiment 1 is described.

Figure 8A:
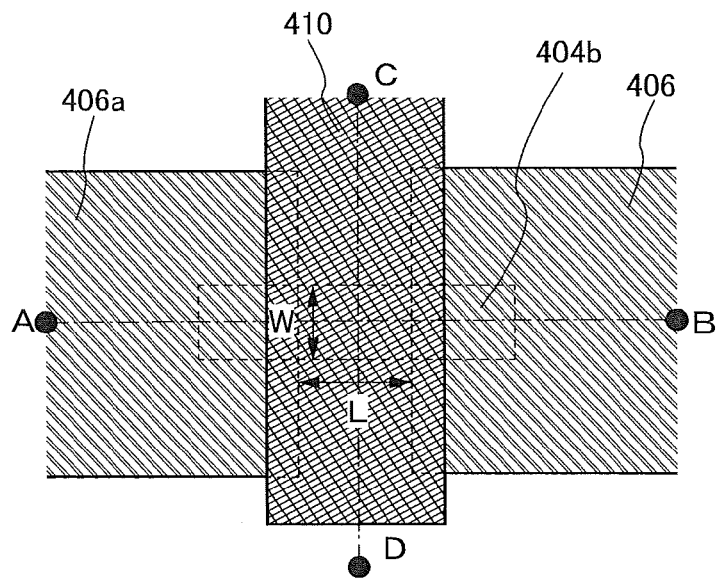
FIGS. 8A to 8C are a top view and cross-sectional views illustrating a transistor.
Figure 8B:
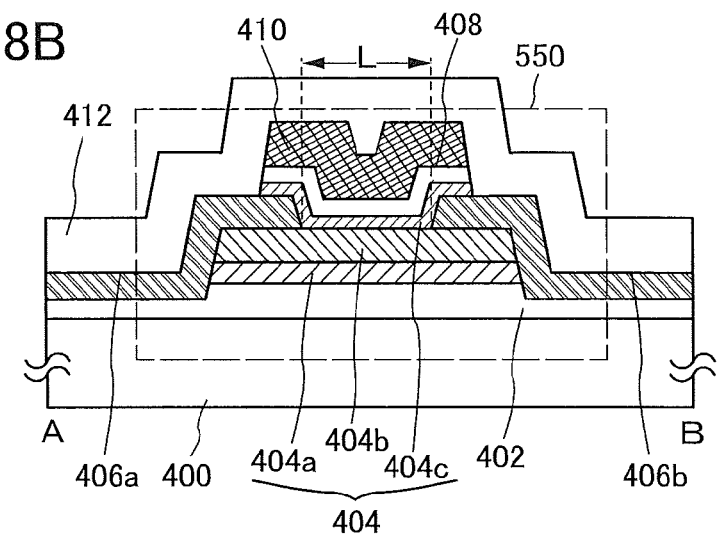
Figure 8C:
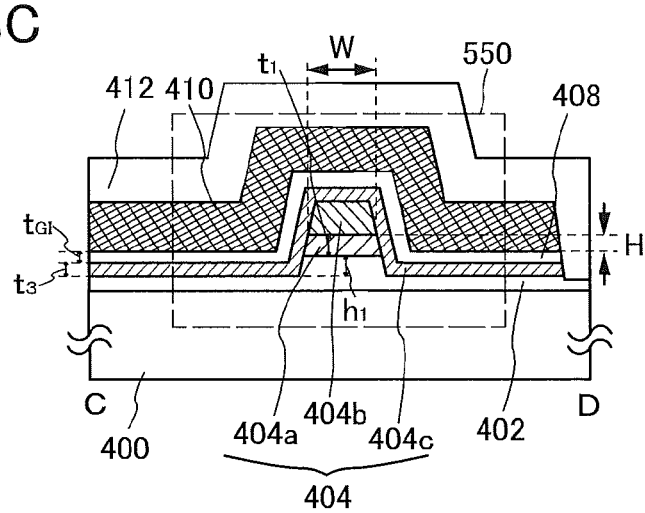

FIGS. 8A to 8C are a top view and cross-sectional views illustrating a transistor of one embodiment of the present invention. FIG. 8A is the top view. FIG. 8B illustrates a cross section taken along dashed-dotted line A-B in FIG. 8A. FIG. 8C illustrates a cross section taken along dashed-dotted line C-D in FIG. 8A. Note that for simplification of the drawing, some components are not illustrated in the top view in FIG. 8A. In some cases, the direction of the dashed-dotted line A-B is referred to as a channel length direction, and the direction of the dashed-dotted line C-D is referred to as a channel width direction.

A transistor 550 illustrated in FIGS. 8A to 8C includes the base insulating film 402 having a depressed portion and a projected portion over the substrate 400; the first oxide semiconductor film 404a and the second oxide semiconductor film 404b over the projected portion of the base insulating film 402; the source electrode 406a and the drain electrode 406b over the first oxide semiconductor film 404a and the second oxide semiconductor film 404b; the third oxide semiconductor film 404c in contact with a top surface of the base insulating film 402, a side surface of the first oxide semiconductor film 404a, a side surface and a top surface of the second oxide semiconductor film 404b, the source electrode 406a, and the drain electrode 406b; the gate insulating film 408 over the third oxide semiconductor film 404c; the gate electrode 410 which is in contact with the gate insulating film 408 and faces the top surface and the side surface of the second oxide semiconductor film 404b; and the oxide insulating film 412 over the source electrode 406a, the drain electrode 406b, and the gate electrode 410. The first oxide semiconductor film 404a, the second oxide semiconductor film 404b, and the third oxide semiconductor film 404c are collectively referred to as the multilayer film 404.

Note that a channel length refers to the distance between a source (a source region or a source electrode) and a drain (a drain region or a drain electrode) in a region where a semiconductor film and a gate electrode overlap with each other in a top view. Accordingly, in FIG. 8A, the channel length (L) is the distance between the source electrode 406a and the drain electrode 406b in a region where the second oxide semiconductor film 404b and the gate electrode 410 overlap with each other. A channel width refers to the width of a source or a drain in a region where a semiconductor film and a gate electrode overlap with each other. Accordingly, in FIG. 8A, the channel width (W) is the width of the source electrode 406a or the drain electrode 406b in the region where the second oxide semiconductor film 404b and the gate electrode 410 overlap with each other.

The perpendicular distance H is the difference between the sum of the height $h_1$ of the projected portion of the base insulating film 402 and the thickness $t_1$ of the first oxide semiconductor film 404a (i.e., $h_1+t_1$) and the sum of the thickness $t_3$ of the third oxide semiconductor film 404c and the thickness $t_{GI}$ of the gate insulating film 408 (i.e., $t_3+t_{GI}$). The perpendicular distance H is greater than or equal to 5% and less than 300% of the channel width W, preferably greater than or equal to 10% and less than 300% of the channel width W, more preferably greater than or equal to 20% and less than 250% of the channel width W, still more preferably greater than or equal to 50% and less than 200% of the channel width W, further preferably greater than or equal to 100% and less than 150% of the channel width W. In view of variation among transistors, specifically, the perpendicular distance H is preferably greater than or equal to 20 nm, more preferably greater than or equal to 30 nm, still more preferably greater than or equal to 40 nm. Since characteristic values converge as the perpendicular distance H increases, characteristic variations due to error in the perpendicular distances H can be reduced.

A short channel effect occurs due to miniaturization, which leads to deterioration of electrical characteristics such as threshold voltage; however, with the above structure, the gate electrode 410 electrically covers the second oxide semiconductor film 404b (channel portion), whereby carriers can be easily controlled and deterioration of electrical characteristics due to the short channel effect can be suppressed.

The gate electrode 410 electrically covers the second oxide semiconductor film 404b in such a structure, whereby on-state current is increased.

Miniaturization of a transistor leads to high integration and high density. In the miniaturization, for example, the channel length of the transistor is preferably set to be less than or equal to 40 nm, more preferably less than or equal to 30 nm, still more preferably less than or equal to 20 nm, and the channel width of the transistor is preferably set to be less than or equal to 40 nm, more preferably less than or equal to 30 nm, still more preferably less than or equal to 20 nm. The transistor of one embodiment of the present invention has an s-channel structure. Therefore, even when the channel width is shortened to the above range, large on-state current can be obtained.

Furthermore, in this embodiment, the oxide semiconductor film has angular end portions. The angular end portions can be obtained such that, when a film is processed using a resist mask or a hard mask, an etching selectivity ratio of the film to be processed to the resist mask or the hard mask is set high.

Figure 9A:
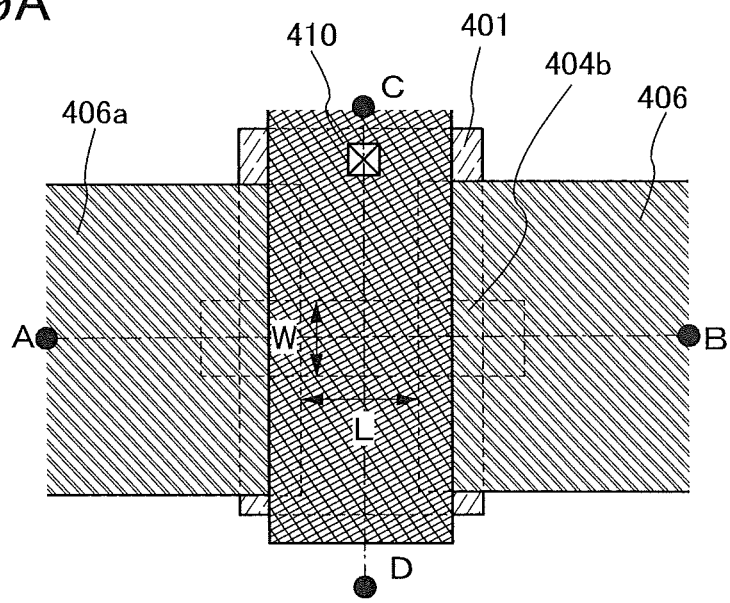
FIGS. 9A to 9C are a top view and cross-sectional views illustrating a transistor.
Figure 9B:
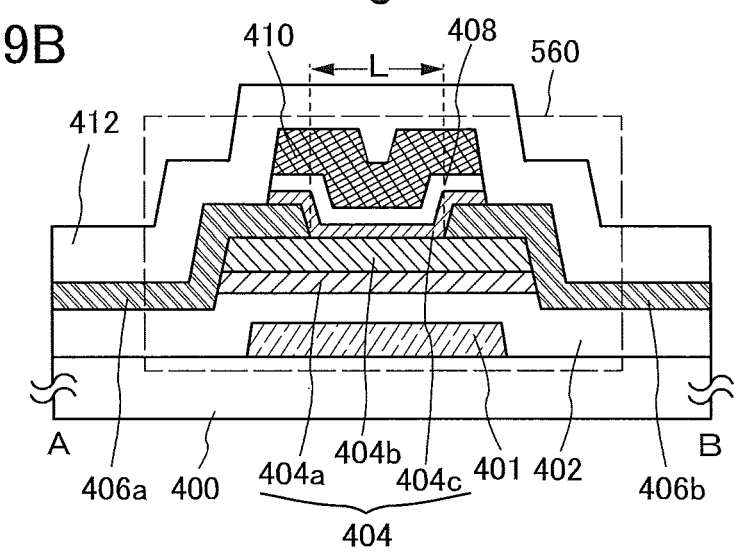
Figure 9C:
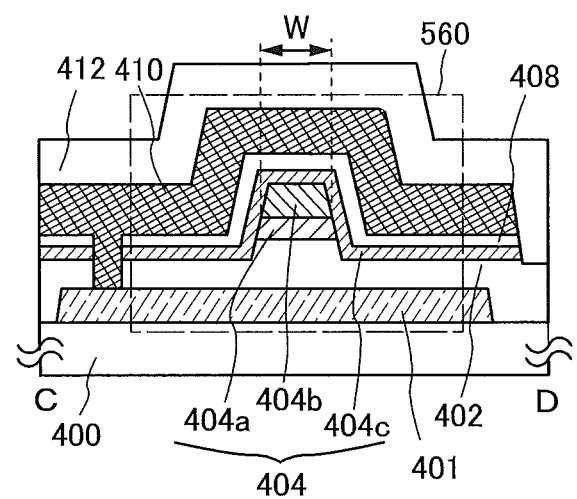

A transistor 560 illustrated in FIGS. 9A to 9C can also be used. FIGS. 9A to 9C are a top view and cross-sectional views illustrating the transistor 560. FIG. 9A is the top view. FIG. 9B illustrates a cross section taken along dashed-dotted line A-B in FIG. 9A. FIG. 9C illustrates a cross section taken along dashed-dotted line C-D in FIG. 9A. Note that for simplification of the drawing, some components are not illustrated in the top view in FIG. 9A.

In the transistor 560 illustrated in FIGS. 9A to 9C, the conductive film 401 is provided between the base insulating film 402 and the substrate 400. When the conductive film 401 is used as a second gate electrode, the on-state current can be further increased or the threshold voltage can be controlled. In order to increase the on-state current, for example, the gate electrode 410 and the conductive film 401 are electrically connected to each other to have the same potential, and the transistor is driven as a dual-gate transistor. To control the threshold voltage, the gate electrode 410 and the conductive film 401 are not electrically connected to each other, so that a fixed potential, which is different from a potential of the gate electrode 410, is supplied to the conductive film 401.

Figure 10A:
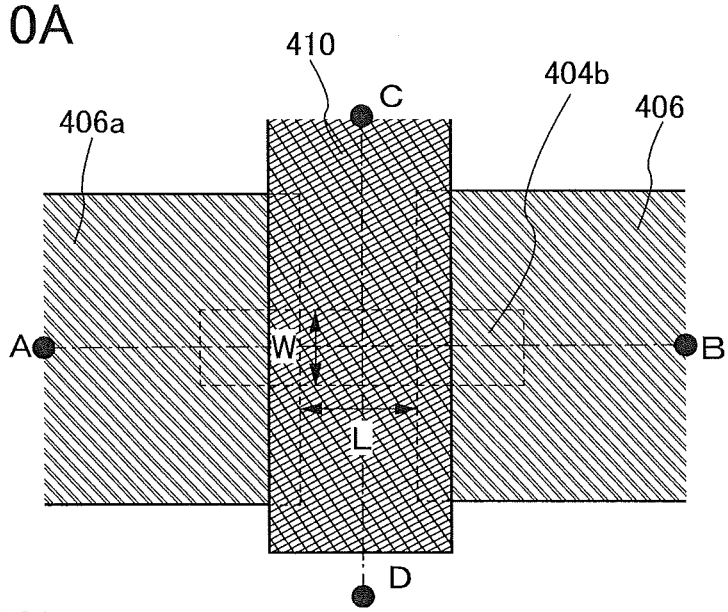
FIGS. 10A to 10C are a top view and cross-sectional views illustrating a transistor.
Figure 10B:
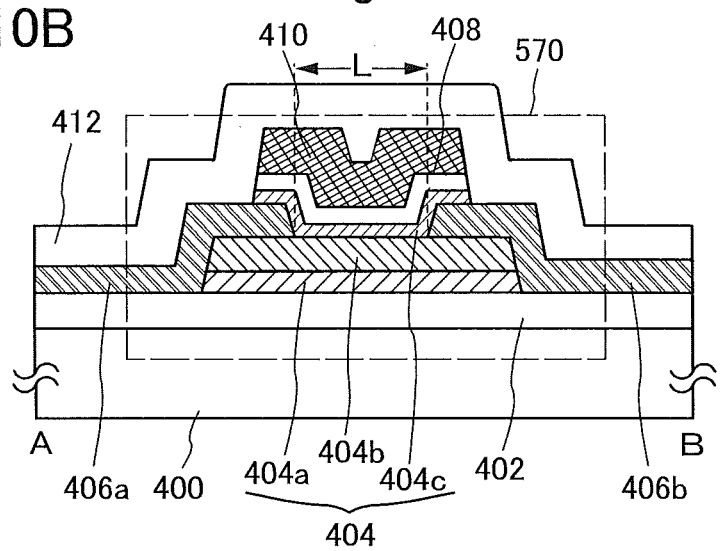
Figure 10C:
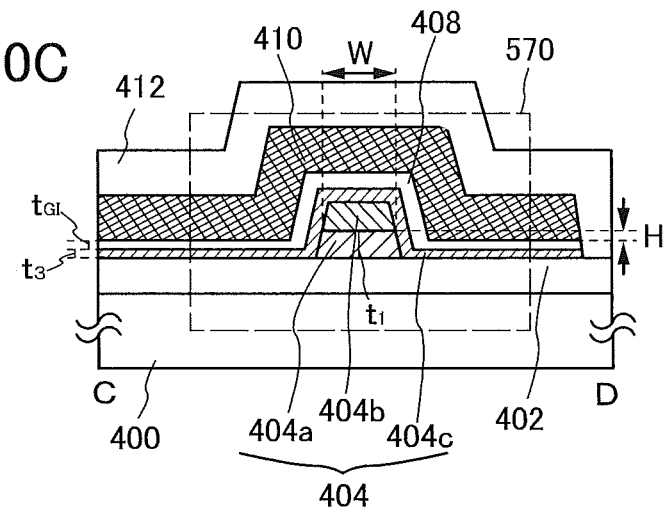

A transistor 570 illustrated in FIGS. 10A to 10C can also be used. FIGS. 10A to 10C are a top view and cross-sectional views illustrating the transistor 570. FIG. 10A is the top view. FIG. 10B illustrates a cross section taken along dashed-dotted line A-B in FIG. 10A. FIG. 10C illustrates a cross section taken along dashed-dotted line C-D in FIG. 10A. Note that for simplification of the drawing, some components are not illustrated in the top view in FIG. 10A.

In the transistor 570, the base insulating film 402 is not overetched when the source electrode 406a and the drain electrode 406b are formed; accordingly, the base insulating film 402 is not etched.

In order to prevent the base insulating film 402 from being etched when a conductive film to be the source electrode 406a and the drain electrode 406b is etched, the etching selectivity ratio of the conductive film to the base insulating film 402 is preferably increased.

The perpendicular distance H is the difference between the thickness $t_1$ of the first oxide semiconductor film 404a and the sum of the thickness $t_3$ of the third oxide semiconductor film 404c and the thickness $t_{GI}$ of the gate insulating film 408 (i.e., $t_3+t_{GI}$). The perpendicular distance H is greater than or equal to 5% and less than 300% of the channel width W, preferably greater than or equal to 10% and less than 300% of the channel width W, more preferably greater than or equal to 20% and less than 250% of the channel width W, still more preferably greater than or equal to 50% and less than 200% of the channel width W, further preferably greater than or equal to 100% and less than 150% of the channel width W. In view of variation among transistors, specifically, the perpendicular distance H is preferably greater than or equal to 20 nm, more preferably greater than or equal to 30 nm, still more preferably greater than or equal to 40 nm. Since characteristic values converge as the perpendicular distance H increases, characteristic variations due to error in the perpendicular distances H can be reduced.

A short channel effect occurs due to miniaturization, which leads to deterioration of electrical characteristics such as threshold voltage; however, with the above structure, the gate electrode 410 electrically covers the second oxide semiconductor film 404b (channel portion), whereby carriers can be easily controlled and deterioration of electrical characteristics due to the short channel effect can be suppressed.

In each of the structures described in this embodiment, the second oxide semiconductor film is provided between the first oxide semiconductor film and the third oxide semiconductor film. However, one embodiment of the present invention is not limited to the structures. A structure in which the first oxide semiconductor film and the third oxide semiconductor film are not included and only the second oxide semiconductor film is electrically covered by the gate electrode may be used.

Note that this embodiment can be combined with any of the other embodiments in this specification as appropriate.

Embodiment 4

In this embodiment, a method for manufacturing the transistor 550 described in Embodiment 3 with reference to FIGS. 8A to 8C is described with reference to FIGS. 11A to 11C and FIGS. 12A to 12C.

Figure 11A:
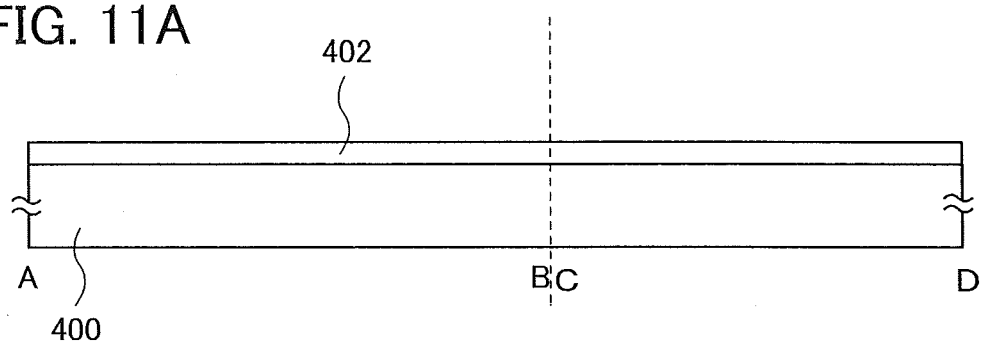
FIGS. 11A to 11C illustrate a method for manufacturing the transistor.

First, the base insulating film 402 is formed over the substrate 400 (see FIG. 11A). The above embodiments can be referred to for materials and formation methods of the substrate 400 and the base insulating film 402.

Figure 11B:
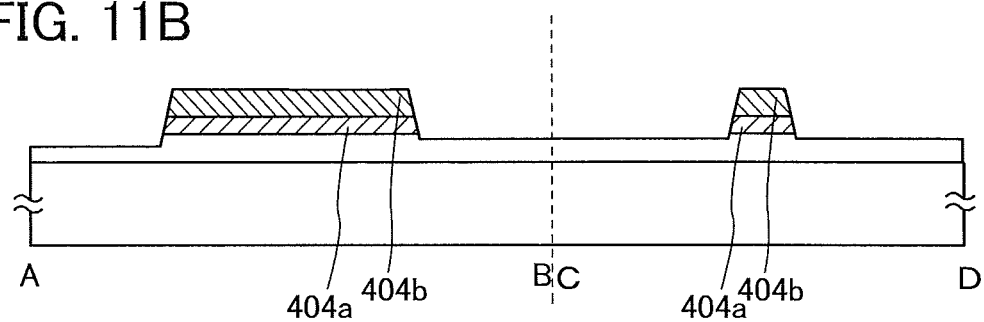

Next, the first oxide semiconductor film 404a and the second oxide semiconductor film 404b are formed over the base insulating film 402 by a sputtering method, a CVD method, an MBE method, an ALD method, or a PLD method (see FIG. 11B). At this time, as shown in FIG. 11B, the base insulating film 402 can be slightly overetched. By overetching of the base insulating film 402, the gate electrode 410 to be formed later can cover the third oxide semiconductor film 404c easily. The above embodiments can be referred to for materials and formation methods of the first oxide semiconductor film 404a and the second oxide semiconductor film 404b.

For processing the first oxide semiconductor film 404a and the second oxide semiconductor film 404b into island shapes, first, a film to be a hard mask and a resist mask are provided over the second oxide semiconductor film 404b, and the film to be a hard mask is etched to form a hard mask. Then, the resist mask is removed, and the first oxide semiconductor film 404a and the second oxide semiconductor film 404b are etched using the hard mask, which is followed by removal of the hard mask. At this time, the etching is performed with a high etching selectivity ratio so that end portions of the hard mask can be prevented from being reduced in size. Thus, the second oxide semiconductor film 404b has angular end portions.

Figure 11C:
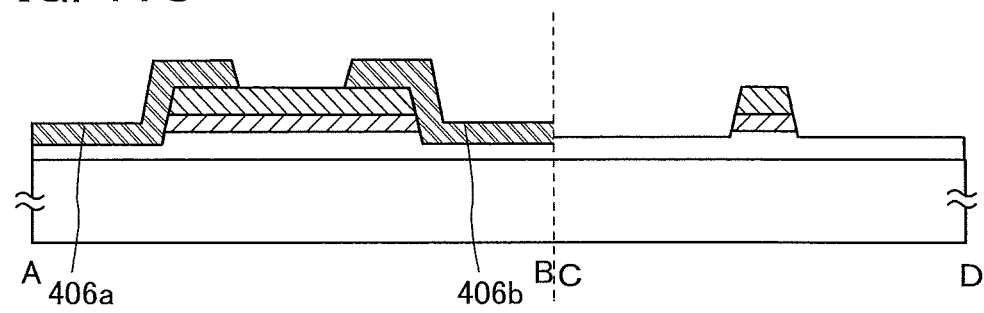

Then, the first conductive film is formed, and the first conductive film is etched so as to be divided over the second oxide semiconductor film 404b to form the source electrode 406a and the drain electrode 406b (see FIG. 11C). The above embodiments can be referred to for materials and formation methods of the source electrode 406a and the drain electrode 406b.

Figure 12A:
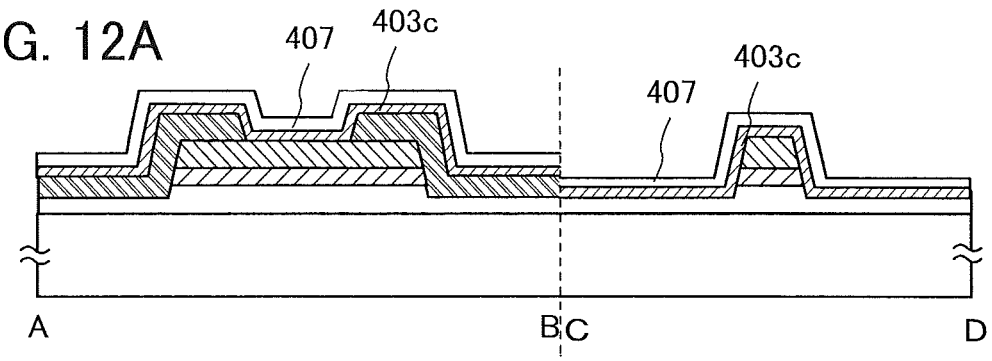
FIGS. 12A to 12C illustrate the method for manufacturing the transistor.

Next, the third oxide semiconductor film 403c is formed over the second oxide semiconductor film 404b, the source electrode 406a, and the drain electrode 406b, and the insulating film 407 which is to be the gate insulating film 408 is formed over the third oxide semiconductor film 403c (see FIG. 12A). The above embodiments can be referred to for materials and formation methods of the third oxide semiconductor film 403c and the insulating film 407.

Figure 12B:
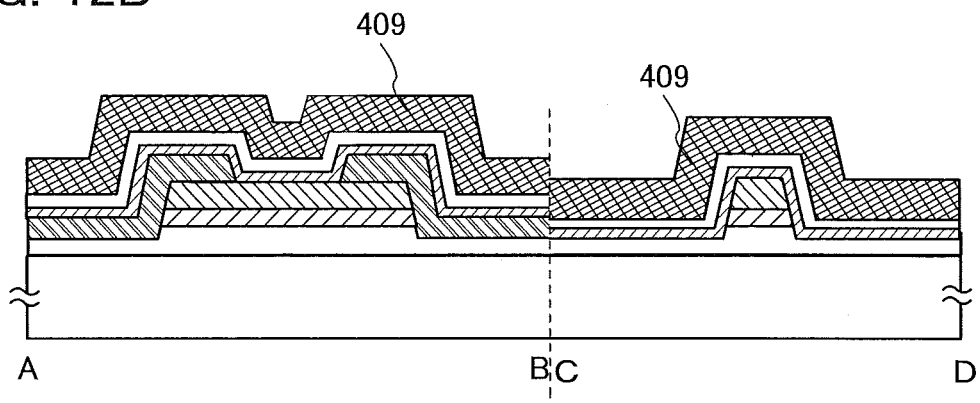

Then, the second conductive film 409 to be the gate electrode 410 is formed over the insulating film 407 (see FIG. 12B). The above embodiments can be referred to for a material and a formation method of the second conductive film 409.

Figure 12C:
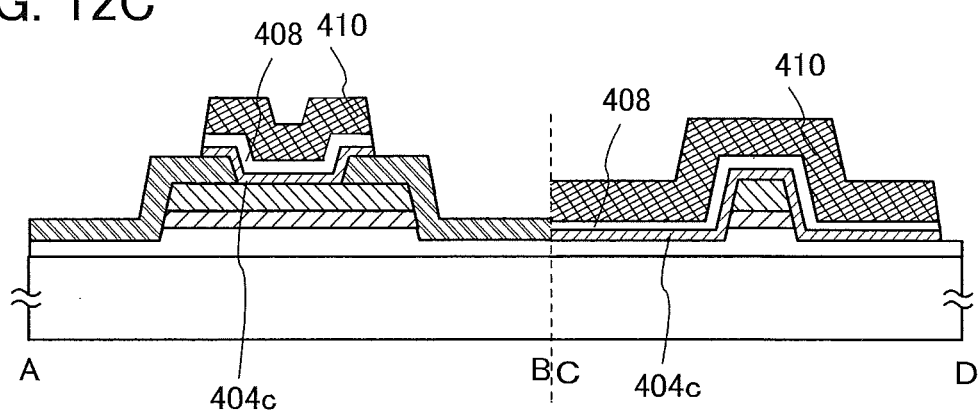

After that, the second conductive film 409 is selectively etched using a resist mask to form the gate electrode 410 (see FIG. 12C). Note that as shown in FIG. 8C, the sum of the height $h_1$ of the projected portion of the base insulating film 402 and the thickness $t_1$ of the first oxide semiconductor film 404a (i.e., $h_1+t_1$) is set larger than the sum of the thickness $t_3$ of the third oxide semiconductor film 404c and the thickness $t_{GI}$ of the gate insulating film 408 (i.e., $t_3+t_{GI}$). Thus, the gate electrode 410 is formed so as to electrically cover the second oxide semiconductor film 404b.

The perpendicular distance H is the difference between the sum of the height $h_1$ of the projected portion of the base insulating film 402 and the thickness $t_1$ of the first oxide semiconductor film 404a (i.e., $h_1+t_1$) and the sum of the thickness $t_3$ of the third oxide semiconductor film 404c and the thickness $t_{GI}$ of the gate insulating film 408 (i.e., $t_3+t_{GI}$). The perpendicular distance H is greater than or equal to 5% and less than 300% of the channel width W, preferably greater than or equal to 10% and less than 300% of the channel width W, more preferably greater than or equal to 20% and less than 250% of the channel width W, still more preferably greater than or equal to 50% and less than 200% of the channel width W, further preferably greater than or equal to 100% and less than 150% of the channel width W. In view of variation among transistors, specifically, the perpendicular distance H is preferably greater than or equal to 20 nm, more preferably greater than or equal to 30 nm, still more preferably greater than or equal to 40 nm. Since the characteristic values converge as the perpendicular distance H increases, characteristic variations due to error in the perpendicular distances H can be reduced.

A short channel effect occurs due to miniaturization, which leads to deterioration of electrical characteristics such as threshold voltage; however, with the above structure, the gate electrode 410 electrically covers the second oxide semiconductor film 404b (channel portion), whereby carriers can be easily controlled and deterioration of electrical characteristics due to the short channel effect can be suppressed.

Then, the insulating film 407 is selectively etched using the resist mask or the gate electrode 410 as a mask to form the gate insulating film 408.

Next, the third oxide semiconductor film 403c is etched using the resist mask or the gate electrode 410 as a mask to form the third oxide semiconductor film 404c.

A top end portion of the third oxide semiconductor film 404c is aligned with a bottom end portion of the gate insulating film 408. A top end portion of the gate insulating film 408 is aligned with a bottom end portion of the gate electrode 410. Although the gate insulating film 408 and the third oxide semiconductor film 404c are formed using the gate electrode 410 as a mask, the gate insulating film 408 and the third oxide semiconductor film 404c may be formed before the second conductive film 409 is formed, for example.

Next, the oxide insulating film 412 is formed over the source electrode 406a, the drain electrode 406b, and the gate electrode 410 (see FIGS. 8B and 8C). The above embodiments can be referred to for a material and a formation method of the oxide insulating film 412.

Through the above process, the transistor 550 illustrated in FIGS. 8A to 8C can be manufactured.

Note that this embodiment can be combined with any of the other embodiments in this specification as appropriate.

Embodiment 5

In this embodiment, an example of a circuit including the transistor of one embodiment of the present invention is described with reference to drawings.

Figure 13A:
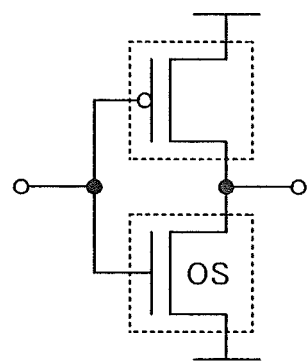
FIGS. 13A to 13D illustrate inverters including a semiconductor device of one embodiment of the present invention.
Figure 13B:
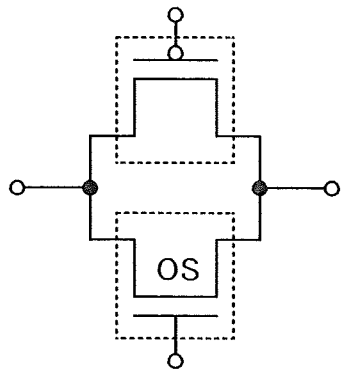
Figure 13C:
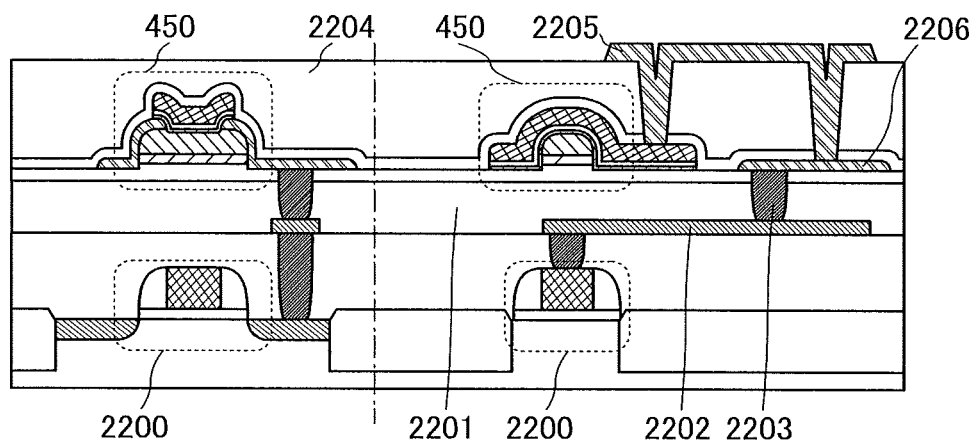
Figure 13D:
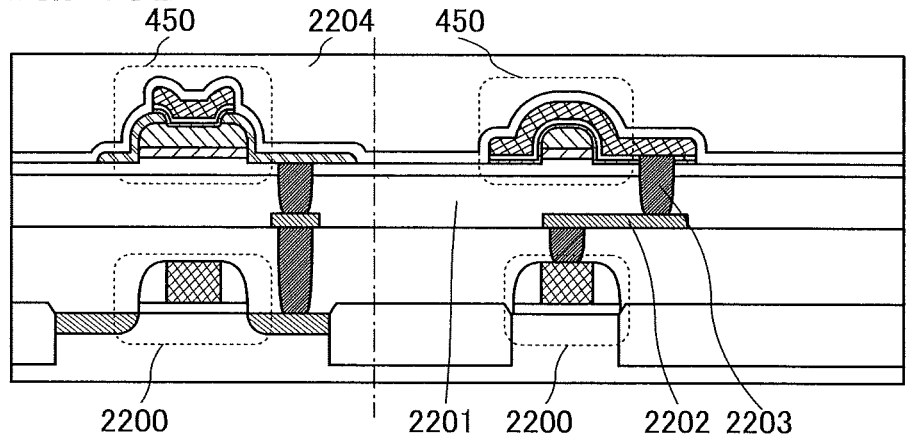

FIGS. 13A and 13B are each a circuit diagram of a semiconductor device and FIGS. 13C and 13D are each a cross-sectional view of a semiconductor device. FIGS. 13C and 13D each illustrate a cross-sectional view of the transistor 450 in a channel length direction on the left and a cross-sectional view of the transistor 450 in a channel width direction on the right. In the circuit diagrams, "OS" is written beside a transistor in order to clearly demonstrate that the transistor includes an oxide semiconductor.

The semiconductor devices illustrated in FIGS. 13C and 13D each include a transistor 2200 containing a first semiconductor material in a lower portion and a transistor containing a second semiconductor material in an upper portion. Here, an example is described in which the transistor 450 described in Embodiment 1 as an example is used as the transistor containing the second semiconductor material.

Here, the first semiconductor material and the second semiconductor material preferably have different band gaps. For example, the first semiconductor material may be a semiconductor material (e.g., silicon, germanium, silicon germanium, silicon carbide, or gallium arsenic) other than an oxide semiconductor, and the second semiconductor material may be the oxide semiconductor described in Embodiment 1. A transistor including single crystal silicon or the like as a material other than an oxide semiconductor can operate at high speed easily. In contrast, a transistor including an oxide semiconductor has the small off-state current.

Although the transistor 2200 is a p-channel transistor here, it is needless to say that an n-channel transistor can be used to form a circuit having a different configuration. The specific structure of the semiconductor device, such as a material used for the semiconductor device and the structure of the semiconductor device, does not need to be limited to that described here except for the use of the transistor described in Embodiment 1, which is formed using an oxide semiconductor.

FIGS. 13A, 13C, and 13D each illustrate a configuration example of a CMOS circuit, in which a p-channel transistor and an n-channel transistor are connected in series and gates of the transistors are connected.

The transistor using an oxide semiconductor of one embodiment of the present invention has large on-state current, which can achieve high-speed operation of a circuit.

In the structure illustrated in FIG. 13C, the transistor 450 is provided over the transistor 2200 with an insulating film 2201 positioned therebetween. A plurality of wirings 2202 is provided between the transistor 2200 and the transistor 450. Wirings and electrodes over and under the insulating film 2201 are electrically connected via plugs 2203 embedded in the insulating films. An insulating film 2204 covering the transistor 450, a wiring 2205 over the insulating film 2204, and a wiring 2206 formed by processing the same conductive film as the pair of electrodes of the transistor are provided.

By stacking two transistors in the above manner, an area occupied by a circuit can be reduced; accordingly, a plurality of circuits can be arranged in high density.

In FIG. 13C, one of the source and the drain of the transistor 450 is electrically connected to one of a source and a drain of the transistor 2200 via the wiring 2202 and the plug 2203. The gate of the transistor 450 is electrically connected to a gate of the transistor 2200 via the wiring 2205, the wiring 2206, the plug 2203, the wiring 2202, and the like.

In the configuration illustrated in FIG. 13D, an opening portion in which the plug 2203 is embedded is provided in a gate insulating layer of the transistor 450, and the gate of the transistor 450 is in contact with the plug 2203. Such a configuration makes it possible to achieve the integration of the circuit easily and to reduce the lengths and the number of wirings and plugs to be smaller than those in the configuration illustrated in FIG. 13C; thus, the circuit can operate at higher speed.

Note that when a connection between the electrodes of the transistor 450 and the transistor 2200 is changed from that in the configuration illustrated in FIG. 13C or FIG. 13D, a variety of circuits can be formed. For example, a circuit having a configuration in which a source and a drain of a transistor are connected to those of another transistor as illustrated in FIG. 13B can operate as what is called an analog switch.

A semiconductor device having an image sensor function for reading data of an object can be fabricated with the use of the transistor described in any of the above embodiments.

Figure 14:
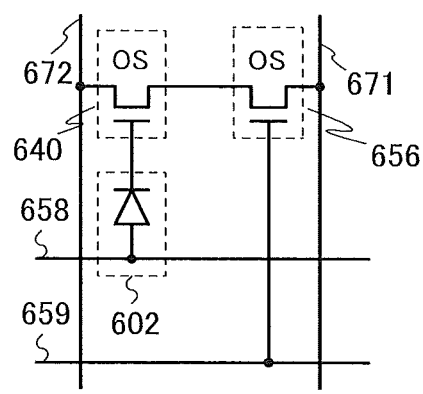
FIG. 14 is an equivalent circuit diagram illustrating an example of a semiconductor device.

FIG. 14 illustrates an example of an equivalent circuit of a semiconductor device having an image sensor function.

In a photodiode 602, one electrode is electrically connected to a photodiode reset signal line 658, and the other electrode is electrically connected to a gate of a transistor 640. One of a source and a drain of the transistor 640 is electrically connected to a photosensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photosensor output signal line 671.

As the photodiode 602, for example, a pin photodiode in which a semiconductor layer having p-type conductivity, a high-resistance semiconductor layer (semiconductor layer having i-type conductivity), and a semiconductor layer having n-type conductivity are stacked can be used.

With detection of light that enters the photodiode 602, data of an object can be read. Note that a light source such as a backlight can be used at the time of reading data of an object.

As each of the transistor 640 and the transistor 656, the transistor in which a channel is formed in an oxide semiconductor, which is described in any of the above embodiments, can be used. In FIG. 14, "OS" is written beside the transistor 640 and the transistor 656 so that the transistors 640 and 656 can be identified as transistors including an oxide semiconductor.

It is preferable that each of the transistor 640 and the transistor 656 be one of the transistors described in the above embodiments, in which the oxide semiconductor film is electrically covered with the gate electrode. When the oxide semiconductor film has round and curved end portions in the transistor, coverage with a film formed over the oxide semiconductor film can be improved. In addition, electric field concentration which might occur at end portions of the source electrode and the drain electrode can be reduced, which can suppress deterioration of the transistor. Therefore, variation in the electric characteristics of the transistor 640 and the transistor 656 is suppressed, and the transistor 640 and the transistor 656 are electrically stable. The semiconductor device having an image sensor function illustrated in FIG. 14 can have high reliability by including the transistors.

This embodiment can be combined as appropriate with any of the other embodiments in this specification.

Embodiment 6

In this embodiment, an example of a semiconductor device (storage device) which includes the transistor of one embodiment of the present invention, which can retain stored data even when not powered, and which has an unlimited number of write cycles is described with reference to drawings.

Figure 15:
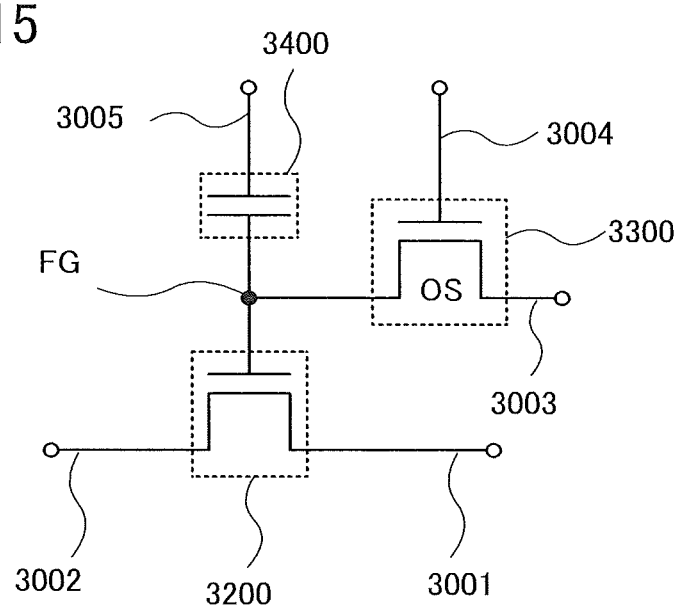
FIG. 15 is a circuit diagram of a semiconductor device according to an embodiment.

FIG. 15 is a circuit diagram of the semiconductor device.

The semiconductor device illustrated in FIG. 15 includes a transistor 3200 including a first semiconductor material, a transistor 3300 including a second semiconductor material, and a capacitor 3400. Note that the transistor described in Embodiment 1 can be used as the transistor 3300.

The transistor 3300 is a transistor in which a channel is formed in a semiconductor layer including an oxide semiconductor. Since the off-state current of the transistor 3300 is small, stored data can be retained for a long period owing to such a transistor. In other words, refresh operation becomes unnecessary or the frequency of the refresh operation in a semiconductor storage device can be extremely low, which leads to a sufficient reduction in power consumption.

In FIG. 15, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 15 utilizes a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is retained (retaining).

Since the off-state current of the transistor 3300 is extremely small, the charge of the gate electrode of the transistor 3200 is retained for a long time.

Next, reading of data is described. An appropriate potential (reading potential) is supplied to the fifth wiring 3005 while a predetermined potential (constant potential) is supplied to the first wiring 3001, whereby the potential of the second wiring 3002 varies depending on the amount of charge retained in the gate electrode of the transistor 3200. This is because in general, in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied in writing and the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Thus, the data retained in the gate electrode can be read by determining the potential of the second wiring 3002.

Note that in the case where memory cells are arrayed, it is necessary that only data of a desired memory cell be able to be read. In the case where data is not read, the fifth wiring 3005 may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

When including a transistor having a channel formation region formed using an oxide semiconductor and having an extremely small off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film does not occur. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

As described above, a miniaturized and highly integrated semiconductor device having high electrical characteristics can be provided.

Embodiment 7

In this embodiment, a CPU in which at least the transistor described in any of the above embodiments can be used and the storage device described in the above embodiment is included is described.

Figure 16:
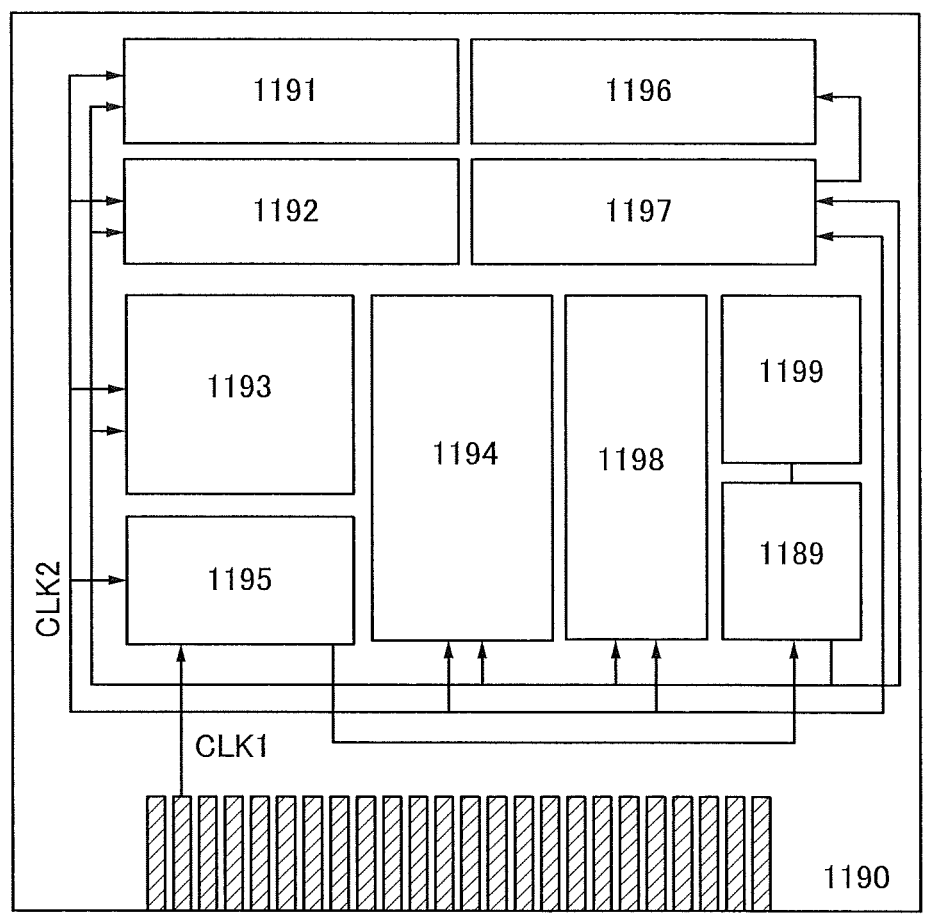
FIG. 16 is a block diagram of a semiconductor device according to an embodiment.

FIG. 16 is a block diagram illustrating a configuration example of a CPU at least partly including the transistor described in Embodiment 1.

The CPU illustrated in FIG. 16 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (Bus I/F), a rewritable ROM 1199, and an ROM interface 1189 (ROM I/F). A semiconductor substrate, an SOI substrate, a glass substrate, or the like is used as the substrate 1190. The ROM 1199 and the ROM interface 1189 may be provided over a separate chip. Needless to say, the CPU in FIG. 16 is just an example in which the configuration has been simplified, and an actual CPU may have various configurations depending on the application. For example, the CPU may have the following configuration: a structure including the CPU illustrated in FIG. 16 or an arithmetic circuit is considered as one core; a plurality of the cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 16, a memory cell is provided in the register 1196. As the memory cell of the register 1196, the transistor described in the above embodiment can be used.

In the CPU illustrated in FIG. 16, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 17:
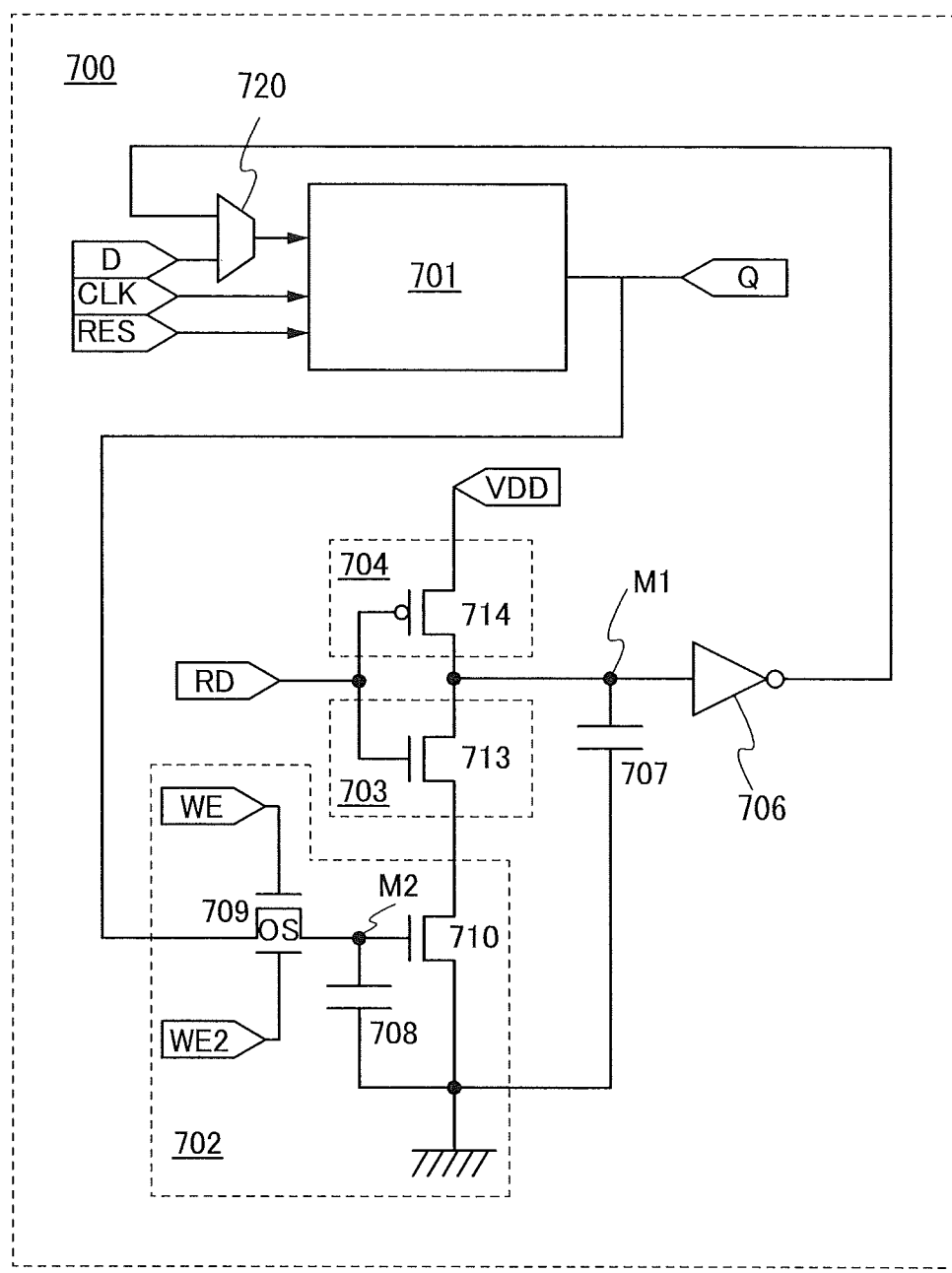
FIG. 17 is a circuit diagram illustrating a memory device according to an embodiment.

FIG. 17 is an example of a circuit diagram of a storage element that can be used as the register 1196. A memory element 700 includes a circuit 701 in which stored data is volatile when power supply is stopped, a circuit 702 in which stored data is nonvolatile when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 700 may further include another element such as a diode, a resistor, or an inductor, as needed.

Here, the storage device described in the above embodiment can be used as the circuit 702. When supply of the power supply voltage to the memory element 700 is stopped, a ground potential (0 V) or a potential at which the transistor 709 in the circuit 702 is turned off continues to be input to a gate of the transistor 709. For example, the gate of the transistor 709 is grounded through a load such as a resistor.

An example in which the switch 703 is a transistor 713 having one conductivity type (e.g., an n-channel transistor) and the switch 704 is a transistor 714 having a conductivity type opposite to the one conductivity type (e.g., a p-channel transistor) is described. Here, a first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line which can supply a low potential power source (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a line which can supply a power supply potential VDD. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the line which can supply a low potential power source (e.g., a GND line). The other of the pair of electrodes of the capacitor 708 can be supplied with a constant potential. For example, the other of the pair of electrodes of the capacitor 708 can be supplied with the low power supply potential (e.g., GND) or the high power supply potential (e.g., VDD). The other of the pair of electrodes of the capacitor 708 is electrically connected to the line which can supply a low potential power source (e.g., a GND line).

The capacitor 707 and the capacitor 708 are not necessarily provided as long as the parasitic capacitance of the transistor, the wiring, or the like is actively utilized.

A control signal WE is input to the first gate (first gate electrode) of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 701 is input to the other of the source and the drain of the transistor 709. FIG. 17 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 17, a signal output from the second terminal of the switch 703 (the other of the source and the drain of the transistor 713) is input to the circuit 701 through the logic element 706 and the circuit 720; however, this embodiment is not limited thereto. The signal output from the second terminal of the switch 703 (the other of the source and the drain of the transistor 713) may be input to the circuit 701 without its logic value being inverted. For example, in the case where a node in which a signal obtained by inversion of the logic value of a signal input from the input terminal is retained is provided in the circuit 701, the signal output from the second terminal of the switch 703 (the other of the source and the drain of the transistor 713) can be input to the node.

As the transistor 709 in FIG. 17, any of the transistors described in Embodiment 1 can be used. The transistor 709 preferably includes a second gate (second gate electrode). The control signal WE can be input to the first gate and a control signal WE2 can be input to the second gate. The control signal WE2 is a signal having a constant potential. As the constant potential, for example, a ground potential GND or a potential lower than a source potential of the transistor 709 is selected. The control signal WE2 is a potential signal for controlling the threshold voltage of the transistor 709, and Icut (drain current when gate voltage is 0 V) of the transistor 709 can be further reduced. Note that as the transistor 709, a transistor without a second gate can alternatively be used.

Further, in FIG. 17, the transistors included in the memory element 700 except for the transistor 709 can each be a transistor in which a channel is formed in a layer formed using a semiconductor other than an oxide semiconductor or in the substrate 1190. For example, a transistor in which a channel is formed in a silicon layer or a silicon substrate can be used. Alternatively, a transistor in which a channel is formed in an oxide semiconductor film can be used for all the transistors used for the memory element 700. Further alternatively, in the memory element 700, a transistor in which a channel is formed in an oxide semiconductor film can be included besides the transistor 709, and a transistor in which a channel is formed in a layer formed using a semiconductor other than an oxide semiconductor or in the substrate 1190 can be used for the rest of the transistors.

As the circuit 701 in FIG. 17, for example, a flip-flop circuit can be used. As the logic element 706, for example, an inverter, a clocked inverter, or the like can be used.

The semiconductor device of one embodiment of the present invention can, in a period during which the memory element 700 is not supplied with the power supply voltage, retain data stored in the circuit 701 by the capacitor 708 which is provided in the circuit 702.

The off-state current of a transistor in which a channel is formed in an oxide semiconductor film is extremely small. For example, the off-state current of a transistor in which a channel is formed in an oxide semiconductor film is significantly smaller than that of a transistor in which a channel is formed in silicon having crystallinity. Thus, when such a transistor including an oxide semiconductor is used for the transistor 709, a signal held in the capacitor 708 is retained for a long time also in a period during which the power supply voltage is not supplied to the memory element 700. The memory element 700 can accordingly retain the stored content (data) also in a period during which the supply of the power supply voltage is stopped.

Since the switch 703 and the switch 704 are provided, the memory element performs pre-charge operation; thus, the time required for the circuit 701 to retain original data again after the supply of the power supply voltage is restarted can be shortened.

In the circuit 702, a signal retained by the capacitor 708 is input to the gate of the transistor 710. Therefore, after supply of the power supply voltage to the memory element 700 is restarted, the signal retained by the capacitor 708 can be converted into the one corresponding to the state (the on state or the off state) of the transistor 710 to be read from the circuit 702. Consequently, an original signal can be accurately read even when a potential corresponding to the signal retained by the capacitor 708 fluctuates to some degree.

By applying the above-described memory element 700 to a storage device such as a register or a cache memory included in a processor, data in the storage device can be prevented from being lost owing to the stop of the supply of the power supply voltage. Further, shortly after the supply of the power supply voltage is restarted, the storage device can be returned to the same state as that before the power supply is stopped. Thus; the power supply can be stopped even for a short time in the processor or one or a plurality of logic circuits included in the processor. Accordingly, power consumption can be suppressed.

Although an example in which the storage element 700 is used in a CPU is described in this embodiment, the storage element 700 can also be used in a digital signal processor (DSP), a custom LSI, an LSI such as a programmable logic device (PLD), and a radio frequency identification (RF-ID).

This embodiment can be combined as appropriate with any of the other embodiments in this specification.

Embodiment 8

The semiconductor device of one embodiment of the present invention can be used for display devices, personal computers, and image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 18A to 18F illustrate specific examples of such electronic devices.

Figure 18A:
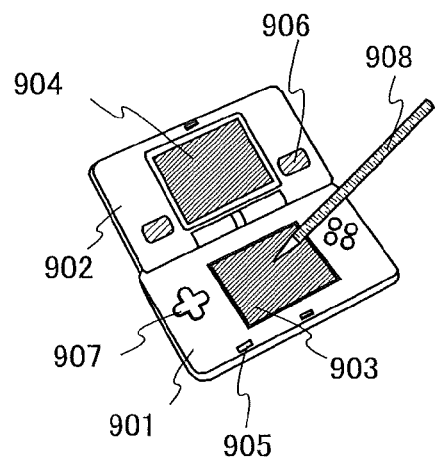
FIGS. 18A to 18F each illustrate an electronic device according to an embodiment.

FIG. 18A illustrates a portable game console including a housing 901, a housing 902, a display portion 903, a display portion 904, a microphone 905, a speaker 906, an operation key 907, a stylus 908, and the like. Although the portable game console in FIG. 18A has the two display portions 903 and 904, the number of display portions included in a portable game console is not limited to this.

Figure 18B:
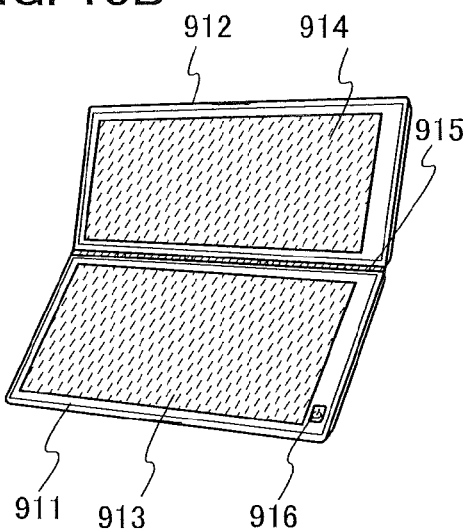

FIG. 18B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel area of a display device.

Figure 18C:
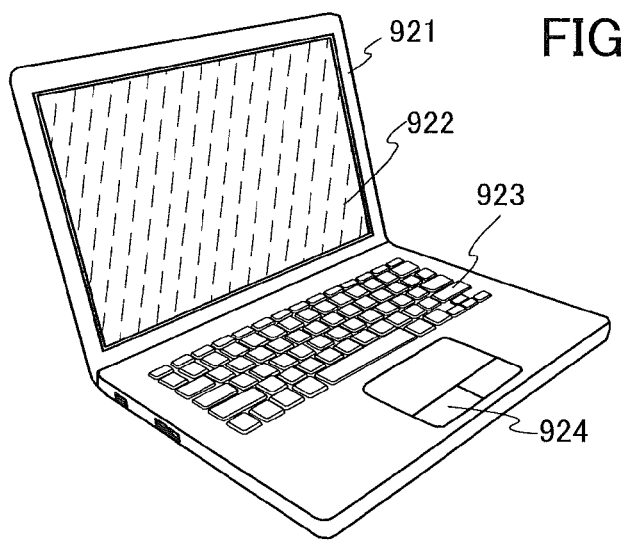

FIG. 18C illustrates a notebook personal computer, which includes a housing 921, a display portion 922, a keyboard 923, a pointing device 924, and the like.

Figure 18D:
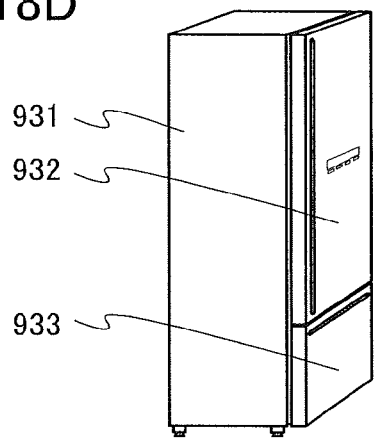

FIG. 18D illustrates an electric refrigerator-freezer including a housing 931, a door for a refrigerator 932, a door for a freezer 933, and the like.

Figure 18E:
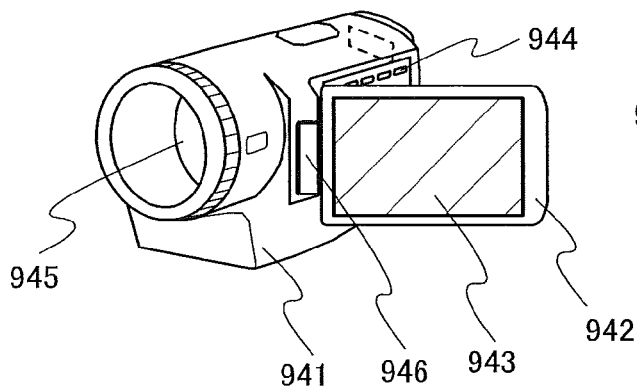

FIG. 18E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. An image on the display portion 943 may be switched depending on the angle at the joint 946 between the first housing 941 and the second housing 942.

Figure 18F:
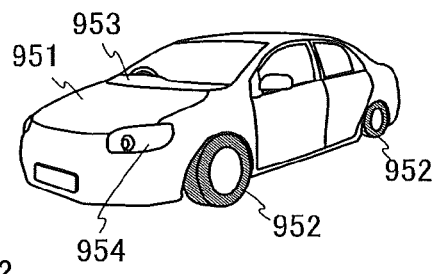

FIG. 18F illustrates a passenger car including a car body 951, wheels 952, a dashboard 953, lights 954, and the like.

This embodiment can be combined with any of the other embodiments disclosed in this specification as appropriate.

Example

In this example, an effect of a length of a portion of a side surface of a gate electrode which is extended beyond a bottom surface of an oxide semiconductor film where a channel is formed (that is, the perpendicular distance H in the above embodiments and referred to as a length of an eaves in Example) on characteristics was calculated for evaluation.

First, a structure of a transistor is described.

Figure 19A:
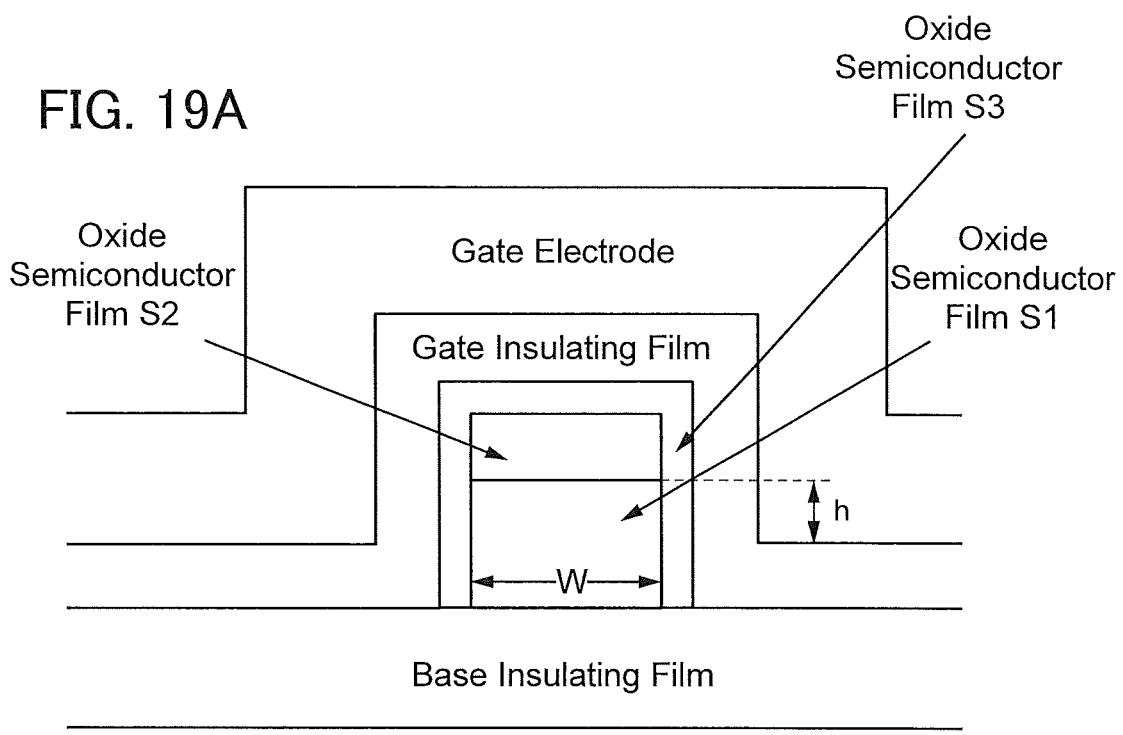
FIGS. 19A and 19B are cross-sectional views of a transistor.
Figure 19B:
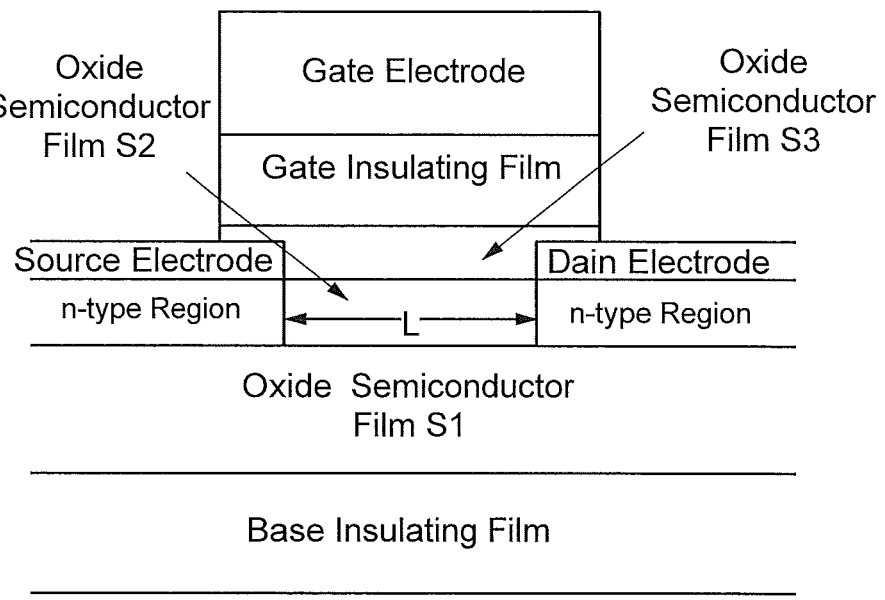

FIG. 19A is a cross-sectional view of a transistor in a channel width direction. In FIG. 19A, W represents a channel width. FIG. 19B is a cross-sectional view of the transistor in a channel length direction. In FIG. 19B, L represents a channel length.

Next, calculation conditions are described.

The calculation was performed under conditions shown in Table 1, using Sentaurus Device (produced by Synopsys, Inc.).

TABLE 1

| | | |
|---|---|---|
| Size | Channel length L | 40 nm |
| | Channel width W | 40 nm |
| Gate | Dielectric constant | 4.1 |
| Insulating | Thickness over S3 | 10 nm |
| Film | Thickness on a side surface of S3 | 8 nm |
| Oxide | Composition ratio | IGZO(132) |
| Semiconductor | Electron affinity | 4.4 eV |
| Film (S3) | Band Gap | 3.6 eV |
| | Dielectric constant | 15 |

TABLE 1-continued

| | | |
|---|---|---|
| | Donor density | 6.60E−9 cm$^{-3}$ |
| | Electron mobility | 0.1 cm$^2$/Vs |
| | Hole mobility | 0.01 cm$^2$/Vs |
| | Effective Density of State of Conduction Band | 5.00E+18 cm$^{-3}$ |
| | Effective Density of State of Valence Band | 5.00E+18 cm$^{-3}$ |
| | Thickness over S2 | 5 nm |
| | Thickness on a side surface of S2 | 4 nm |
| Oxide Semiconductor Film (S2) | Composition ratio | IGZO(111) |
| | Electron affinity | 4.6 eV |
| | Band Gap | 3.2 eV |
| | Dielectric constant | 15 |
| | Donor density in channel portion | 6.60E−9 cm$^{-3}$ |
| | Donor density under source electrode and drain electrode | 5.00E+18 cm$^{-3}$ |
| | Electron mobility | 15 cm$^2$/Vs |
| | Hole mobility | 0.01 cm$^2$/Vs |
| | Effective Density of State of Conduction Band | 5.00E+18 cm$^{-3}$ |
| | Effective Density of State of Valence Band | 5.00E+18 cm$^{-3}$ |
| | Thickness | 15 nm |
| Oxide Semiconductor Film (S1) | Composition ratio | IGZO(132) |
| | Electron affinity | 4.4 eV |
| | Band Gap | 3.6 eV |
| | Dielectric constant | 15 |
| | Donor density | 6.60E−9 cm$^{-3}$ |
| | Electron mobility | 0.1 cm$^2$/Vs |
| | Hole mobility | 0.01 cm$^2$/Vs |
| | Effective Density of State of Conduction Band | 5.00E+18 cm$^{-3}$ |
| | Effective Density of State of Valence Band | 5.00E+18 cm$^{-3}$ |
| | Thickness | variable [nm] |
| Base insulating film | Dielectric constant | 4.1 |
| | Thickness | 400 nm |
| Eaves length | | 0-55 nm |
| Gate Electrode | Work function | 5 eV |
| Source/Drain | Work function | 4.6 eV |

IGZO(111): formed using an oxide target with atomic ratio of In:Ga:Zn = 1:1:1
IGZO(132): formed using an oxide target with atomic ratio of In:Ga:Zn = 1:3:2

Figure 20:
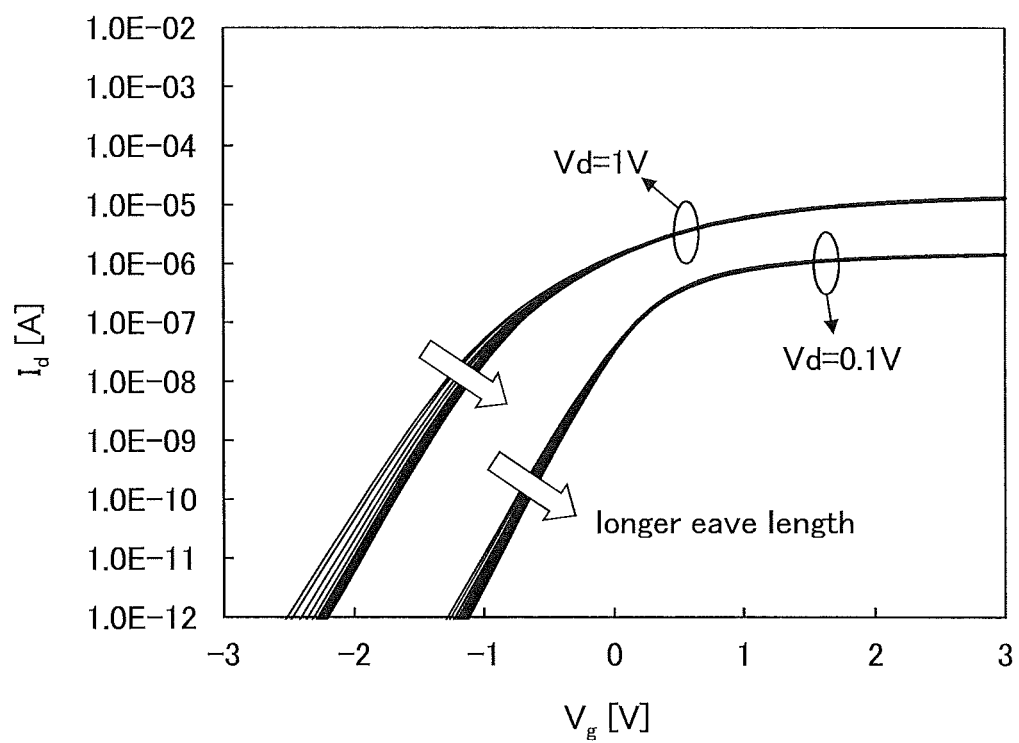
FIG. 20 shows electrical characteristics of transistors.

FIG. 20 shows $I_d$-$V_g$ characteristics when the drain voltage ($V_d$: [V]) was 0.1 V or 1 V. The thickness of an oxide semiconductor film S1 was varied so that the length of the eaves was set to 0 nm to 55 nm by 5 nm (12 conditions). Arrows in FIG. 20 indicate an increase in the length of the eaves.

According to FIG. 20, the S value and the shift value are more significantly improved as the length of the eaves is lengthened. Note that the shift value is a value of the gate voltage at the time when the drain current is 1.0×10$^{-12}$ A.

FIGS. 21A and 21B and FIGS. 22A and 22B show characteristic values of the transistors, which were obtained from the $I_d$-$V_g$ characteristics in FIG. 20.

Figure 21A:
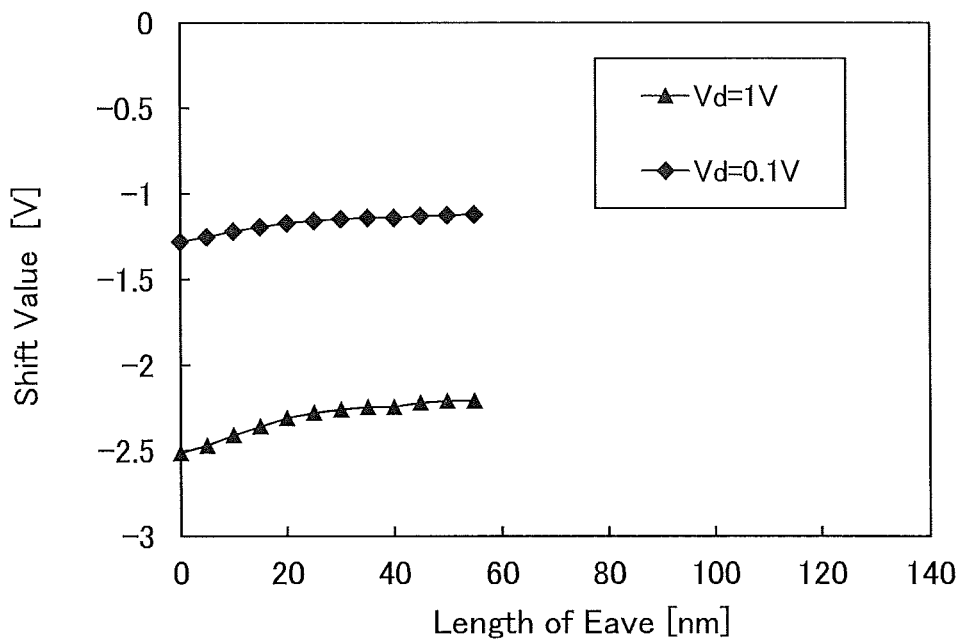
FIGS. 21A and 21B show electrical characteristics of transistors.
Figure 21B:
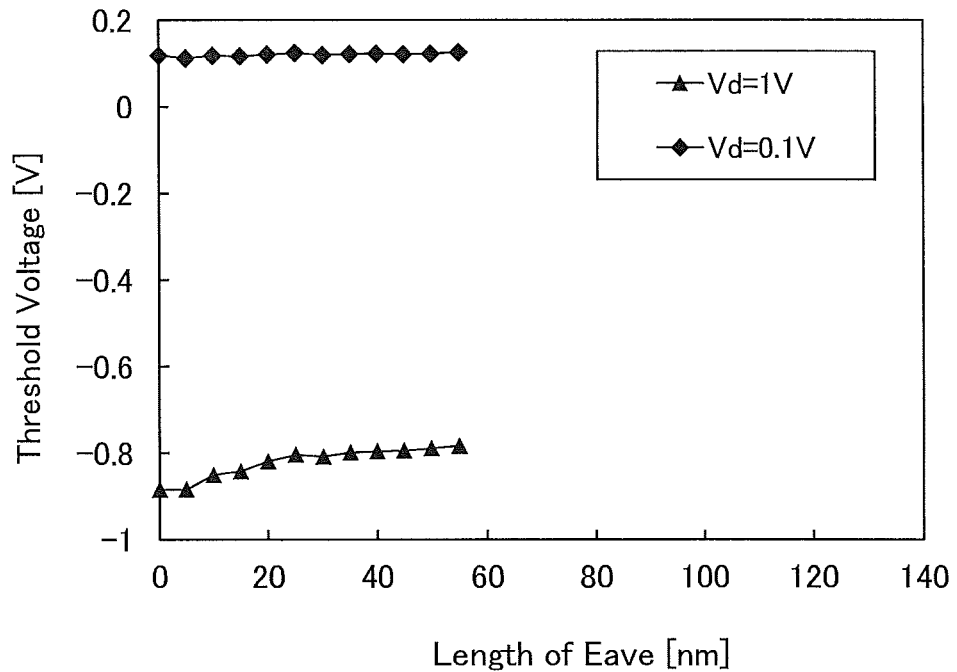
Figure 22A:
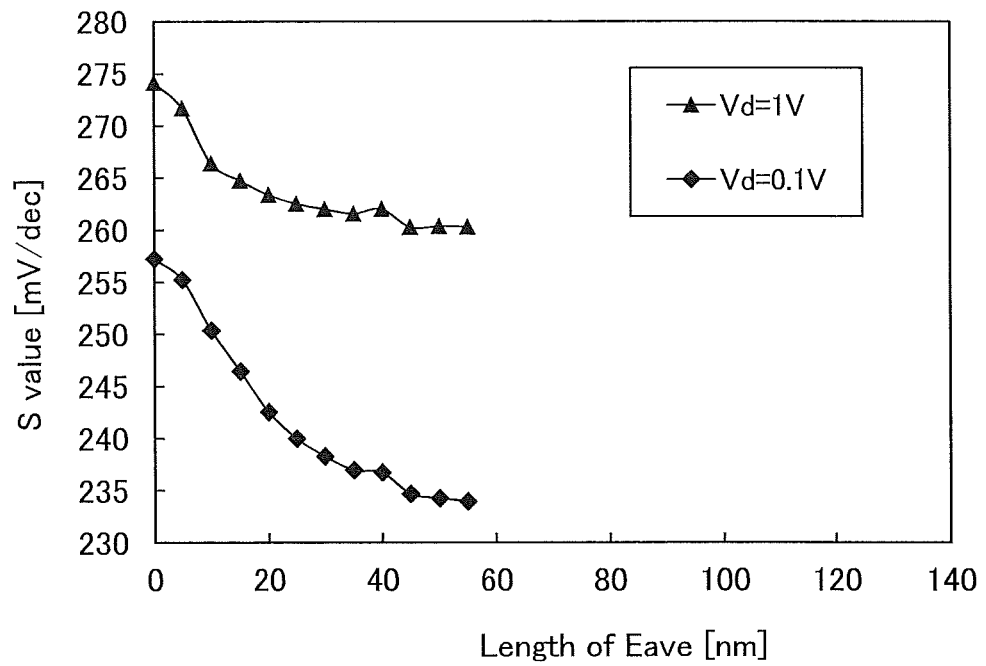
FIGS. 22A and 22B show electrical characteristics of transistors.
Figure 22B:
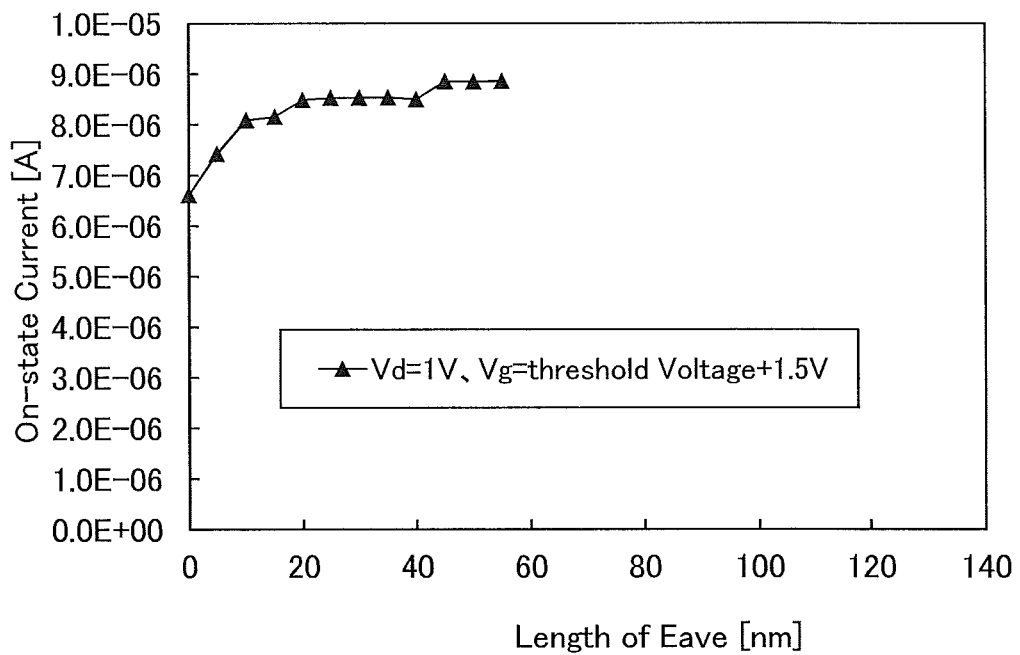

FIG. 21A is a graph showing a relationship between the length of the eaves and the shift value. FIG. 21B is a graph showing a relationship between the length of the eaves and the threshold voltage. FIG. 22A is a graph showing a relationship between the length of the eaves and the S value. FIG. 22B is a graph showing a relationship between the length of the eaves and the on-state current.

FIGS. 21A and 21B and FIGS. 22A and 22B show that the oxide semiconductor film S2 is sufficiently affected by an electric field of the side surface of the gate electrode with a length of the eaves of at least approximately 20 nm and that the characteristic values of the transistors are favorable. It is also shown that, in view of variation, the length of the eaves is preferably 30 nm or longer, more preferably 40 nm or longer so that the characteristic values converge.

Calculation was performed on a transistor which did not include the oxide semiconductor film S1 and the oxide semiconductor film S3 and included a projected base insulating film for evaluation.

First, a structure of a transistor is described.

Figure 23A:
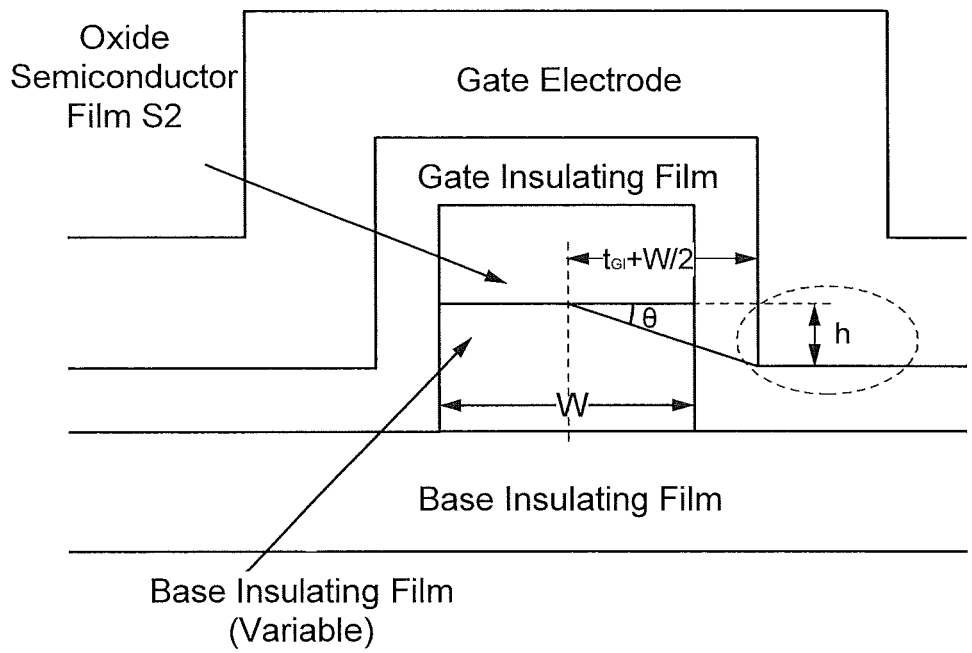
FIGS. 23A and 23B are cross-sectional views of a transistor.
Figure 23B:
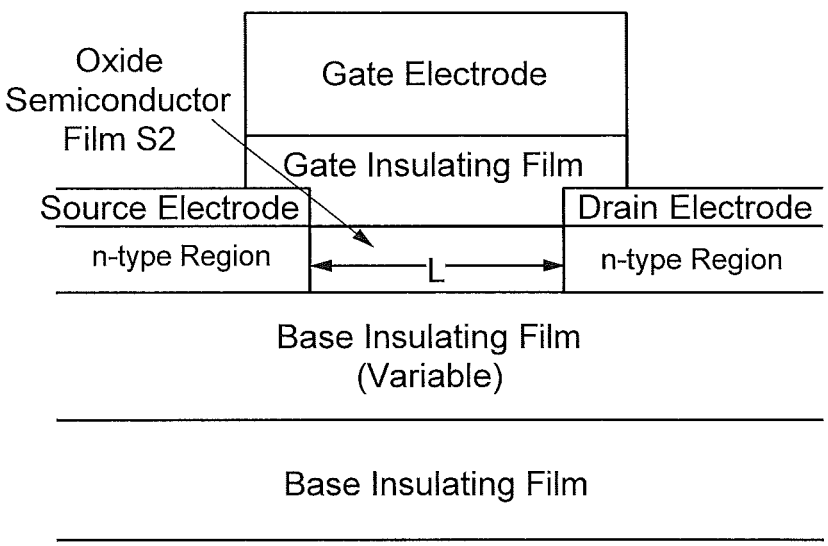

FIG. 23A is a cross-sectional view of a transistor in a channel width direction. In FIG. 23A, W represents a channel width. FIG. 23B is a cross-sectional view of the transistor in a channel length direction. In FIG. 23B, L represents a channel length.

Next, calculation conditions are described.

The calculation was performed under conditions shown in Table 2, using Sentaurus Device (produced by Synopsys, Inc.).

TABLE 2

| | | |
|---|---|---|
| Size | Channel length L | 40 nm |
| | Channel width W | 40 nm |
| Gate Insulating Film | Dielectric constant | 4.1 |
| | Thickness | 10 nm |
| Oxide Semiconductor Film (S2) | Composition ratio | IGZO(111) |
| | Electron affinity | 4.6 eV |
| | Band Gap | 3.2 eV |
| | Dielectric constant | 15 |
| | Donor density in channel portion | 6.60E−9 cm$^{-3}$ |
| | Donor density under source electrode and drain electrode | 5.00E+18 cm$^{-3}$ |
| | Electron mobility | 15 cm$^2$/Vs |
| | Hole mobility | 0.01 cm$^2$/Vs |
| | Effective Density of State of Conduction Band | 5.00E+18 cm$^{-3}$ |
| | Effective Density of State of Valence Band | 5.00E+18 cm$^{-3}$ |
| | Thickness | 15 nm |
| Base insulating film (variable) | Dielectric constant | 4.1 |
| | Thickness | variable [nm] |
| Base insulating film | Dielectric constant | 4.1 |
| | Thickness | 400 nm |
| Eaves length | | 0-140 nm |
| Gate Electrode | Work function | 5 eV |
| Source/Drain | Work function | 4.6 eV |

IGZO(111): formed using an oxide target with atomic ratio of In:Ga:Zn = 1:1:1

Figure 24:
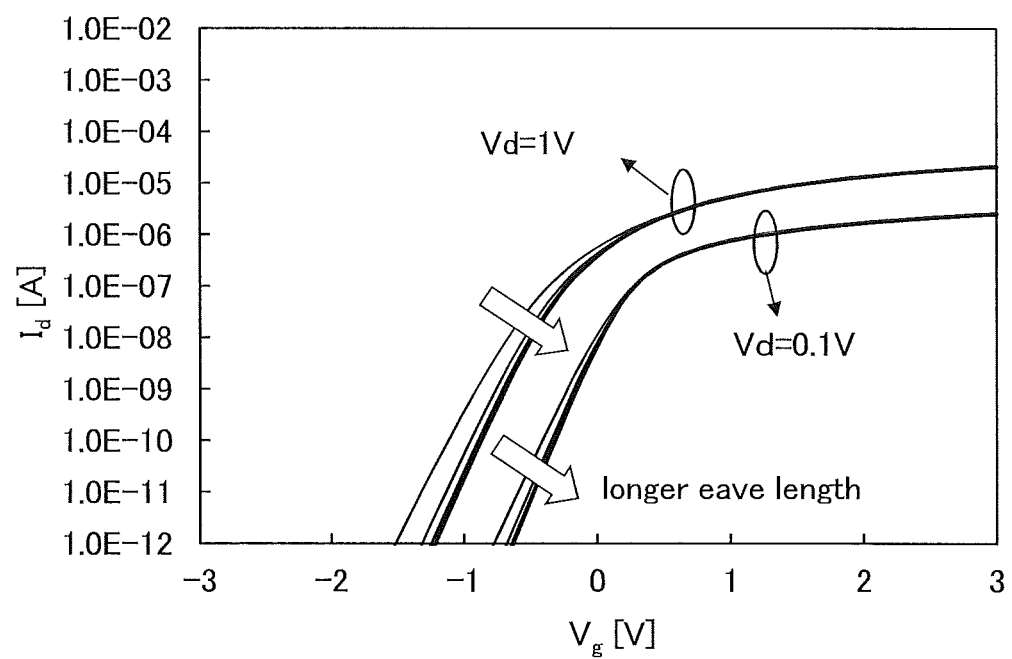
FIG. 24 shows electrical characteristics of transistors.

FIG. 24 shows $I_d$-$V_g$ characteristics when the drain voltage ($V_d$: [V]) was 0.1 V or 1 V. The thickness of a base insulating film (variable) was varied so that the length of the eaves was set to 0 nm to 140 nm by 20 nm (8 conditions). Arrows in FIG. 24 indicate an increase in the length of the eaves.

According to FIG. 24, the S value and the shift value are more significantly improved as the length of the eaves is lengthened.

FIGS. 25A and 25B and FIGS. 26A and 26B show characteristic values of the transistors, which were obtained from the $I_d$-$V_g$ characteristics in FIG. 24.

Figure 25A:
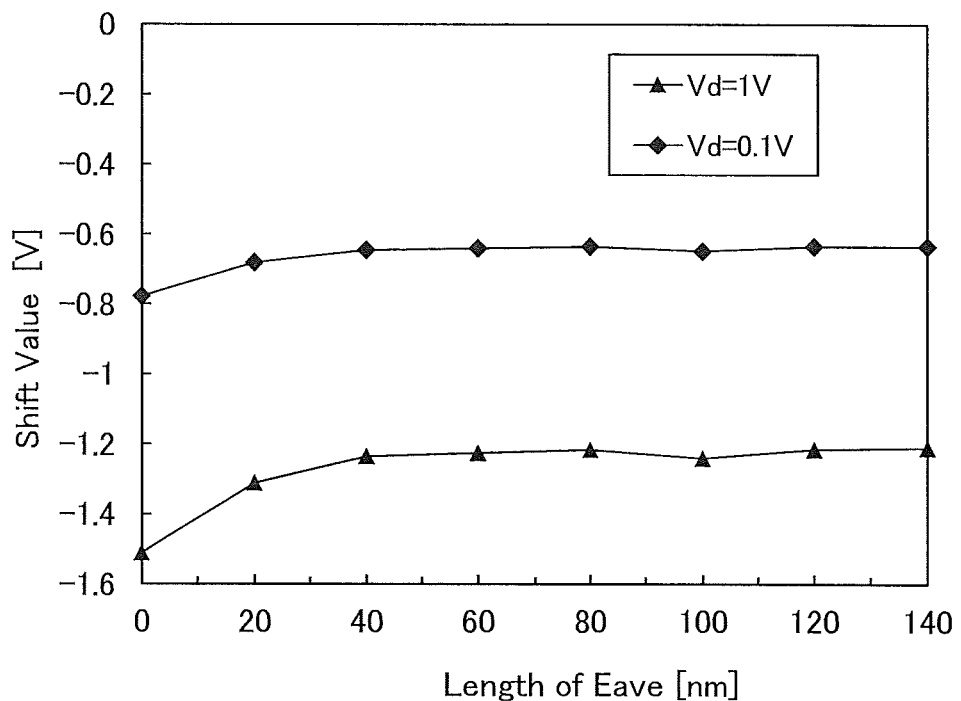
FIGS. 25A and 25B show electrical characteristics of transistors.
Figure 25B:
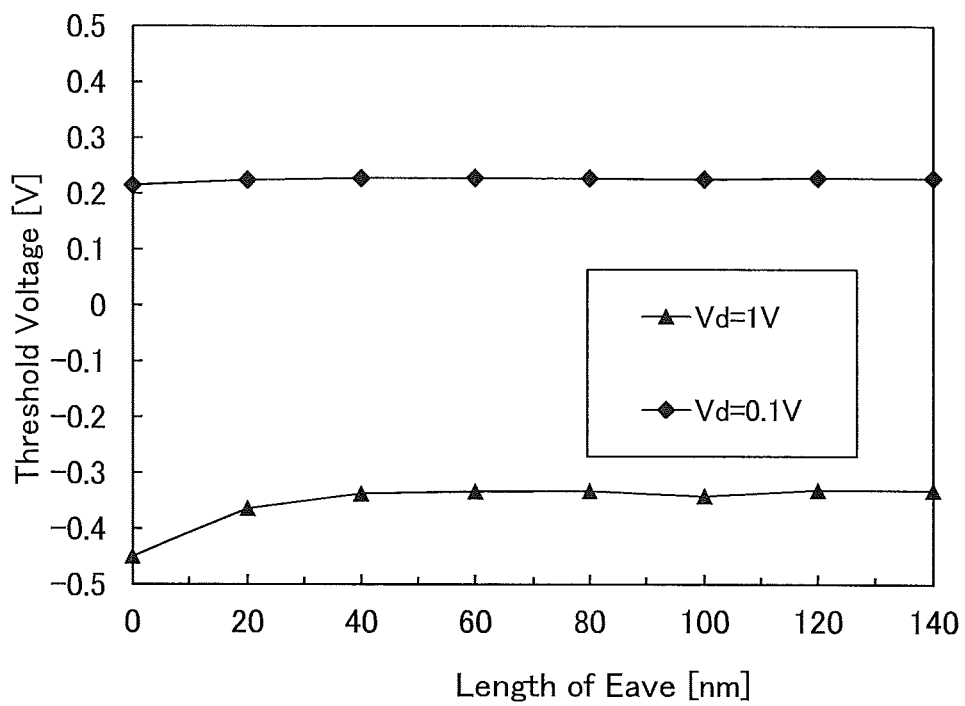
Figure 26A:
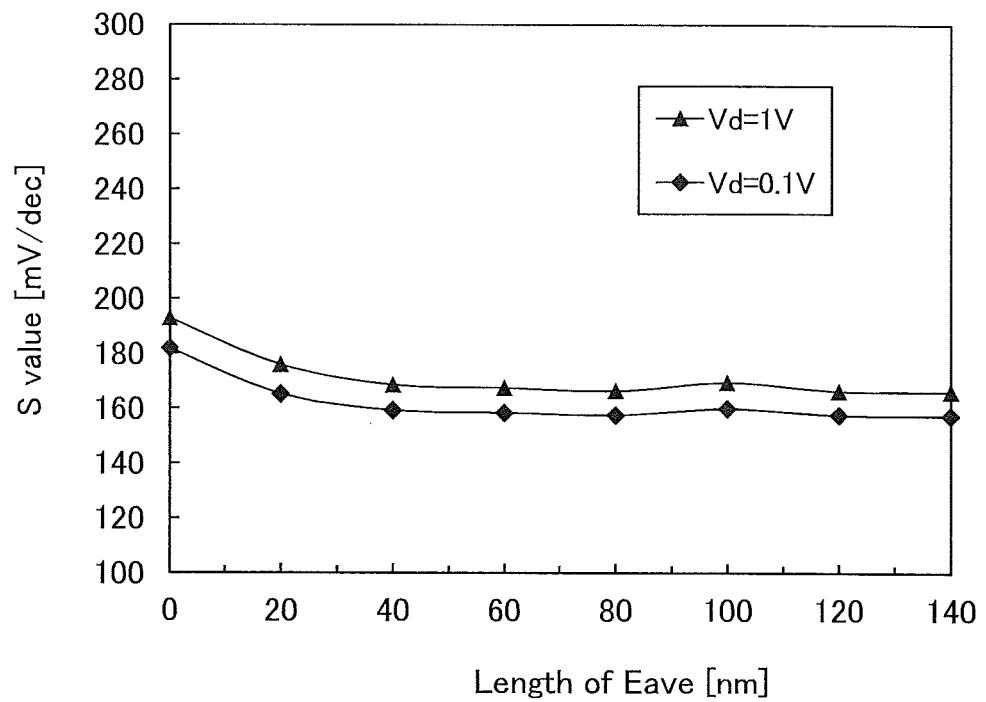
FIGS. 26A and 26B show electrical characteristics of transistors.
Figure 26B:
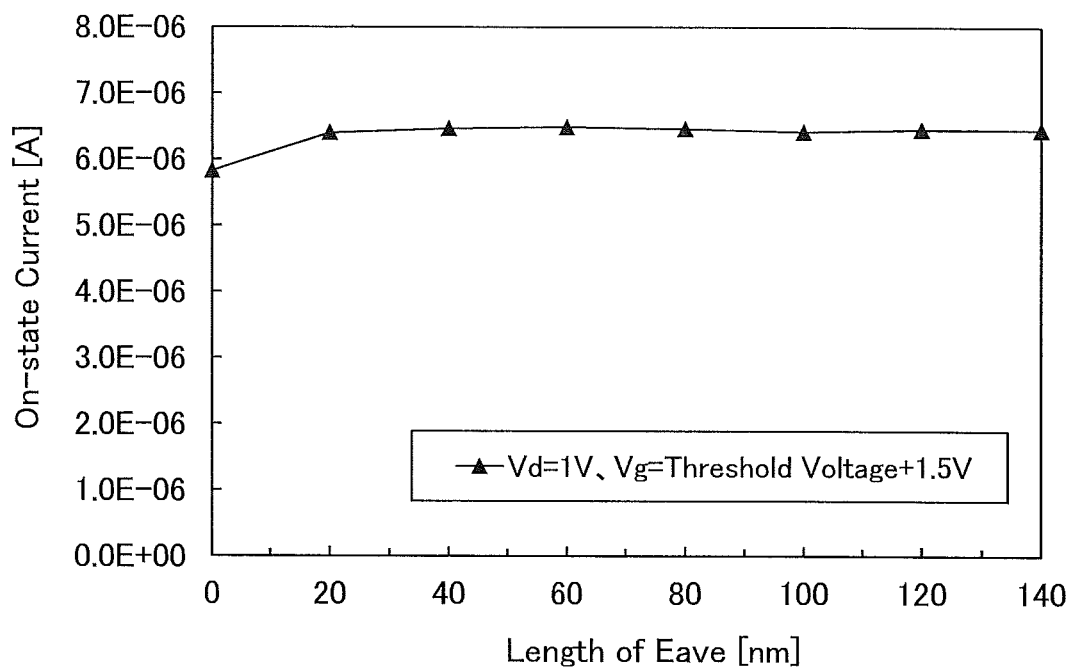

FIG. 25A is a graph showing a relationship between the length of the eaves and the shift value. FIG. 25B is a graph showing a relationship between the length of the eaves and the threshold voltage. FIG. 26A is a graph showing a relationship between the length of the eaves and the S value. FIG. 26B is a graph showing a relationship between the length of the eaves and the on-state current.

FIGS. 25A and 25B and FIGS. 26A and 26B show that the oxide semiconductor film S2 is sufficiently affected by an electric field of the side surface of the gate electrode with a length of the eaves of at least approximately 20 nm and that the characteristic values of the transistors are favorable. It is also shown that, in view of variation, the length of the eaves is preferably 30 nm or longer, more preferably 40 nm or longer so that the characteristic values converge.

The reason is described using the transistor in FIGS. 23A and 23B. It seems that dependence of capacitance formed between the eaves portion (a portion of a side surface of the gate electrode extended beyond a bottom surface of the oxide semiconductor film S2, i.e., a portion surrounded by a dashed line in FIG. 23A) and a bottom portion of the oxide semiconductor film S2 on the length of the eaves is involved.

The capacitance formed between the eaves portion and the bottom portion of the oxide semiconductor film S2 is approximately represented by the following formula where h is the length of the eaves, W is the channel width, $t_{GI}$ is the thickness of the gate insulating film, and θ is the angle between the bottom edge of the eaves portion and the middle of the bottom portion of the oxide semiconductor film S2 as shown in FIG. 23A.

$$\frac{\theta}{\pi/2} C_0 \quad \text{[Formula 1]}$$

Here, $C_0$ is the capacitance formed between the infinitely long eaves portion and the bottom portion of the oxide semiconductor film S2. At this time, θ is expressed by the following formula.

$$\theta = \arctan\left\{\frac{h}{(t_{GI} + W/2)}\right\} \quad \text{[Formula 2]}$$

Figure 27:
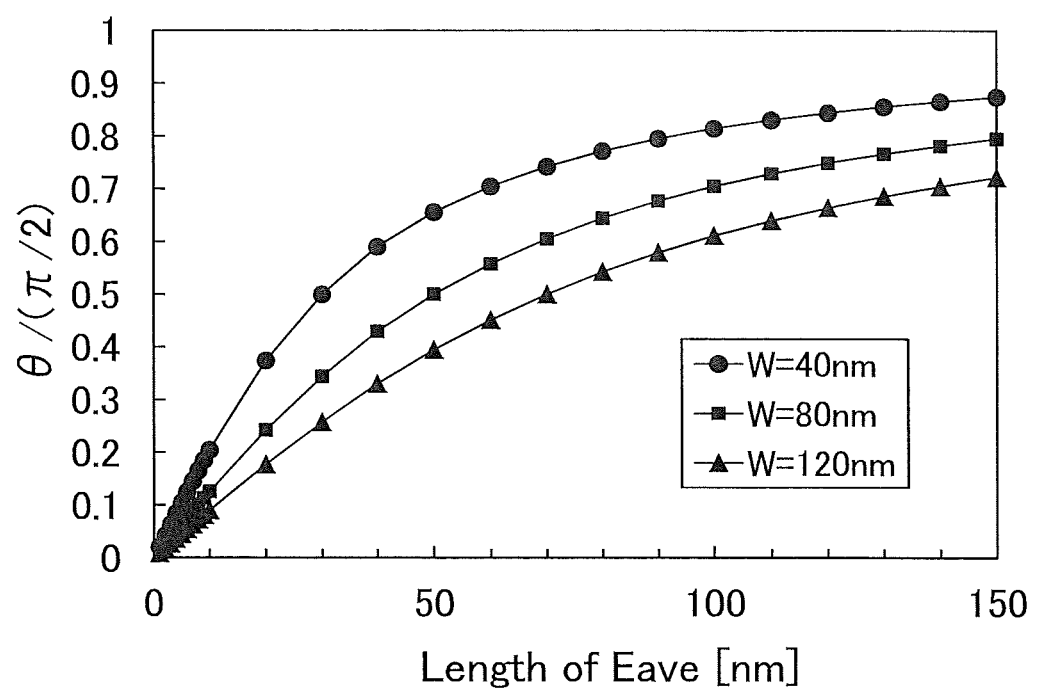
FIG. 27 shows electrical characteristics of transistors.

FIG. 27 shows a relationship between coefficient of $C_0$ in Formula I and the length h of the eaves.

According to FIG. 27, with a channel width W of 40 nm, the coefficient (θ/(π/2)) is markedly increased when the eaves length is approximately 50 nm or shorter and the coefficient is not increased much when the eaves is longer than 50 nm. This does not completely agree with the calculation result showing that the characteristics are hardly changed when the length of the eaves is 40 nm or longer, but can be said to have similar tendency. Further, it is found that in order to suppress variation, the length of the eaves needs to be longer as the channel width W is larger.

This application is based on Japanese Patent Application serial no. 2013-147332 filed with Japan Patent Office on Jul. 16, 2013, the entire contents of which are hereby incorporated by reference.

What is claimed is:

1. A semiconductor device comprising:
   a first oxide semiconductor film over an insulating surface;
   a second oxide semiconductor film over the first oxide semiconductor film;
   a third oxide semiconductor film in contact with a top surface of the insulating surface, a side surface of the first oxide semiconductor film, a side surface of the second oxide semiconductor film, and a top surface of the second oxide semiconductor film;
   a gate insulating film over the third oxide semiconductor film; and
   a gate electrode which is in contact with the gate insulating film and faces the top surface and the side surface of the second oxide semiconductor film,
   wherein a thickness of the first oxide semiconductor film is larger than a sum of a thickness of the third oxide semiconductor film and a thickness of the gate insulating film, and
   wherein a difference between the thickness of the first oxide semiconductor film and the sum of the thickness of the third oxide semiconductor film and the thickness of the gate insulating film is larger than or equal to 20 nm.

2. The semiconductor device according to claim 1, wherein the difference between the thickness of the first oxide semiconductor film and the sum of the thickness of the third oxide semiconductor film and the thickness of the gate insulating film is larger than or equal to 20 nm and smaller than or equal to 50 nm.

3. The semiconductor device according to claim 1, wherein a channel width is smaller than or equal to 40 nm.

4. The semiconductor device according to claim 1, wherein the semiconductor device further comprises a source electrode and a drain electrode each in contact with the top surface of the second oxide semiconductor film and a bottom surface of the third oxide semiconductor film.

5. The semiconductor device according to claim 1, wherein the semiconductor device further comprises a conductive film below the insulating surface.

6. The semiconductor device according to claim 5, wherein the conductive film is electrically connected to the gate electrode.

7. The semiconductor device according to claim 1, wherein the gate insulating film is an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

8. A semiconductor device comprising:
   a first oxide semiconductor film provided over a projected portion of an insulating surface comprising a depressed portion and the projected portion;
   a second oxide semiconductor film over the first oxide semiconductor film;
   a third oxide semiconductor film in contact with a top surface of the insulating surface, a side surface of the first oxide semiconductor film, a side surface of the second oxide semiconductor film, and a top surface of the second oxide semiconductor film;
   a gate insulating film over the third oxide semiconductor film; and
   a gate electrode which is in contact with the gate insulating film and faces the top surface and the side surface of the second oxide semiconductor film,
   wherein a sum of a height of the projected portion of the insulating surface and a thickness of the first oxide semiconductor film is larger than a sum of a thickness of the third oxide semiconductor film and a thickness of the gate insulating film, and
   wherein a difference between the sum of the height of the projected portion of the insulating surface and the thickness of the first oxide semiconductor film and the sum of the thickness of the third oxide semiconductor film and the thickness of the gate insulating film is larger than or equal to 20 nm.

9. The semiconductor device according to claim 8, wherein the difference between the thickness of the first oxide semiconductor film and the sum of the thickness of the third oxide semiconductor film and the thickness of the gate insulating film is larger than or equal to 20 nm and smaller than or equal to 50 nm.

10. The semiconductor device according to claim 8, wherein a channel width is smaller than or equal to 40 nm.

11. The semiconductor device according to claim 8, wherein the semiconductor device further comprises a source electrode and a drain electrode each in contact with the top surface of the second oxide semiconductor film and a bottom surface of the third oxide semiconductor film.

12. The semiconductor device according to claim 8, wherein the semiconductor device further comprises a conductive film below the insulating surface.

13. The semiconductor device according to claim 12, wherein the conductive film is electrically connected to the gate electrode.

14. The semiconductor device according to claim 8, wherein the gate insulating film is an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

15. A semiconductor device comprising:
a first oxide semiconductor film over an insulating surface;
a second oxide semiconductor film over the first oxide semiconductor film;
a third oxide semiconductor film in contact with a top surface of the insulating surface, a side surface of the first oxide semiconductor film, a side surface of the second oxide semiconductor film, and a top surface of the second oxide semiconductor film;
a gate insulating film over the third oxide semiconductor film; and
a gate electrode which is in contact with the gate insulating film,
wherein a thickness of the first oxide semiconductor film is larger than a sum of a thickness of the third oxide semiconductor film and a thickness of the gate insulating film, and
wherein a difference between the thickness of the first oxide semiconductor film and the sum of the thickness of the third oxide semiconductor film and the thickness of the gate insulating film is larger than or equal to 20 nm.

16. The semiconductor device according to claim 15, wherein the difference between the thickness of the first oxide semiconductor film and the sum of the thickness of the third oxide semiconductor film and the thickness of the gate insulating film is larger than or equal to 20 nm and smaller than or equal to 50 nm.

17. The semiconductor device according to claim 15, wherein a channel width is smaller than or equal to 40 nm.

18. The semiconductor device according to claim 15, wherein the semiconductor device further comprises a source electrode and a drain electrode each in contact with the top surface of the second oxide semiconductor film and a bottom surface of the third oxide semiconductor film.

19. The semiconductor device according to claim 15, wherein the semiconductor device further comprises a conductive film below the insulating surface.

20. The semiconductor device according to claim 19, wherein the conductive film is electrically connected to the gate electrode.

21. The semiconductor device according to claim 15, wherein the gate insulating film is an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

* * * * *